US009264634B2

(12) United States Patent
Oike et al.

(10) Patent No.: US 9,264,634 B2
(45) Date of Patent: Feb. 16, 2016

(54) SIGNAL PROCESSING DEVICE AND METHOD, IMAGING ELEMENT, AND IMAGING DEVICE

(71) Applicant: Sony Corporation, Tokyo (JP)

(72) Inventors: Yusuke Oike, Kanagawa (JP); Mamoru Sato, Kanagawa (JP); Masaki Sakakibara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/397,678

(22) PCT Filed: May 24, 2013

(86) PCT No.: PCT/JP2013/003312
§ 371 (c)(1),
(2) Date: Oct. 29, 2014

(87) PCT Pub. No.: WO2013/179630
PCT Pub. Date: Dec. 5, 2013

(65) Prior Publication Data
US 2015/0130971 A1    May 14, 2015

(30) Foreign Application Priority Data
May 31, 2012    (JP) .................... 2012-124213

(51) Int. Cl.
H04N 5/217    (2011.01)
H04N 5/357    (2011.01)
H03M 1/18    (2006.01)
H04N 5/378    (2011.01)
H03M 1/12    (2006.01)
H03M 1/56    (2006.01)

(52) U.S. Cl.
CPC ............ *H04N 5/357* (2013.01); *H03M 1/186* (2013.01); *H04N 5/378* (2013.01); *H03M 1/123* (2013.01); *H03M 1/56* (2013.01)

(58) Field of Classification Search
CPC ............ H04N 5/3355; H04N 5/357; H04N 5/3745–5/37455; H04N 5/378; H03M 1/00–1/645

USPC ............... 348/222.1, 241, 243, 302; 341/126–131, 155–172
See application file for complete search history.

(56) References Cited

U.S. PATENT DOCUMENTS

2010/0259660 A1    10/2010 Kukita
2011/0037868 A1*   2/2011 Ota ...................... H04N 5/357
                                                            348/222.1

FOREIGN PATENT DOCUMENTS

EP    2071831 A1    6/2009
JP    2011-041091    2/2011

OTHER PUBLICATIONS

International Search Report and the Written Opinion of the International Searching Authority; International Application No. PCT/JP2013/003312; Filed: May 24, 2013. Mailing Date: Oct. 7, 2013 (Forms PCT/ISA210, PCT/ISA220 and PCT/ISA/237).
Martijn Knoeij et al., "Multiple-Ramp Column-Parallel ADC Architectures for CMOS Image Sensors," IEEE Journal of Solid-State Circuits, vol. 42, No. 12, Dec. 1, 2007, pp. 2968-2977.
L. Lindgren, "A new Simultaneous Multislope ADC Architecture for Array Implementations," IEEE Transactions on Circuits and Systems II: Express Briefs, vol. 53, No. 9, Sep. 1, 2006, pp. 921-925.

* cited by examiner

*Primary Examiner* — Nhan T Tran
*Assistant Examiner* — Chriss Yoder, III
(74) *Attorney, Agent, or Firm* — Michael Best & Friedrich LLP

(57) ABSTRACT

A signal processing device and signal processing method are described herein. By way of example, the signal processing method includes a selection unit configured to select, based on a first comparison of an analog signal with a determination voltage, a selected reference voltage to be compared with the analog signal, the selected reference voltage being selected from a plurality of reference voltages. The plurality of reference voltages include at least a first reference voltage and a second reference voltage.

34 Claims, 46 Drawing Sheets

FIG. 6B

| ADP | SWSQ | SWR1 | SWR2 |
|---|---|---|---|
| 0 | 0 | 0 | 1 |
| 0 | 1 | 1 | 0 |
| 1 | 0 | SWFB (Vco) | $\overline{\text{SWFB}}$ (Vco) |
| 1 | 1 | SWFB (Vco) | $\overline{\text{SWFB}}$ (Vco) |

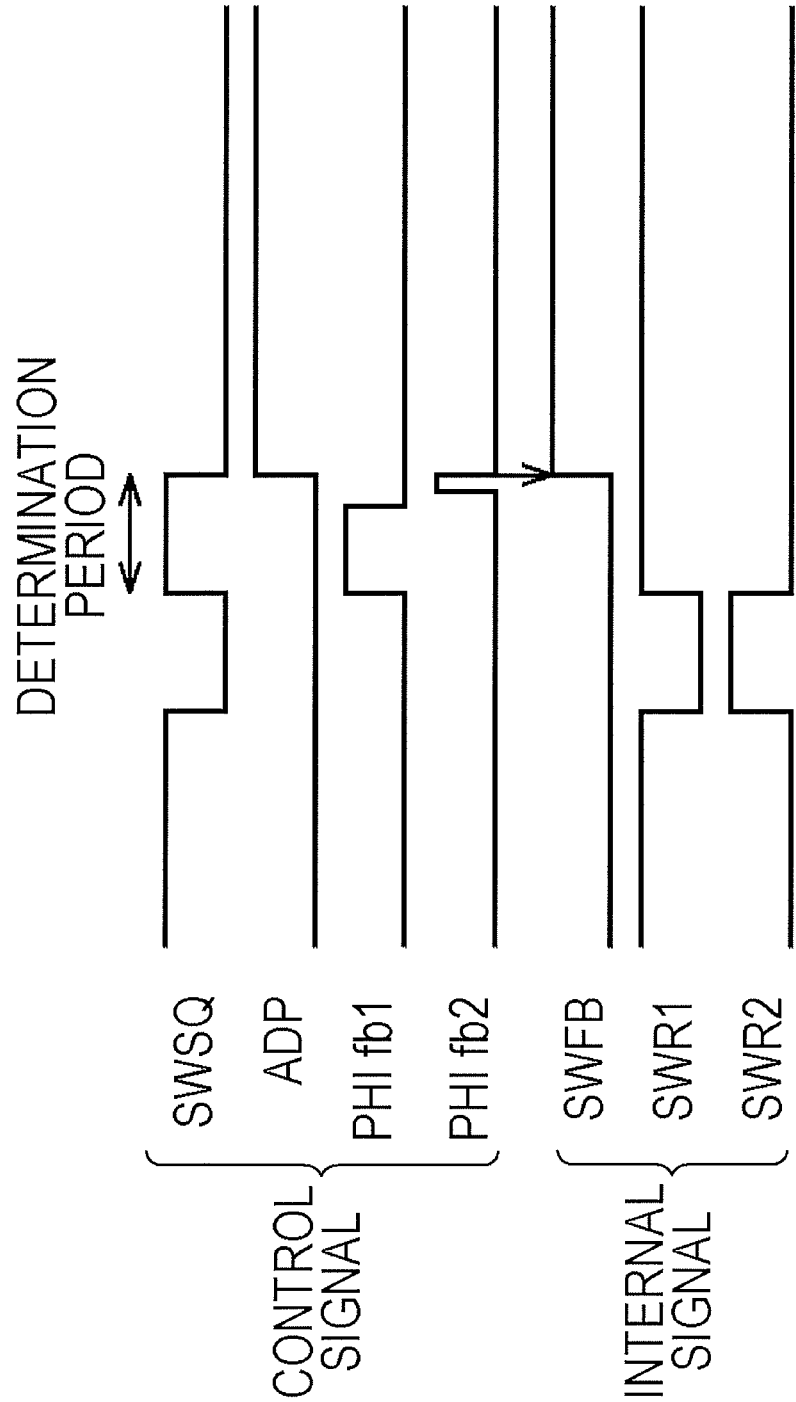

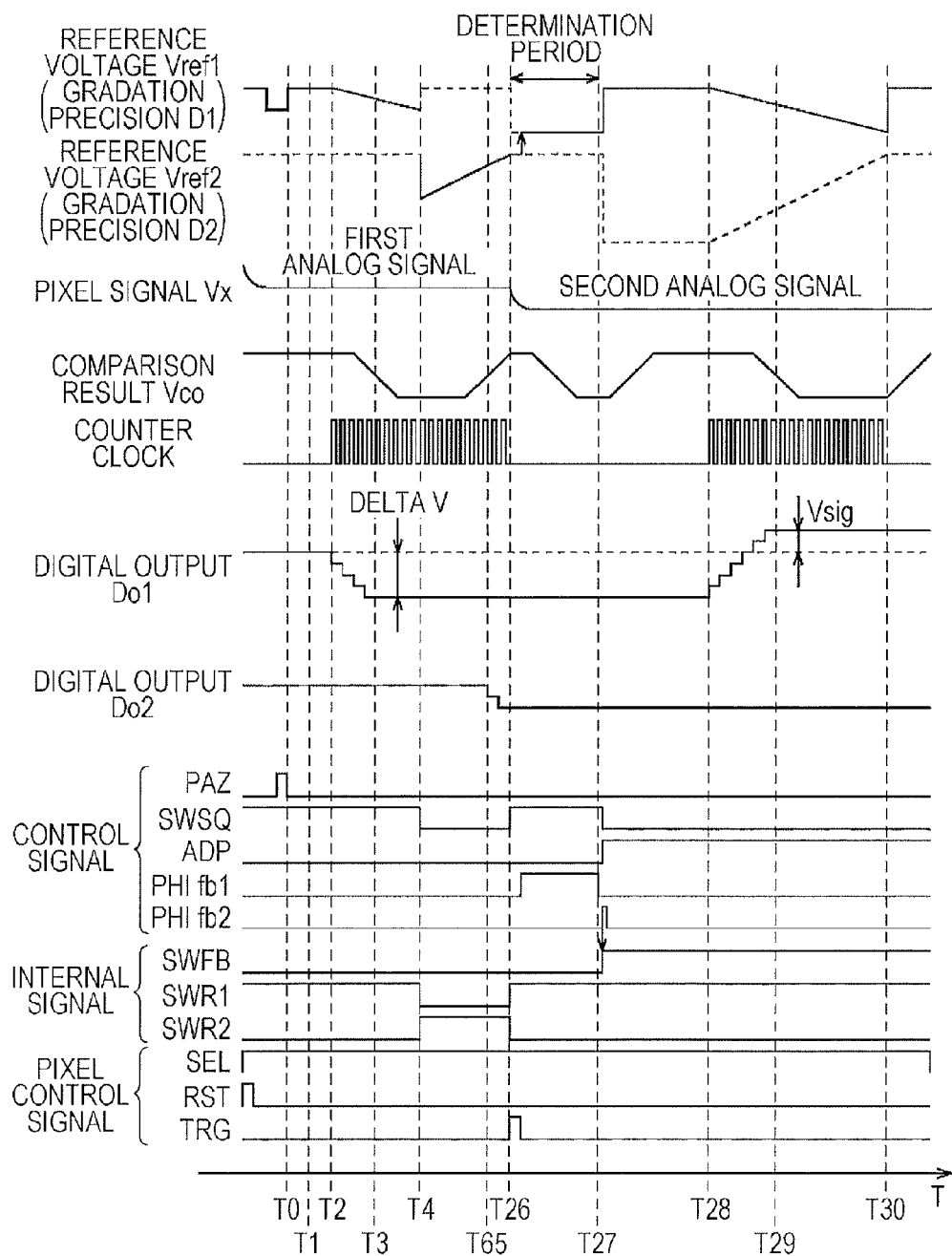

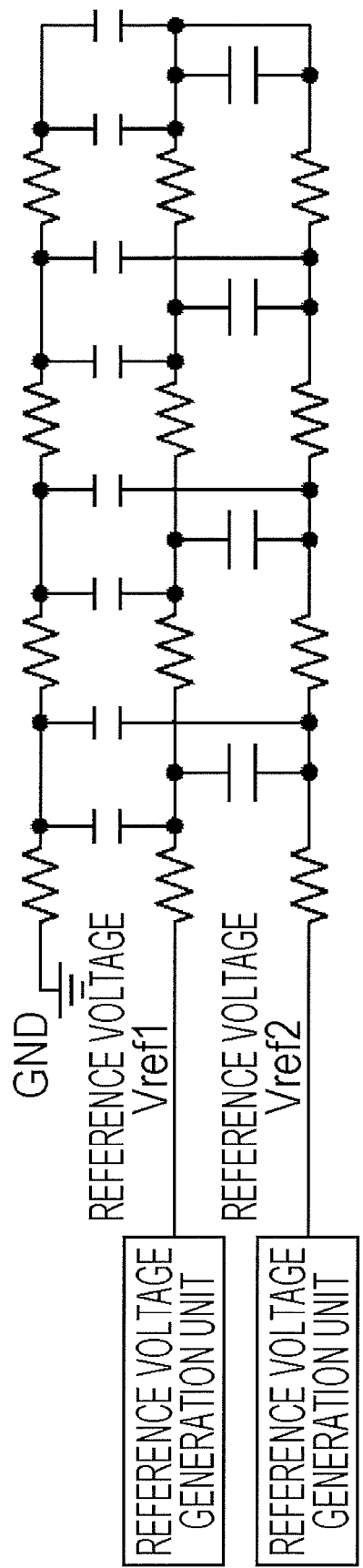

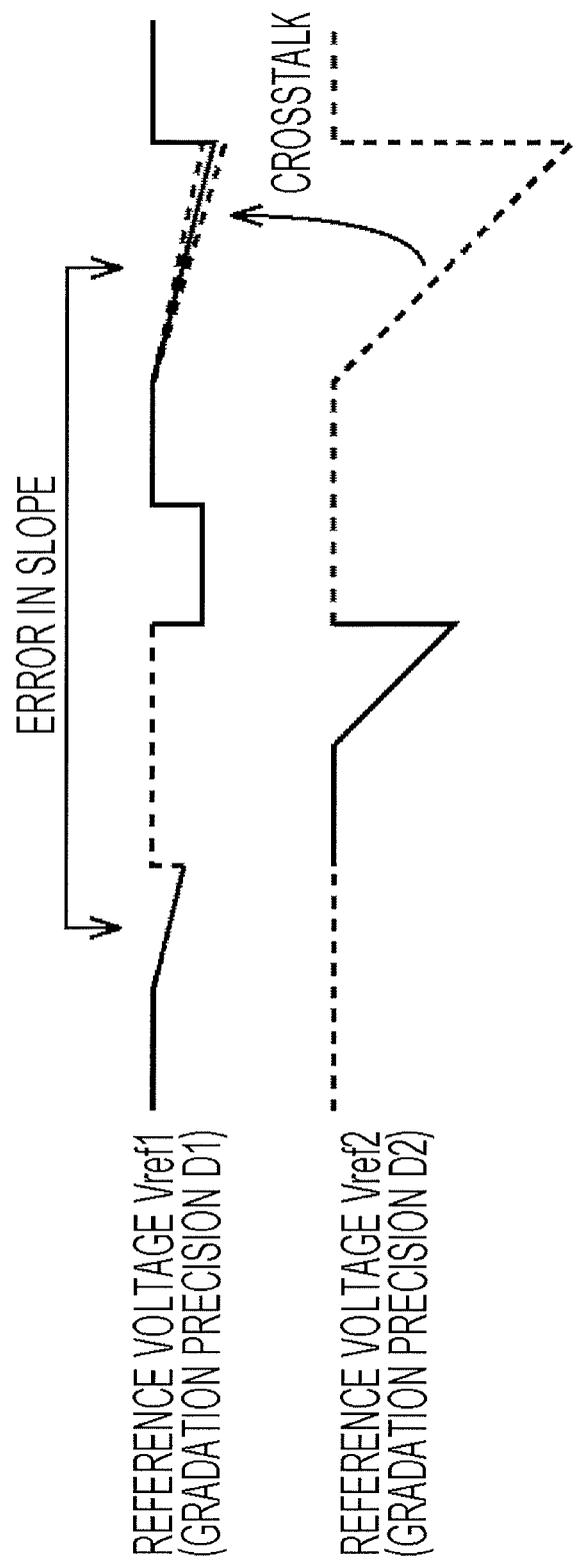

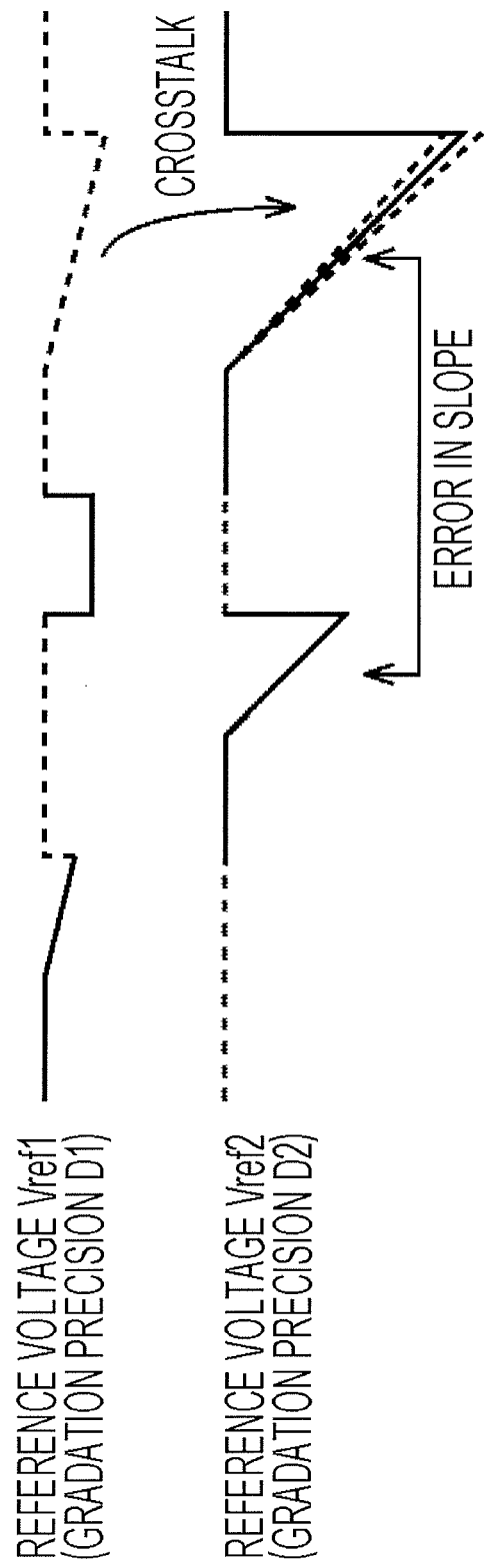

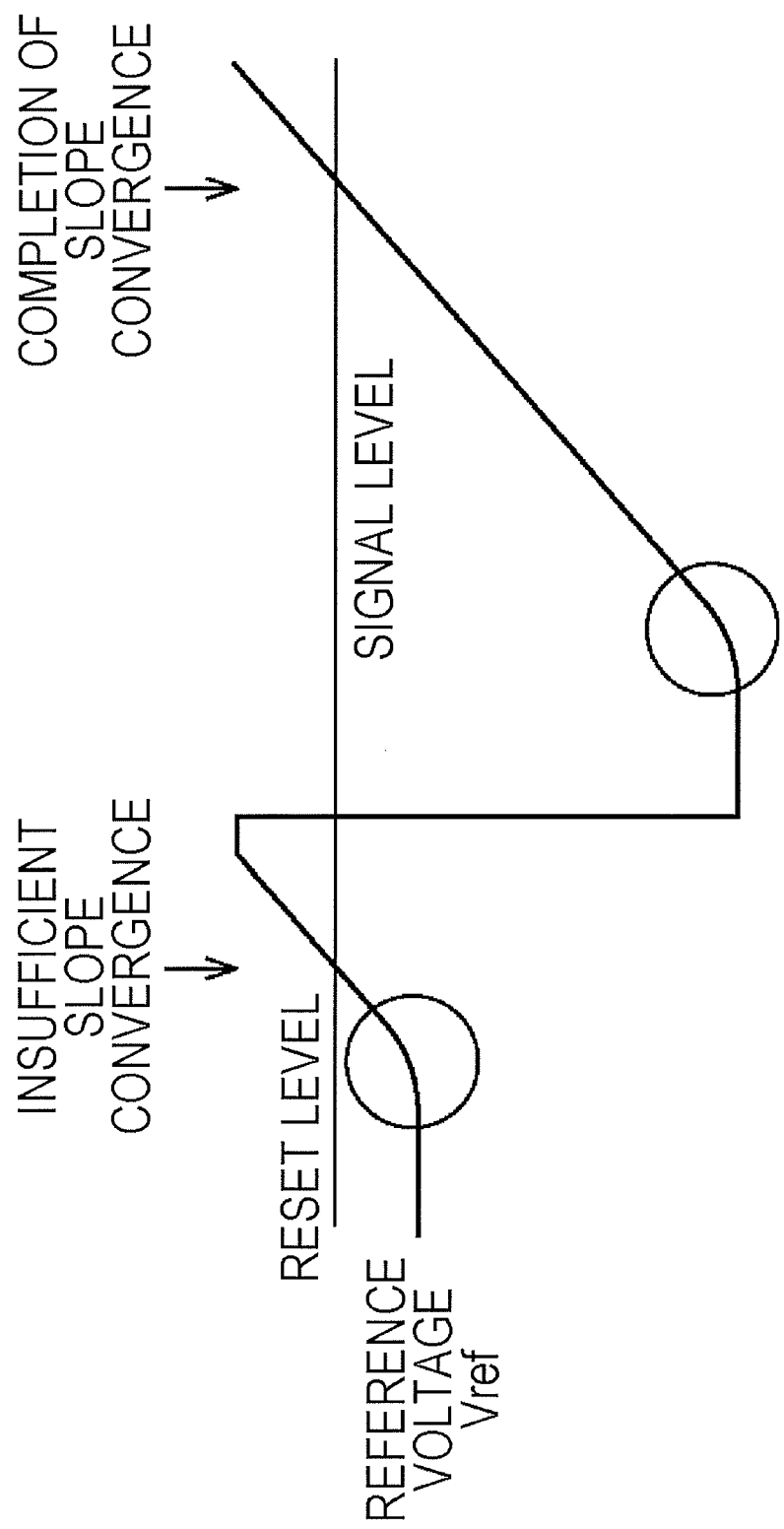

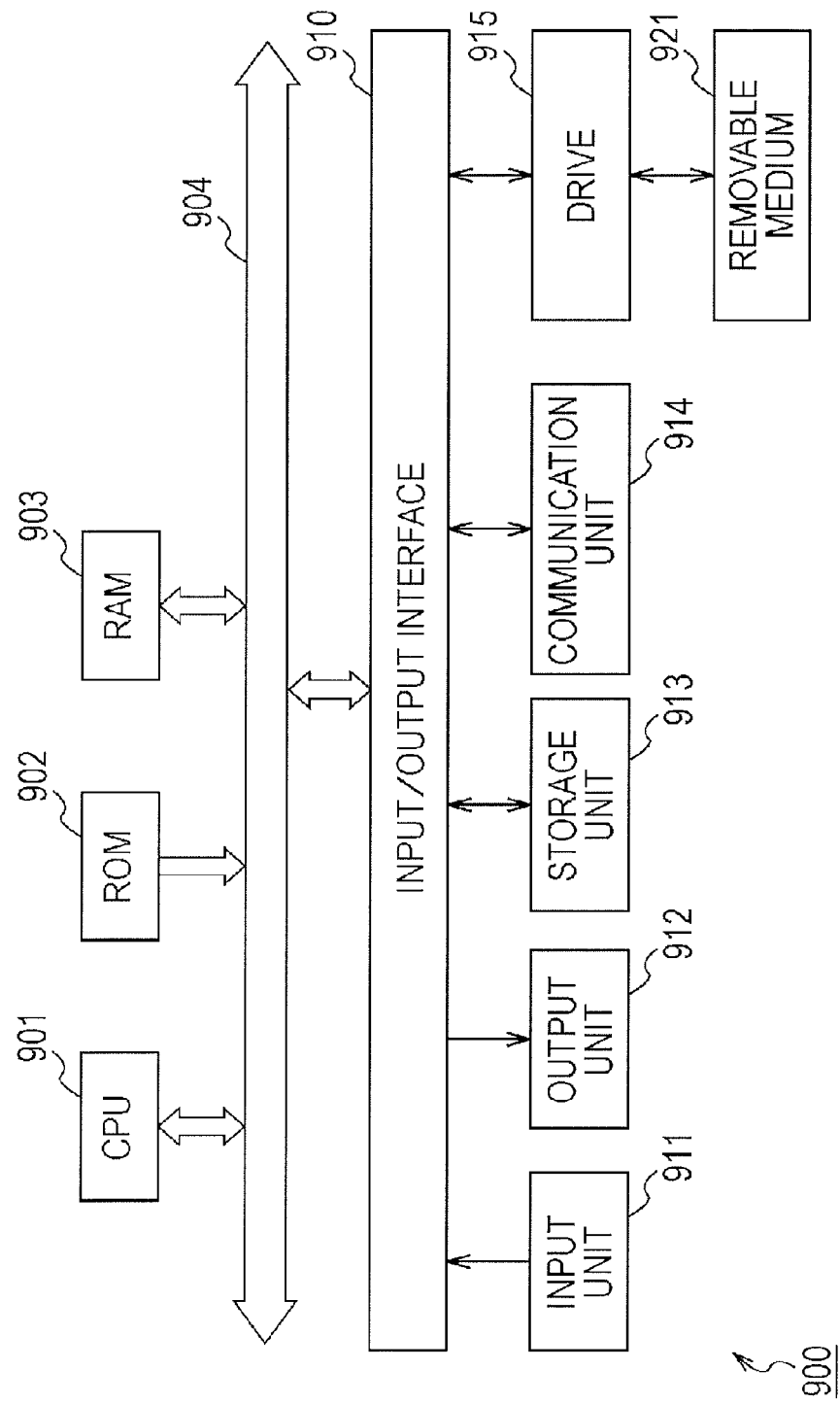

SIGNAL PROCESSING DEVICE AND METHOD, IMAGING ELEMENT, AND IMAGING DEVICE

TECHNICAL FIELD

The present technology relates to signal processing devices and methods, imaging elements, and imaging apparatuses. More specifically, the present technology relates to a signal processing device and method, an imaging element, and an imaging apparatus which may suppress, or at least reduce, the occurrence of errors in analog-to-digital (A/D) conversion.

BACKGROUND ART

In general image sensors of the related art, electric charge accumulated in light receiving portions (or photodiodes) is read as signal voltages, and is subjected to A/D conversion (see, for example, Japanese Unexamined Patent Application Publication No. 2011-41091 (hereinafter "PTL 1")).

In an A/D conversion method described in PTL 1, in order to increase gradation precision and reduce conversion time, two A/D conversion circuits are connected to the same pixel output signal, and two reference voltages Vref1 and Vref2 having different slopes are individually input to the A/D conversion circuits from a reference voltage generation unit to execute A/D conversion at two different levels of gradation precision. In this method, however, the circuit area and power consumption may double. Thus, in another method described in PTL 1, one A/D conversion circuit is used and a determination unit is further provided. The determination unit determines the magnitude of the pixel output signal, and selects one of the two reference voltages having different slopes, namely, reference voltages Vref1 and Vref2, in accordance with the determined magnitude of the pixel output signal to apply different levels of conversion precision in accordance with the magnitude of the pixel output signal.

SUMMARY OF INVENTION

Technical Problem

In A/D conversion methods of the related art, such as the methods described in PTL 1, however, it is difficult to sufficiently suppress the occurrence of errors in A/D conversion. For example, it may be difficult to increase gradation precision and reduce conversion time or to suppress degradation in image quality.

It is therefore desirable to suppress, or at least reduce, the occurrence of errors in A/D conversion.

Solution to Problem

A signal processing device and signal processing method are described herein. By way of example, the signal processing device includes a selection unit configured to select, based on a first comparison of an analog signal with a determination voltage, a selected reference voltage to be compared with the analog signal, the selected reference voltage being selected from a plurality of reference voltages. The plurality of reference voltages include at least a first reference voltage and a second reference voltage.

Further, by way of example, the signal processing method includes the steps of selecting, based on a first comparison of an analog signal with a determination voltage, a selected reference voltage to be compared with the analog signal, the selected reference voltage being selected from a plurality of reference voltages. The plurality of reference voltages include at least a first reference voltage and a second reference voltage.

BRIEF DESCRIPTION OF DRAWINGS

FIG. 6B is a table used in the selection unit.

FIG. 15B is a timing chart illustrating the selection unit.

FIG. 16 is a timing chart illustrating an example of A/D conversion.

FIG. 33A is a diagram depicting an example of coupling and crosstalk.

FIG. 33B is a diagram depicting an example of crosstalk when the incident light intensity is low.

FIG. 33C is a diagram depicting an example of crosstalk when the incident light intensity is high.

FIG. 34B is a diagram depicting an example of insufficient slope convergence in a reference voltage.

FIG. 42 is a block diagram illustrating an example of a main configuration of a computer.

DESCRIPTION OF EMBODIMENTS

Figure 1:
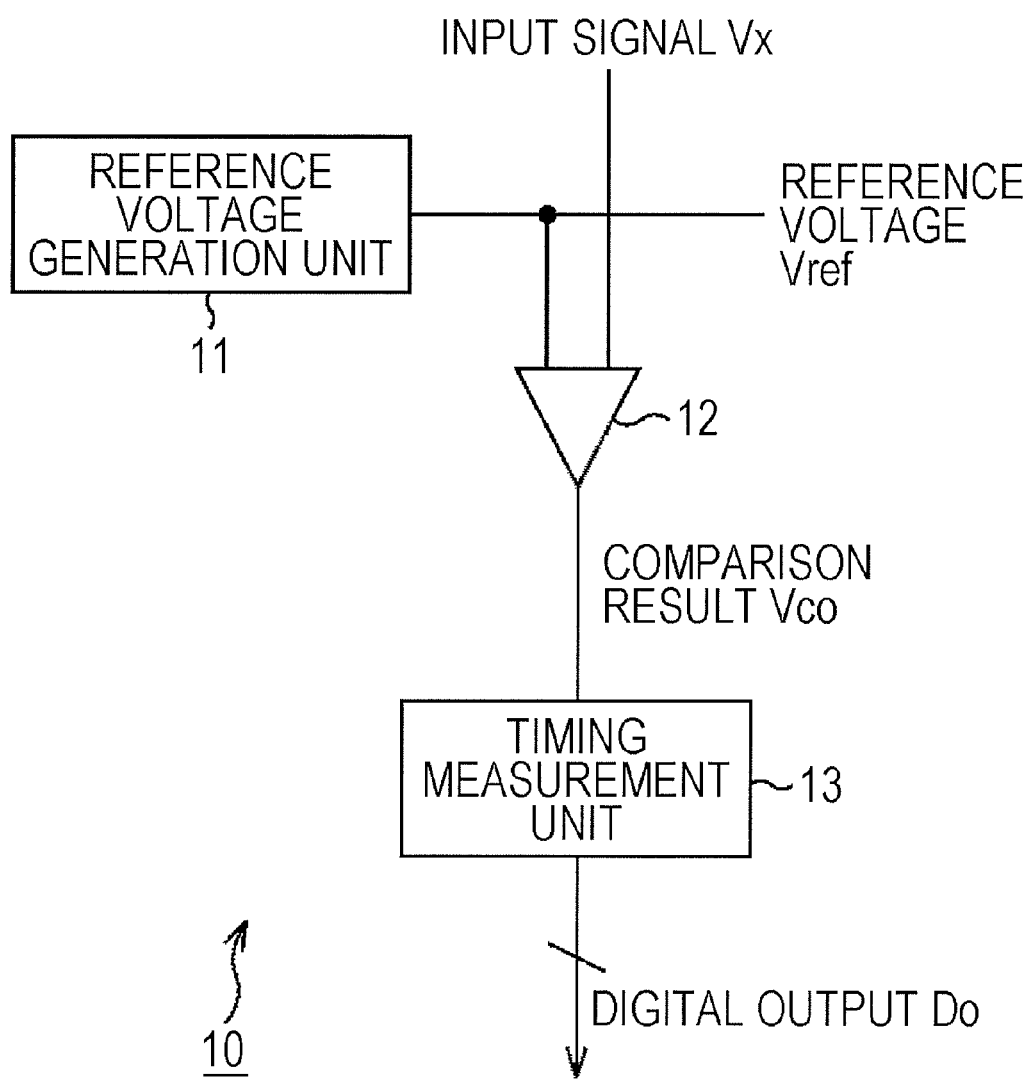
FIG. 1 is a diagram illustrating an example of a main configuration of a column A/D conversion unit.

An embodiment of the present technology provides a signal processing device including a comparison unit configured to compare an analog signal output from a unit pixel with a certain voltage; a selection unit configured to select one of a plurality of reference voltages having different levels of gradation precision in accordance with a comparison result of comparison by the comparison unit between the analog signal and at least one or more predetermined determination values; a switching unit configured to switch a reference voltage to be supplied to the comparison unit in accordance with a selection result obtained by the selection unit; and a measurement unit configured to measure a timing of change of a comparison result of comparison by the comparison unit between the analog signal and a reference voltage supplied to the comparison unit under switching control of the switching unit.

The predetermined determination value may be supplied from a reference voltage generation unit configured to supply a reference voltage having a high level of gradation precision among the plurality of reference voltages.

The selection unit may select a reference voltage having a high level of gradation precision among the plurality of reference voltages when it is determined, as a result of comparison performed by the comparison unit, that the analog signal is smaller than the predetermined determination value, and select a reference voltage having a low level of gradation precision among the plurality of reference voltages when it is determined that the analog signal is larger than the predetermined determination value. The switching unit may cause the reference voltage selected by the selection unit to be supplied to the comparison unit.

The comparison unit may compare each of a first analog signal and a second analog signal with the reference voltage supplied to the comparison unit, the first analog signal being a noise signal of the unit pixel, the second analog signal being a signal including data of the unit pixel. The measurement unit may determine a difference between a measured timing of change of a comparison result of comparison by the comparison unit between the first analog signal and the reference voltage and a measured timing of change of a comparison result of comparison by the comparison unit between the second analog signal and the reference voltage.

The selection unit may sequentially select reference voltages for the first analog signal, the switching unit may cause the reference voltages selected by the selection unit to be supplied to the comparison unit, and the comparison unit may sequentially compare the first analog signal with each of the reference voltages in accordance with control of the switching unit. The selection unit may select one of the plurality of reference voltages for the second analog signal in accordance with a comparison result of comparison by the comparison unit between the second analog signal and the at least one or more predetermined determination values, the switching unit may cause the reference voltage selected by the selection unit to be supplied to the comparison unit, and the comparison unit may compare the second analog signal with the reference voltage selected by the selection unit in accordance with control of the switching unit. The measurement unit may determine a difference between a measured timing of change of a comparison result of comparison between the second analog signal and the reference voltage selected by the selection unit and a measured dining of change of a comparison result of comparison between the first analog signal and the reference voltage selected by the selection unit.

The signal processing device may further include a reference voltage supply unit configured to supply the plurality of reference voltages.

The reference voltage supply unit may supply the plurality of reference voltages so that a voltage in a predetermined range is compared with the first analog signal and the second analog signal in a first comparison direction or a second comparison direction, the first comparison direction being a direction in which the voltage increases from low to high, the second comparison direction being a direction in which the voltage decreases from high to low.

The reference voltage supply unit may supply the plurality of reference voltages so that the plurality of reference voltages are compared with the first analog signal in order of gradation precision in such a manner that each of the plurality of reference voltages is compared with the first analog signal in a comparison direction opposite to the comparison direction of a preceding reference voltage.

The reference voltage supply unit may supply the reference voltage selected by the selection unit so that the reference voltage is compared with the second analog signal in the same comparison direction as a comparison direction in which the reference voltage is compared with the first analog signal.

The reference voltage supply unit may supply a reference voltage having the highest level of gradation precision among the plurality of reference voltages so that a voltage in the range is compared with the first analog signal and the second analog signal in the second comparison direction, and supply a reference voltage having the lowest level of gradation precision among the plurality of reference voltages so that a voltage in the range is compared with the first analog signal and the second analog signal in the first comparison direction.

The signal processing device may further include a plurality of sets each including the comparison unit, the selection unit, the switching unit, and the measurement unit. In each of the plurality of sets, the selection unit may include a first holding unit and a second holding unit, the first holding unit and the second holding unit being configured to hold the comparison result. In each of the plurality of sets, the first holding unit may hold the comparison result until comparison results obtained by the comparison unit for all the sets are held in the first holding unit. In each of the plurality of sets, the second holding unit may hold the comparison result after the first holding unit holds the comparison results for all the sets, and select one of the plurality of reference voltages in accordance with the held comparison result.

An embodiment of the present technology also provides a signal processing method for a signal processing device. The signal processing method is performed by the signal processing device, including comparing an analog signal output from a unit pixel with a certain voltage; selecting one of a plurality of reference voltages having different levels of gradation precision in accordance with a comparison result of comparison between the analog signal and at least one or more predetermined determination values; switching a reference voltage to be compared with the analog signal in accordance with a selection result; and measuring a timing of change of a comparison result of comparison between the analog signal and the reference voltage.

An embodiment of the present technology also provides an imaging element including a pixel array having unit pixels arranged thereon, each unit pixel including a photoelectric conversion element configured to perform photoelectric conversion on incident light; a comparison unit configured to compare an analog signal output from a unit pixel in the pixel array with a certain voltage; a selection unit configured to select one of a plurality of reference voltages having different levels of gradation precision in accordance with a comparison result of comparison by the comparison unit between the analog signal and at least one or more predetermined determination values; a switching unit configured to switch a reference voltage to be supplied to the comparison unit in accordance with a selection result obtained by the selection unit; and a measurement unit configured to measure a timing of change of a comparison result of comparison by the comparison unit between the analog signal and a reference voltage supplied to the comparison unit under switching control of the switching unit.

An embodiment of the present technology also provides an imaging apparatus including an imaging unit configured to capture an image of a subject; and an image processing unit configured to perform image processing on image data obtained by capturing the image by using the imaging unit. The imaging unit includes a pixel array having unit pixels arranged thereon, each unit pixel including a photoelectric conversion element configured to perform photoelectric conversion on incident light; a comparison unit configured to compare an analog signal output from a unit pixel in the pixel array with a certain voltage; a selection unit configured to select one of a plurality of reference voltages having different levels of gradation precision in accordance with a comparison result of comparison by the comparison unit between the analog signal and at least one or more predetermined determination values; a switching unit configured to switch a reference voltage to be supplied to the comparison unit in accordance with a selection result obtained by the selection unit; and a measurement unit configured to measure a timing of change of a comparison result of comparison by the comparison unit between the analog signal and a reference voltage supplied to the comparison unit under switching control of the switching unit.

Another embodiment of the present technology provides a signal processing device including a comparison unit configured to compare an analog signal output from a unit pixel with a certain voltage; a switching unit configured to switch a reference voltage to be supplied to the comparison unit, if necessary, and configured to connect one of a plurality of reference voltages having different levels of gradation precision to the comparison unit and connect the other reference voltages to a certain load capacitor; and a measurement unit configured to measure a timing of change of a comparison result of comparison by the comparison unit between the analog signal and a reference voltage supplied to the comparison unit under switching control of the switching unit.

Another embodiment of the present technology also provides an imaging element including a pixel array having unit pixels arranged thereon, each unit pixel including a photoelectric conversion element configured to perform photoelectric conversion on incident light; a comparison unit configured to compare an analog signal output from a unit pixel in the pixel array with a certain voltage; a switching unit configured to switch a reference voltage to be supplied to the comparison unit, and configured to connect one of a plurality of reference voltages having different levels of gradation precision to the comparison unit and connect the other reference voltages to a certain load capacitor; and a measurement unit configured to measure a timing of change of a comparison result of comparison by the comparison unit between the analog signal and a reference voltage supplied to the comparison unit under switching control of the switching unit.

Another embodiment of the present technology also provides an imaging apparatus including an imaging unit configured to capture an image of a subject; and an image processing unit configured to perform image processing on image data obtained by capturing the image by using the imaging unit. The imaging unit includes a pixel array having unit pixels arranged thereon, each unit pixel including a photoelectric conversion element configured to perform photoelectric conversion on incident light; a comparison unit configured to compare an analog signal output from a unit pixel in the pixel array with a certain voltage; a switching unit configured to switch a reference voltage to be supplied to the comparison unit; and configured to connect one of a plurality of reference voltages having different levels of gradation precision to the comparison unit and connect the other reference voltages to a certain load capacitor; and a measurement unit configured to measure a timing of change of a comparison result of comparison by the comparison unit between the analog signal and a reference voltage supplied to the comparison unit under switching control of the switching unit.

Still another embodiment of the present technology provides a signal processing device including a comparison unit configured to compare an analog signal output from a unit pixel with a certain voltage; a reference voltage supply unit configured to supply a plurality of reference voltages having different levels of gradation precision; a switching unit configured to switch a reference voltage to be supplied to the comparison unit, if necessary, and configured to connect one of the plurality of reference voltages supplied from the reference voltage supply unit to the comparison unit; and a measurement unit configured to measure a timing of change of a comparison result of comparison by the comparison unit between the analog signal and a reference voltage supplied to the comparison unit under switching control of the switching unit. The reference voltage supply unit repeatedly supplies all the plurality of reference voltages for a first analog signal a number of times equal to the number of reference voltages, the first analog signal being a noise signal of the unit pixel. The switching unit sequentially supplies the reference voltages supplied from the reference voltage supply unit to the comparison unit one by one. The comparison unit sequentially compares the first analog signal with each of the reference voltages in accordance with control of the switching unit. The reference voltage supply unit supplies all the plurality of reference voltages for a second analog signal, the second analog signal being a signal including data of the unit pixel. The switching unit supplies one of the plurality of reference voltages supplied from the reference voltage supply unit to the comparison unit. The comparison unit compares the reference voltage supplied in accordance with control of the switching unit with the second analog signal. The measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

Still another embodiment of the present technology also provides an imaging element including a pixel array having unit pixels arranged thereon, each unit pixel including a photoelectric conversion element configured to perform photoelectric conversion on incident light; a comparison unit configured to compare an analog signal output from a unit pixel in the pixel array with a certain voltage; a reference voltage supply unit configured to supply a plurality of reference voltages having different levels of gradation precision; a switching unit configured to switch a reference voltage to be supplied to the comparison unit, if necessary, and configured to connect one of the plurality of reference voltages supplied from the reference voltage supply unit to the comparison unit; and a measurement unit configured to measure a timing of change of a comparison result of comparison by the comparison unit between the analog signal and a reference voltage supplied to the comparison unit under switching control of the switching unit. The reference voltage supply unit repeatedly supplies all the plurality of reference voltages for a first analog signal a number of times equal to the number of reference voltages, the first analog signal being a noise signal of the unit pixel. The switching unit sequentially supplies the reference voltages supplied from the reference voltage supply unit to the comparison unit one by one. The comparison unit sequentially compares the first analog signal with each of the reference voltages in accordance with control of the switching unit. The reference voltage supply unit supplies all the plurality of reference voltages for a second analog signal, the second analog signal being a signal including data of the unit pixel. The switching unit supplies one of the plurality of reference voltages supplied from the reference voltage supply unit to the comparison unit. The comparison unit compares the reference voltage supplied in accordance with control of the switching unit with the second analog signal. The measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

Still another embodiment of the present technology also provides an imaging apparatus including an imaging unit configured to capture an image of a subject; and an image processing unit configured to perform image processing on image data obtained by capturing the image by using the imaging unit The imaging unit includes a pixel array having unit pixels arranged thereon, each unit pixel including a photoelectric conversion element configured to perform photoelectric conversion on incident light; a comparison unit configured to compare an analog signal output from a unit pixel in the pixel array with a certain voltage; a reference voltage supply unit configured to supply a plurality of reference voltages having different levels of gradation precision; a switching unit configured to switch a reference voltage to be supplied to the comparison unit, if necessary, and configured to connect one of the plurality of reference voltages supplied from the reference voltage supply unit to the comparison unit; and a measurement unit configured to measure a timing of change of a comparison result of comparison by the comparison unit between the analog signal and a reference voltage supplied to the comparison unit under switching control of the switching unit. The reference voltage supply unit repeatedly supplies all the plurality of reference voltages for a first analog signal a number of times equal to the number of reference voltages, the first analog signal being a noise signal of the unit pixel. The switching unit sequentially supplies the reference voltages supplied from the reference voltage supply unit to the comparison unit one by one. The comparison unit sequentially compares the first analog signal with each of the reference voltages in accordance with control of the switching unit. The reference voltage supply unit supplies all the plurality of reference voltages for a second analog signal, the second analog signal being a signal including data of the unit pixel. The switching unit supplies one of the plurality of reference voltages supplied from the reference voltage supply unit to the comparison unit. The comparison unit compares the reference voltage supplied in accordance with control of the switching unit with the second analog signal. The measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

In an embodiment of the present technology, an analog signal output from a unit pixel is compared with a certain voltage, one of a plurality of reference voltages having different levels of gradation precision is selected in accordance with a comparison result of comparison between the analog signal and at least one or more predetermined determination values, a reference voltage to be compared with the analog signal is switched in accordance with a selection result, and a timing of change of a comparison result of comparison between the analog signal and the reference voltage is measured.

In another embodiment of the present technology, an analog signal output from a unit pixel is compared with a certain voltage, a reference voltage to be supplied is switched, one of a plurality of reference voltages having different levels of gradation precision is compared with the analog signal, the other reference voltages are connected to a certain load capacitor, and a timing of change of a comparison result of comparison between the analog signal and the reference voltage is measured.

In still another embodiment of the present technology, all a plurality of reference voltages for a first analog signal that is a noise signal of a pixel are repeatedly supplied a number of times equal to the number of reference voltages, the reference voltages to be supplied are sequentially supplied one by one, the first analog signal and each of the reference voltages are sequentially compared, all the plurality of reference voltages for a second analog signal that is a signal including data of the unit pixel are supplied, one of the plurality of reference voltages to be supplied is to be compared, the supplied reference voltage is compared with the second analog signal, and a difference between a measured timing of change of a comparison result of comparison by the comparison unit between the second analog signal and the reference voltage and a measured timing of change of a comparison result of comparison by the comparison unit between the first analog signal and the reference voltage is determined.

According to an embodiment of the present technology, information processing may be implemented. In particular, the occurrence of errors in analog-to-digital (A/D) conversion may be suppressed or at least reduced.

Exemplary embodiments of the present disclosure (hereinafter referred to as "embodiments") will now be described. The description will be given in the following order:

1. First embodiment (CMOS image sensor)
2. Second embodiment (CMOS image sensor)
3. Third embodiment (CMOS image sensor)
4. Fourth embodiment (imaging apparatus)
5. Fifth embodiment (computer)

<First Embodiment>
<A/D Conversion>

In general image sensors, electric charge accumulated in light receiving portions (for example, photodiodes) of unit pixels is read as signal voltages (or pixel signals), and is subjected to analog-to-digital (A/D) conversion.

Examples of the method for A/D conversion include a method of comparing a reference voltage with signal voltages while changing the reference voltage and obtaining a timing at which the reference voltage and a signal voltage match to perform digital conversion (see, for example, Japanese Unexamined Patent Application Publication No. 2005-278135).

Referring to FIG. 1, a column A/D conversion unit 10 is a processing unit that performs A/D conversion based on the method described above, and performs A/D conversion on a pixel signal read from a unit pixel. The column A/D conversion unit 10 illustrated in FIG. 1 includes a reference voltage generation unit 11, a comparison unit 12, and a timing measurement unit 13. The reference voltage generation unit 11 generates a reference voltage Vref whose value varies within a predetermined voltage range, and supplies the reference voltage Vref to the comparison unit 12. The comparison unit 12 compares a voltage of an input signal Vx that is an analog pixel signal read from a pixel with the reference voltage Vref generated by the reference voltage generation unit 11, and supplies a comparison result Vco to the timing measurement unit 13. The timing measurement unit 13 measures (or counts) a period from when the comparison begins to when the value of the comparison result Vco changes, converts the length of the period (count value) into a digital value (A/D converted value) of the input signal Vx, and outputs the digital value as a digital output Do.

Figure 2:
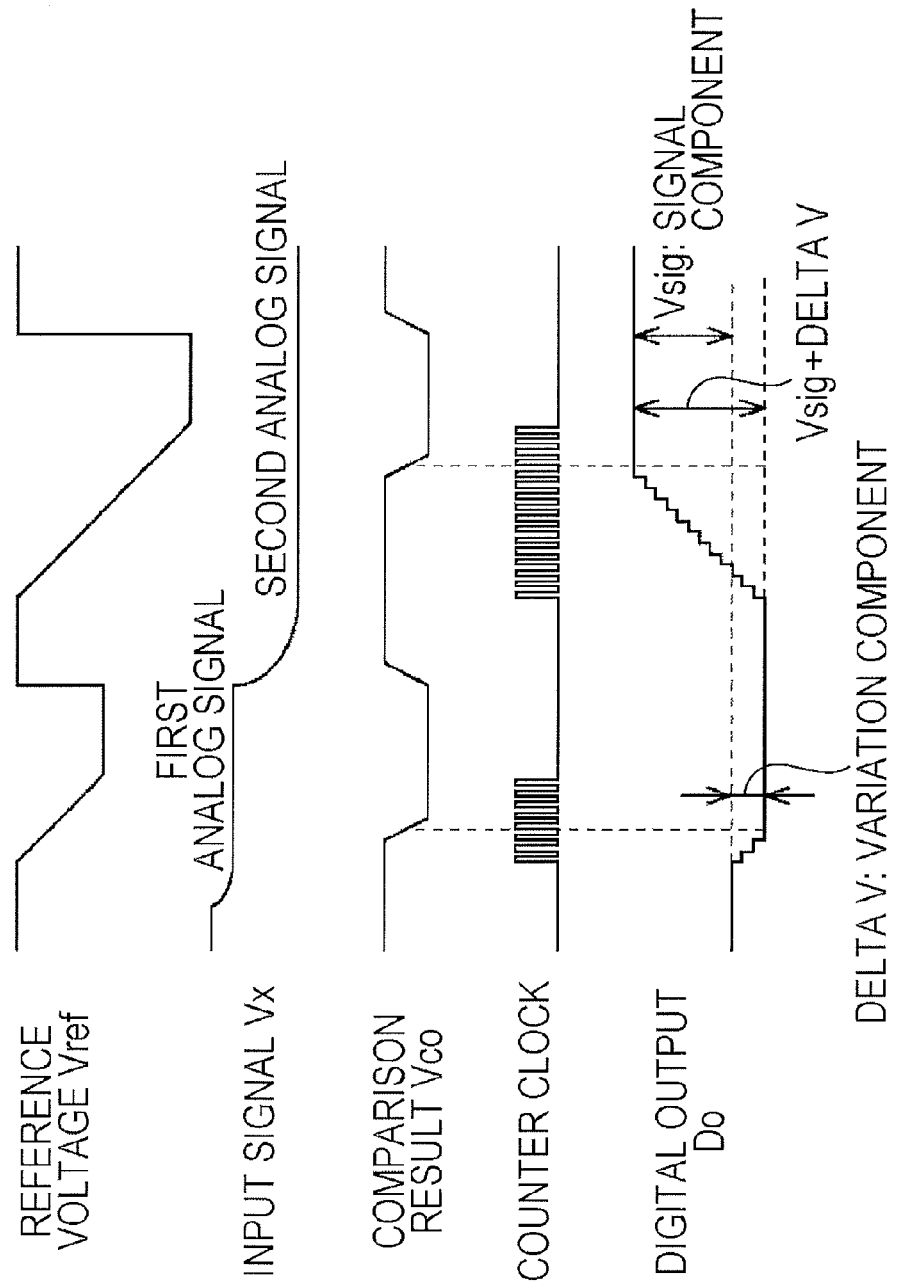
FIG. 2 is a timing chart illustrating an example of A/D conversion.

FIG. 2 is a timing chart illustrating an example of A/D conversion performed by the column A/D conversion unit 10.

As illustrated in FIG. 2, the reference voltage Vref is scanned with ramp amplitudes. The input signal Vx is input, which includes a variation component (noise component) DELTA V of a pixel output as a first analog signal and a component obtained by adding the signal component Vsig to the variation component DELTA V, i.e., Vsig+ DELTA V, as a second analog signal.

The timing measurement unit 13 measures a period of time taken for the comparison result Vco to change with the clocks of the counter, by using, for example, a counter capable of counting up and down. The timing measurement unit 13 counts down the first analog signal and counts up the second analog signal to subtract the second analog signal from the first analog signal. Consequently, the output Do in which only the signal component Vsig has been digitized can be obtained.

In this method, however, the conversion time may increase in proportion to gradation precision. In A/D conversion, generally, as conversion precision (voltage per gradation) increases, an input voltage range (dynamic range) that can be converted decreases. Alternatively, for the same input voltage range (dynamic range), the number of gradations increases, which may cause an increase in conversion time (or a reduction in conversion speed) or an increase in power consumption.

For example, conversion precision may be increased by reducing the slope of the reference voltage if timings at which the reference voltage defined by the clock frequency and signal voltages match are detected with the same level of precision. Since the number of necessary clocks does not change for the same number of gradations, no changes in electric power or speed occur. However, the amplitude of the reference voltage decreases, and therefore an input voltage range for A/D conversion narrows. In this case, in order to increase the number of gradations, more clocks are used, resulting in a reduction in speed and an increase in electric power, while also increasing the amplitude of the reference voltage and reducing the input voltage range for A/D conversion.

By increasing the clock frequency, it is possible to increase conversion precision, without reducing the slope of the reference voltage, while keeping the A/D conversion speed unchanged. However, it is anticipated that power consumption will increase.

That is, as conversion precision increases, the input voltage range narrows or speed or electric power may be reduced. Four times the number of clocks may be used to achieve four times the conversion precision for the same input voltage range.

Figure 3:
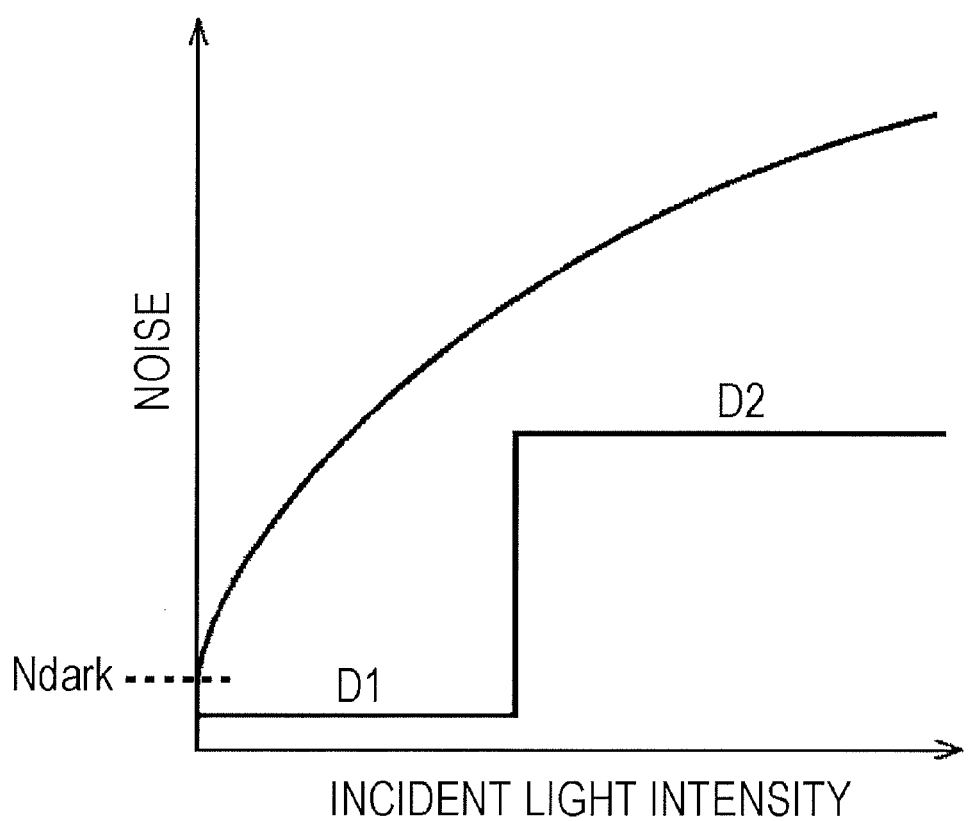
FIG. 3 is a diagram illustrating an example of gradation precision in A/D conversion.

Further, conversion precision (voltage per gradation) for A/D conversion is determined by the level of noise contained in the signal voltage or the degree of amplification (the gain) performed during the development of an image. For example, as illustrated in FIG. 3, in an image sensor, photon shot noise, given by the square root of N, is generated with respect to signal electric charge N generated in proportion to the intensity of incident light, in addition to noise Ndark generated by reading a signal, and the amount of noise increases in accordance with the intensity of incident light. The lower the incident light intensity, the smaller the magnitude of the signal with the smaller absolute value of noise, whereas, the higher the incident light intensity, the larger the magnitude of the signal with the larger absolute value of noise. For this reason, the influence of quantization noise defined by A/D conversion precision differs depending on the magnitude (or brightness) of the signal, where optical shot noise is more predominant for a brighter region, and the demanded AD conversion precision may be low.

In general, it is preferable that conversion precision for A/D conversion be set lower than the total noise level which is the sum of noise generated by reading and photon shot noise to prevent quantization noise in A/D conversion from developing. However, conversion speed or power consumption may be sacrificed for high conversion precision.

Accordingly, for example, a method as illustrated in FIG. 3 has been conceived (see, for example, Japanese Unexamined Patent Application Publication No. 2011-211535). In this method, a higher level of conversion precision (smaller voltage per gradation) D1 is used for a region with a low incident light intensity having a lower noise level, and a low level of conversion precision D2 is used for a region with a high incident light intensity where photon shot noise is more predominant than quantization noise, to improve A/D conversion speed and power consumption substantially without degradation in image quality due to quantization noise.

In the illustrated method, A/D conversion is performed twice or more times in a time division manner on the same signal voltage with reference voltages having different slopes to obtain digital values having different levels of conversion precision, and the obtained digital values are switched over depending on a signal voltage range. Thus, the levels of gradation precision may be changed by varying the slope of the reference voltage Vref at the same counter clock frequency. It may also be possible to change the counter clock frequency without varying the slope of the reference voltage Vref. Nev-ertheless, a reduction in the frequency may lead to a reduction in A/D conversion speed. Thus, it is more preferable that the slope of the reference voltage Vref be changed.

Figure 4:
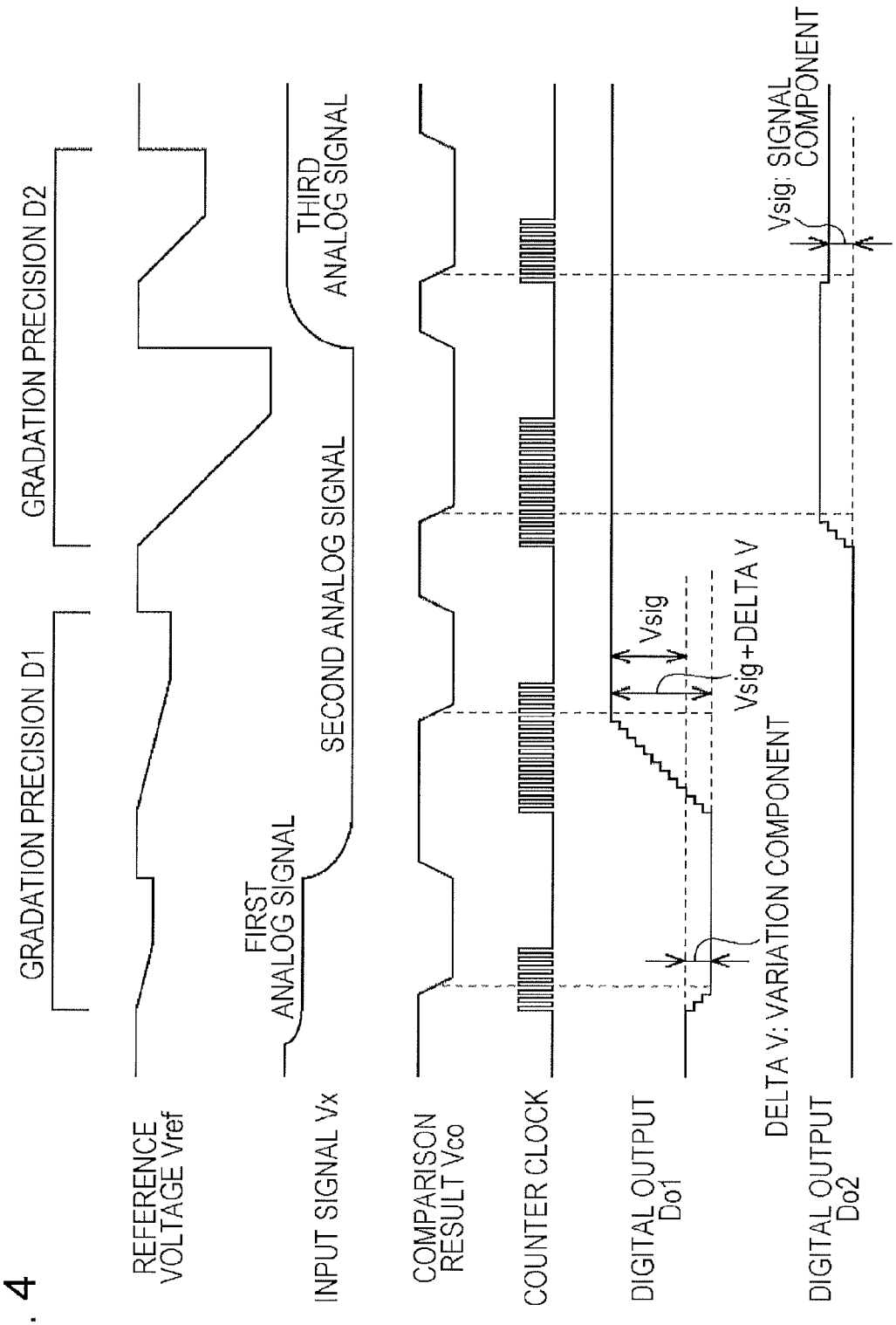
FIG. 4 is a timing chart illustrating another example of A/D conversion.

In the method described above, as illustrated in the timing chart in FIG. 4, A/D conversion with a small slope of the reference voltage Vref, or a high level of gradation precision, is performed on the first analog signal and the second analog signal. Then, A/D conversion with a larger slope of the reference voltage Vref, or a lower level of gradation precision D2, is performed on the second analog signal and a third analog signal. The A/D conversion for the third analog signal is a process for performing subtraction on the variation component. That is, both the first analog signal and the third analog signal are the variation component (noise component).

Doubling gradation precision is equivalent to halving the slope, and twice the conversion time may be taken to perform A/D conversion for the same input signal range. In the example illustrated in FIG. 4, by reducing the input signal range for the gradation precision D1, the higher level of gradation precision D1 is applied only to a region having a small signal component Vsig, and the comparatively low level of gradation precision D2 is applied to a region having a large signal component Vsig. Thus, AD conversion performed twice may take approximately twice the conversion time taken to perform AD conversion with only the gradation precision D2, but may take approximately half the conversion time taken to perform AD conversion with only the gradation precision D1 if the conversion precision D1 is set to be four times as large as the conversion precision D2.

However, in this method, the second analog signal that is the signal component is converted twice in total for. The variation component (i.e., the first analog signal and the third analog signal) is also converted twice in total. Since the amplitude of the variation component is generally smaller than that of the signal component, the amplitude of the reference voltage is also small and the conversion period taken for the variation component is shorter than that for the signal component. Hence, particularly, conversion performed twice in total for the signal component (i.e., the second analog signal) may contribute to a reduction in A/D conversion speed.

To address this issue, in a method, the magnitude of a signal voltage is determined, and the signal voltage is amplified with different amplification factors which are selected in accordance with the determined magnitude to switch the levels of conversion precision for A/D conversion by the signal voltage range for a period of single A/D conversion for the signal component (see, for example, Japanese Unexamined Patent Application Publication No. 2004-15701).

In this method, the magnitude of a pixel output with respect to a predetermined voltage is determined, and an analog signal is amplified in accordance with a determination result. Since an analog signal is amplified prior to A/D conversion, the voltage per least significant bit (LSB) can be reduced in terms of input voltages with respect to the signal component although the gradation precision for A/D conversion does not change. In other words, A/D conversion with high gradation precision can be applied to a region with a low incident light intensity having a small signal amplitude.

In the method described above, however, since a pixel output is amplified in the analog domain, variations in amplification factor of an amplification circuit may be added as fixed pattern noise. In addition, analog amplification may cause a risk that, if the signal component Vsig obtained after the removal of the variation component DELTA V is not amplified, the variation component DELTA V may be amplified and the dynamic range may be narrowed (the output may saturate). Thus, the subtraction processing is performed in the analog domain, which may cause difficulties such as an increase in circuit area, an increase in power consumption, and an increase in noise due to the limitation on analog computational precision.

To address such difficulties, in a method, different levels of conversion precision for A/D conversion are obtained by switching the slope of the reference voltage (see, for example, PTL 1). In this method, two A/D conversion circuits are connected to the same pixel output signal, and reference voltages Vref1 and Vref2 having different slopes are individually input to the AD conversion circuits from two reference voltage generation units to execute AD conversion at two different levels of gradation precision.

In this method, however, the circuit area and power consumption may double. Thus, one AD conversion circuit is used, and a determination unit is used to determine the magnitude of the pixel output signal and to select one of the two reference voltages Vref1 and Vref2 having different slopes in accordance with the determined magnitude of the pixel output signal. The variation component DELTA V is subjected to subtraction in the analog domain by comparison units, and A/D conversion is performed once on a difference signal (Vsig).

However, also in this method, the subtraction for the variation component is performed in the analog domain using a comparison circuit. Thus, it is desirable that the capacitance Cin of the comparison circuit be increased to sufficiently achieve a low noise level, which may cause a larger circuit area or power consumption than that when the subtraction is performed in the digital domain.

Further, the determination unit that determines the magnitude of a pixel output signal is additionally provided. Since the comparison precision (offset error) of the determination unit and the comparison precision (offset error) of the comparison units for A/D conversion differ, due to the error, the reference voltages are supplied within a broader voltage range. This is because even though the determination unit determines a region with a low incident light intensity (a region with a small output amplitude), due to the offset error, a reference voltage for a comparison unit for A/D conversion may be outside the voltage range of the reference voltage Vref1, resulting in a risk of an output image being disrupted.

<Improvement in A/D Conversion>

Accordingly, a signal processing device includes the following elements. A comparison unit is configured to compare an analog signal output from a unit pixel with a certain voltage. A selection unit is configured to select one of a plurality of reference voltages having different levels of gradation precision in accordance with a comparison result of comparison by the comparison unit between the analog signal and at least one or more predetermined determination values. A switching unit is configured to switch a reference voltage to be supplied to the comparison unit in accordance with a selection result obtained by the selection unit. A measurement unit is configured to measure a timing of change of a comparison result of comparison by the comparison unit between the analog signal and a reference voltage supplied to the comparison unit under switching control of the switching unit.

In this manner, a comparison unit used for the comparison with a reference voltage in A/D conversion is also used for the comparison with a predetermined determination value, and a level of gradation precision is selected using a comparison result. Thus, the signal processing device can reduce the voltage range margin of a reference voltage, which affects the comparison precision of determination (offset error), and can achieve the advantages of high speed or low power consumption. In other words, the occurrence of errors in A/D conversion can be suppressed or at least reduced.

The predetermined determination value may be supplied from a reference voltage generation unit configured to supply a reference voltage having a high level of gradation precision among the plurality of reference voltages.

In this manner, by setting a predetermined determination value using a reference voltage generation unit that supplies a reference voltage having a high level of gradation precision, the signal processing device can further reduce the voltage range margin of a reference voltage, which affects comparison precision (offset error).

For example, if the reference voltage Vref1 has a higher level of conversion precision (that is, a slope voltage having a smaller slope) than the reference voltage Vref2, it is desirable that the predetermined determination value be set in a voltage range within which A/D conversion can be performed on the reference voltage Vref1. Hence, if the predetermined determination value is set by a voltage generation unit different from that corresponding to the reference voltage Vref1, it is necessary to increase the voltage range of the reference voltage Vref1 by the amount corresponding to the voltage setting error (offset). The predetermined determination value is set by the same voltage generation unit as that corresponding to the reference voltage Vref1 having a high level of conversion precision, thus allowing the predetermined determination value to be supplied without increasing the number of circuits. In addition, the voltage setting error can also be canceled.

The selection unit may select a reference voltage having a high level of gradation precision among the plurality of reference voltages when it is determined, as a result of comparison performed by the comparison unit, that the analog signal is smaller than the predetermined determination value, and may select a reference voltage having a low level of gradation precision among the plurality of reference voltages when it is determined that the analog signal is larger than the predetermined determination value, and the switching unit may cause the reference voltage selected by the selection unit to be supplied to the comparison unit.

That is, a high level of gradation precision is applied to a region where quantization noise may be predominant noise, and a low level of gradation precision is applied to a region where photon shot noise and the like are predominant. Thus, the signal processing device can achieve A/D conversion which provides image quality equivalent to that obtained through high-gradation A/D conversion, while reducing the conversion speed and power consumption (or with high speed and low power consumption).

The comparison unit may compare each of a first analog signal that is a noise signal of the unit pixel and a second analog signal that is a signal including data of the unit pixel with the reference voltage supplied to the comparison unit, and the measurement unit may determine a difference between a measured timing of change of a comparison result of comparison by the comparison unit between the first analog signal and the reference voltage and a measured timing of change of a comparison result of comparison by the comparison unit between the second analog signal and the reference voltage.

Thus, the signal processing device can perform subtraction processing for removing the variation component in the digital domain, and can prevent an increase in circuit scale or power consumption caused by the subtraction processing.

The selection unit may sequentially select reference voltages for the first analog signal, the switching unit may cause the reference voltages selected by the selection unit to be supplied to the comparison unit, and the comparison unit may sequentially compare the first analog signal with each of the reference voltages in accordance with control of the switching unit. Further, the selection unit may select one of the plurality of reference voltages for the second analog signal in accordance with a comparison result of comparison by the comparison unit between the second analog signal and the at least one or more predetermined determination values, the switching unit may cause the reference voltage selected by the selection unit to be supplied to the comparison unit, and the comparison unit may compare the second analog signal with the reference voltage selected by the selection unit in accordance with control of the switching unit. Further, the measurement unit may determine a difference between a measured timing of change of a comparison result of comparison between the second analog signal and the reference voltage selected by the selection unit and a measured timing of change of a comparison result of comparison between the first analog signal and the reference voltage selected by the selection unit.

In this manner, the first analog signal (variation component) is compared with each of reference voltages having levels of gradation precision. Thus, the signal processing device can perform A/D conversion on the second analog signal (signal component+variation component) at any level of gradation precision.

The signal processing device may further include a reference voltage supply unit configured to supply the plurality of reference voltages.

By supplying reference voltages, the signal processing device can easily perform scanning control of reference voltages.

The reference voltage supply unit may supply the plurality of reference voltages so that a voltage in a predetermined range is compared with the first analog signal and the second analog signal in a first comparison direction that is a direction in which the voltage increases from low to high or a second comparison direction that is a direction in which the voltage decreases from high to low.

Thus, the comparison unit can compare the first analog signal and the second analog signal with reference voltages of a voltage in a predetermined range.

The reference voltage supply unit may supply the plurality of reference voltages so that the plurality of reference voltages are compared with the first analog signal in order of gradation precision in such a manner that each of the plurality of reference voltages is compared with the first analog signal in a comparison direction opposite to the comparison direction of a preceding reference voltage.

The comparison directions of reference voltages having different levels of gradation precision to be sequentially applied to the first analog signal sequentially alternate, thus making it possible to eliminate the transition of the comparison result Vco before the comparison with the next gradation precision begins. Therefore, the signal processing device can reduce the settling period of time between A/D conversion operations, and achieve a further increase in speed.

The reference voltage supply unit may supply the reference voltage selected by the selection unit so that the reference voltage is compared with the second analog signal in the same comparison direction as a comparison direction in which the reference voltage is compared with the first analog signal.

Accordingly, the signal processing device can achieve low-noise A/D conversion without impairing the removal precision of the variation component (that is, the first analog signal) due to nonlinearity (or hysteresis) differing depending on the scanning direction of the reference voltage.

The reference voltage supply unit may supply a reference voltage having the highest level of gradation precision among the plurality of reference voltages so that a voltage in the range is compared with the first analog signal and the second analog signal in the second comparison direction, and supply a reference voltage having the lowest level of gradation precision among the plurality of reference voltages so that a voltage in the range is compared with the first analog signal and the second analog signal in the first comparison direction.

Thus, the signal processing device can perform A/D conversion on the second analog signal with the respective levels of gradation precision from the logical value to which the comparison unit transitions in the determination result of the predetermined voltage. Therefore, the signal processing device no longer waits for a period during which the comparison unit transitions before A/D conversion to make the logic stable, and can therefore achieve a further increase in speed.

The signal processing device may further include a plurality of sets each including the comparison unit, the selection unit, the switching unit, and the measurement unit. In each of the plurality of sets, the selection unit may include a first holding unit and a second holding unit, the first holding unit and the second holding unit being configured to hold the comparison result. In each of the plurality of sets, the first holding unit may hold the comparison result until comparison results obtained by the comparison unit for all the sets are held in the first holding unit. In each of the plurality of sets, the second holding unit may hold the comparison result after the first holding unit holds the comparison results for all the sets, and select one of the plurality of reference voltages in accordance with the held comparison result.

When a reference voltage is switched in accordance with a comparison result with a predetermined determination value, noise may be generated in the reference voltage. In addition, the noise may cause an error in other comparison results due to the difference in delay of clock signals supplied to the respective AD conversion units. As described above, the comparison result is held until comparison results obtained by the comparison unit for all the sets are held in the first holding unit. Thus, any influence of such noise can be reduced.

An embodiment of the present technology may also be implemented as a signal processing method for the signal processing device.

An embodiment may provide an imaging element including a pixel array having unit pixels arranged thereon, each unit pixel including a photoelectric conversion element configured to perform photoelectric conversion on incident light; a comparison unit configured to compare an analog signal output from a unit pixel in the pixel array with a certain voltage; a selection unit configured to select one of a plurality of reference voltages having different levels of gradation precision in accordance with a comparison result of comparison by the comparison unit between the analog signal and at least one or more predetermined determination values; a switching unit configured to switch a reference voltage to be supplied to the comparison unit in accordance with a selection result obtained by the selection unit; and a measurement unit configured to measure a timing of change of a comparison result of comparison by the comparison unit between the analog signal and a reference voltage supplied to the comparison unit under switching control of the switching unit.

An embodiment may further provide an imaging apparatus including an imaging unit configured to capture an image of a subject; and an image processing unit configured to perform image processing on image data obtained by capturing the image by using the imaging unit, the imaging unit including a pixel array having unit pixels arranged thereon, each unit pixel including a photoelectric conversion element configured to perform photoelectric conversion on incident light, a comparison unit configured to compare an analog signal output from a unit pixel in the pixel array with a certain voltage; a selection unit configured to select one of a plurality of reference voltages having different levels of gradation precision in accordance with a comparison result of comparison by the comparison unit between the analog signal and at least one or more predetermined determination values, a switching unit configured to switch a reference voltage to be supplied to the comparison unit in accordance with a selection result obtained by the selection unit, and a measurement unit configured to measure a timing of change of a comparison result of comparison by the comparison unit between the analog signal and a reference voltage supplied to the comparison unit under switching control of the switching unit.

Accordingly, an embodiment of the present technology may be implemented as a signal processing device or any apparatus configured to perform signal processing similar to that described above. Part or all the control processes may be implemented by software.

A more specific description will be given hereinafter.

<CMOS Image Sensor>

Figure 5:
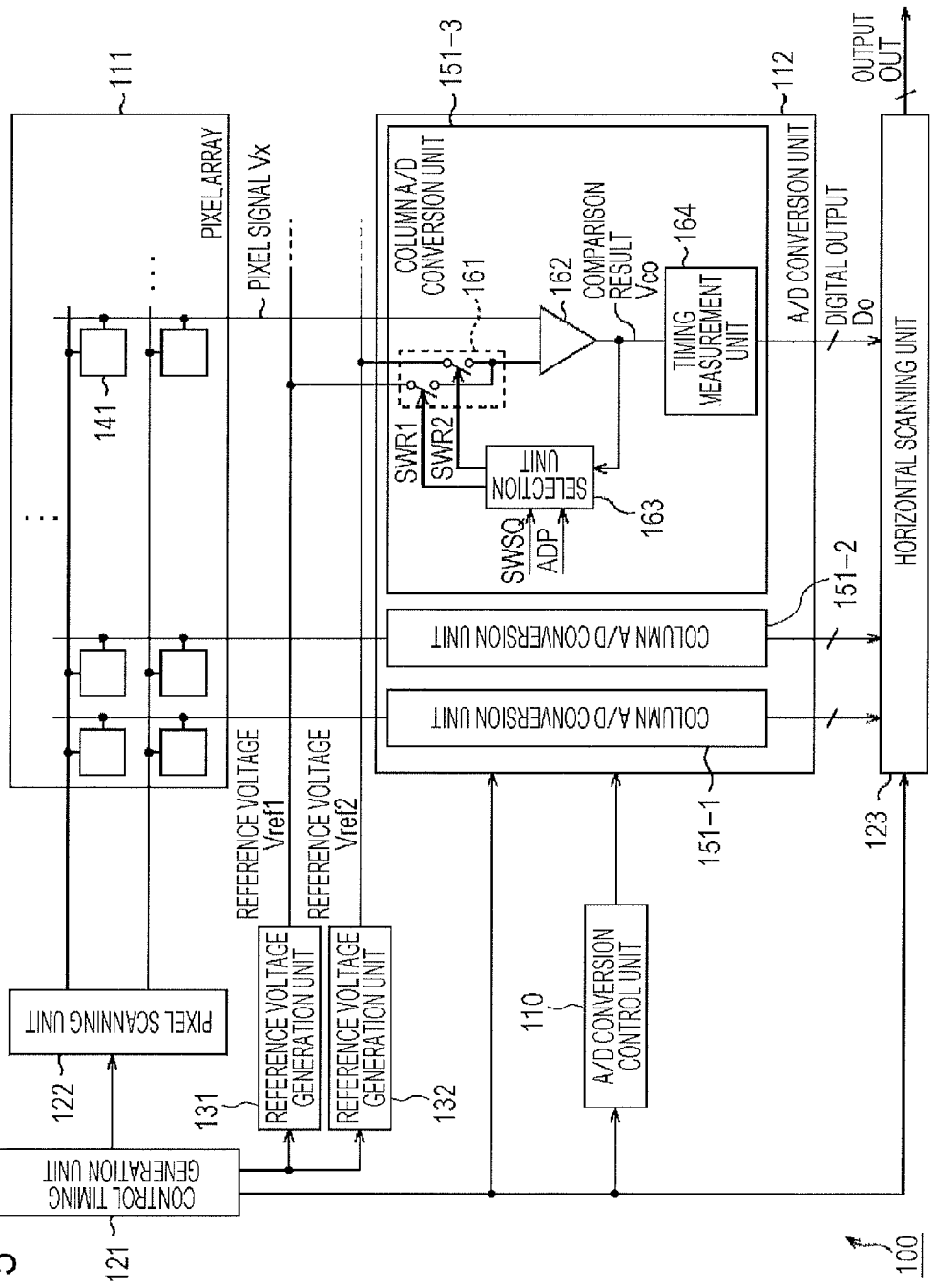
FIG. 5 is a diagram illustrating an example of a main configuration of a CMOS image sensor.

FIG. 5 is a diagram illustrating an example of a main configuration of a complementary metal oxide semiconductor (CMOS) image sensor 100. The CMOS image sensor 100 illustrated in FIG. 5 is an example of a CMOS-based imaging element or a signal processing device configured to process an image signal obtained from a pixel region. As illustrated in FIG. 5, the CMOS image sensor 100 includes a pixel array 111, and an A/D conversion unit 112 that is an example of a signal processing device. The CMOS image sensor 100 performs photoelectric conversion on light incident on the pixel array 111 to produce an analog signal, and performs A/D conversion on the analog signal by using the A/D conversion unit 112 to output digital data corresponding to an image based on the incident light.

The pixel array 111 has an array (or a matrix) of unit pixels 141 each including a photoelectric conversion element, which are indicated by squares in FIG. 5. In FIG. 5, some of the unit pixels 141 are illustrated. The number of pixels of the pixel array 111 is arbitrary. The number of rows and the number of columns are also arbitrary.

The A/D conversion unit 112 includes column A/D conversion units 151 each provided for each column in the pixel array 111, and each of the column A/D conversion units 151 is configured to perform A/D conversion on analog pixel signals Vx read from the unit pixels in the corresponding column. Each of the column A/D conversion units 151 is an example of a signal processing device.

In FIG. 5, a column A/D conversion unit 151-1, a column A/D conversion unit 151-2, and a column A/D conversion unit 151-3 located at the first column, the second column, and the third column from the leftmost in the pixel array 111, respectively, are illustrated. Actually, the A/D conversion unit 112 includes a column A/D conversion unit 151 associated with each of all the columns of unit pixels 141 in the pixel array 111. The individual column A/D conversion units will be referred to simply as column A/D conversion units 151 unless otherwise individually specified.

The number of column A/D conversion units 151 may not be exactly the same as the number of columns in the pixel array 111. For example, one column A/D conversion unit 151 may perform A/D conversion on pixel signals Vx for a plurality of columns in the pixel array 111. For example, the column A/D conversion units 151 may perform A/D conversion processing on the pixel signals Vx for the corresponding columns in a time division manner.

The CMOS image sensor 100 further includes an A/D conversion control unit 110, a control timing generation unit 121, a pixel scanning unit 122, a horizontal scanning unit 123, a reference voltage generation unit 131, and a reference voltage generation unit 132.

For example, the control timing generation unit 121 supplies a clock signal to the A/D conversion control unit 110, the A/D conversion unit 112, the pixel scanning unit 122, the horizontal scanning unit 123, the reference voltage generation unit 131, and the reference voltage generation unit 132 to control the timing of the operations of the respective processing units.

The pixel scanning unit 122 supplies a control signal to each of the unit pixels 141 in the pixel array 111 to control the operation thereof. The horizontal scanning unit 123 sequentially outputs digital data supplied from the column A/D conversion units 151 in units of rows of unit pixels.

The A/D conversion control unit 110 controls the operation of each of the column A/D conversion units 151. The reference voltage generation unit 131 supplies a reference voltage Vref1 to the column A/D conversion units 151. The reference voltage generation unit 132 supplies a reference voltage Vref2 different from the reference voltage Vref1 to the column A/D conversion units 151.

Each of the column A/D conversion units 151 of the A/D conversion unit 112 operates at a timing controlled by the control timing generation unit 121.

Each of the column A/D conversion units 151 includes a switching unit 161, a comparison unit 162, a selection unit 163, and a timing measurement unit 164. While the configuration of the column A/D conversion unit 151-3 is illustrated in FIG. 5, all the column A/D conversion units 151 including the column A/D conversion unit 151-1 and the column A/D conversion unit 151-2 have configurations similar to the configuration of the column A/D conversion unit 151-3.

The switching unit 161 has a switch provided between the reference voltage generation unit 131 and the comparison unit 162 so that the connection and disconnection (on and off) between the reference voltage generation unit 131 and the comparison unit 162 is controlled by a control signal SWR1 supplied from the selection unit 163. The switching unit 161 further has a switch provided between the reference voltage generation unit 132 and the comparison unit 162 so that the connection and disconnection (on and off) between the reference voltage generation unit 132 and the comparison unit 162 is controlled by a control signal SWR2 supplied from the selection unit 163. That is, the switching unit 161 supplies one of the reference voltage Vref1 supplied from the reference voltage generation unit 131 and the reference voltage Vref2 supplied from the reference voltage generation unit 132 which is selected by the selection unit 163 to the comparison unit 162.

The comparison unit 162 compares the voltage of the analog pixel signal Vx read from each of the unit pixels 141 with the reference voltage (Vref1 or Vref2) supplied from the switching unit 161. The comparison unit 162 supplies a comparison result Vco (indicating which is larger) to the selection unit 163 and the timing measurement unit 164.

The comparison unit 162 compares the voltage of the pixel signal Vx with a reference voltage that scans a certain voltage width in order to perform A/D conversion on the pixel signal Vx. Further, the comparison unit 162 compares the pixel signal Vx (second analog signal) with a reference voltage (predetermined determination value) having a predetermined magnitude in order to determine the gradation precision at which the pixel signal Vx (second analog signal) is subjected to A/D conversion.

In this manner, the comparison operation for performing A/D conversion on the pixel signal Vx and the comparison operation for determining the gradation precision are performed by a common comparison unit, namely, the comparison unit 162. Thus, the column A/D conversion units 151 reduce the margin necessary for the voltage range of the reference voltage, thus achieving high A/D conversion speed or low power consumption.

The selection unit 163 selects a reference voltage to be supplied to the comparison unit 162 in accordance with control of the A/D conversion control unit 110. A control signal ADP and a control signal SWSQ are supplied to the selection unit 163 from the A/D conversion control unit 110. The selection unit 163 selects one of the reference voltage Vref1 and the reference voltage Vref2 at a timing based on the control signal ADP and the control signal SWSQ in accordance with the comparison result Vco supplied from the comparison unit 162. The selection unit 163 determines the values of the control signal SWR1 and the control signal SWR2 so that the switching unit 161 can supply the selected reference voltage to the comparison unit 162, and supplies the control signal SWR1 and the control signal SWR2 to the switching unit 161.

The timing measurement unit 164 has a counter, and counts a period of time from when the comparison unit 162 starts comparison to when the value of the comparison result Vco changes, by using the counter. The timing measurement unit 164 supplies the count value (that is, the length of the period of time from when the comparison unit 162 starts comparison to when the value of the comparison result Vco changes) to the horizontal scanning unit 123 as digital data of the pixel signal Vx.

The timing measurement unit 164 has a counter capable of counting up and down. Thus, the timing measurement unit 164 can subtract a count value obtained as a result of comparison between a first analog signal (variation component) and a reference voltage from a count value obtained as a result of comparison between a second analog signal (signal level+ variation component) and the reference voltage, by performing a counting operation. That is, the timing measurement unit 164 can easily perform the subtraction described above. Furthermore, since the timing measurement unit 164 can perform the subtraction described above in the digital domain, circuit scale or power consumption can be reduced.

Figure 6A:
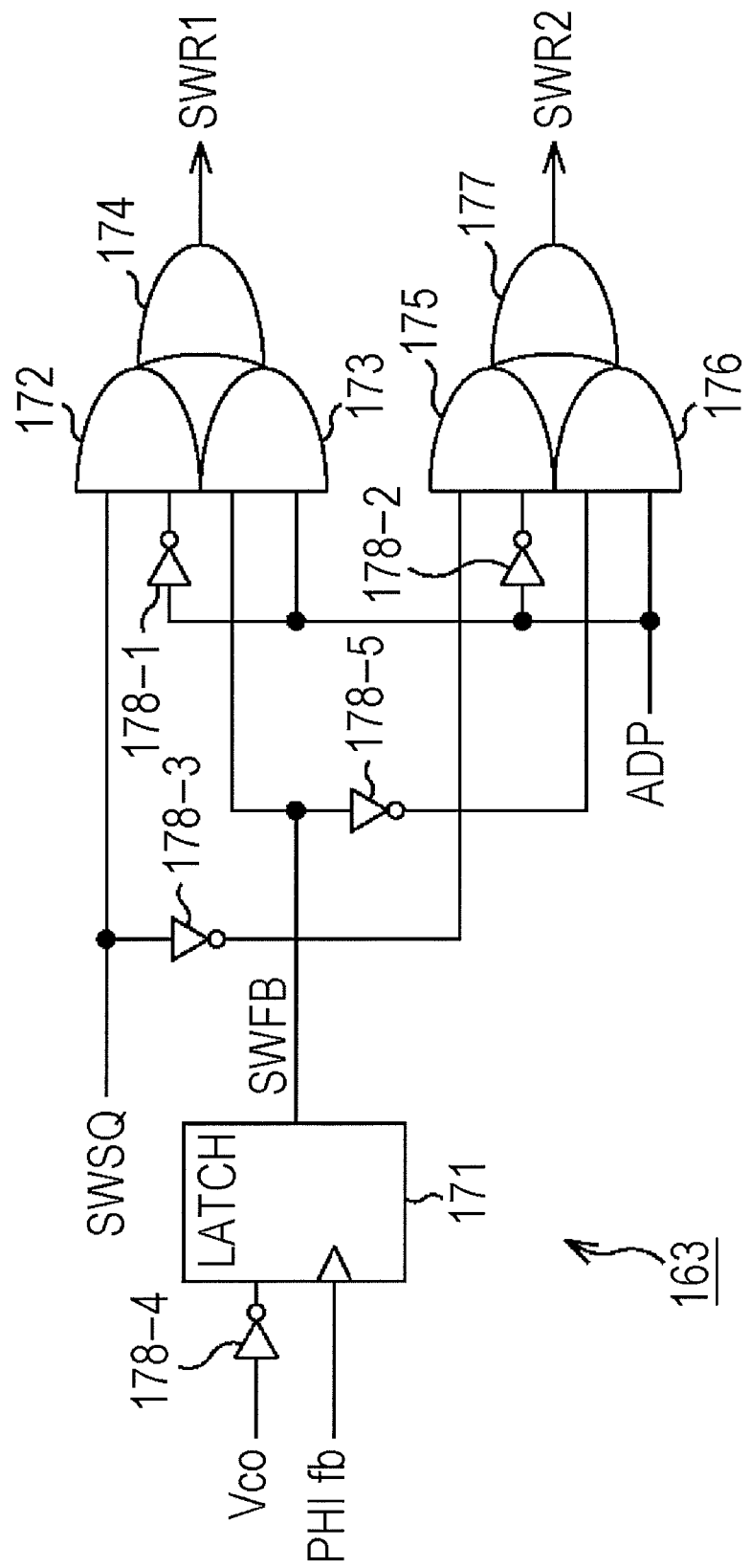
FIG. 6A is a diagram illustrating an example of a main configuration of a selection unit.

The selection unit 163 illustrated in FIG. 5 will now be described. FIG. 6A is a diagram illustrating an example of a main configuration of the selection unit 163. As illustrated in FIG. 6A, the selection unit 163 includes a latch 171, an AND 172, an AND 173, an OR 174, an AND 175, an AND 176, an OR 177, and NOTs 178-1 to 178-5.

The selection unit 163 receives control signals ADP, SWSQ, and PHI fb and a comparison result Vco, and outputs control signals SWR1 and SWR2. The control signal PHI fb controls the timing at which the negation of the comparison result Vco (SWFB) is latched. A truth table of the control signals ADP and SWSQ and the control signals SWR1 and SWR2 is as illustrated in FIG. 6B.

For example, when the control signal ADP is at the low level, if the control signal SWSQ is at the low level, a low-level control signal SWR1 is output and a high level control signal SWR2 is output. That is, the reference voltage Vref2 is selected and is supplied to the comparison unit 162. If the control signal SWSQ is at the high level, a high level control signal SWR1 is output and a low level control signal SWR2 is output. That is, the reference voltage Vref1 is selected and is supplied to the comparison unit 162.

Further, for example, after the negation of the comparison result Vco is held in the latch 171 in response to a pulse of the control signal PHI fb, if the control signal ADP is at the high level, the signal SWFB (negation of the comparison result Vco) is output as the control signal SWR1 regardless of the value of the control signal SWSQ, and the negation of the signal SWFB (comparison result Vco) is output as the control signal SWR2. That is, if the comparison result Vco is at the low level, the reference voltage Vref1 is selected and is supplied to the comparison unit 162. If the comparison result Vco is at the high level, the reference voltage Vref2 is selected and is supplied to the comparison unit 162.

Figure 7:
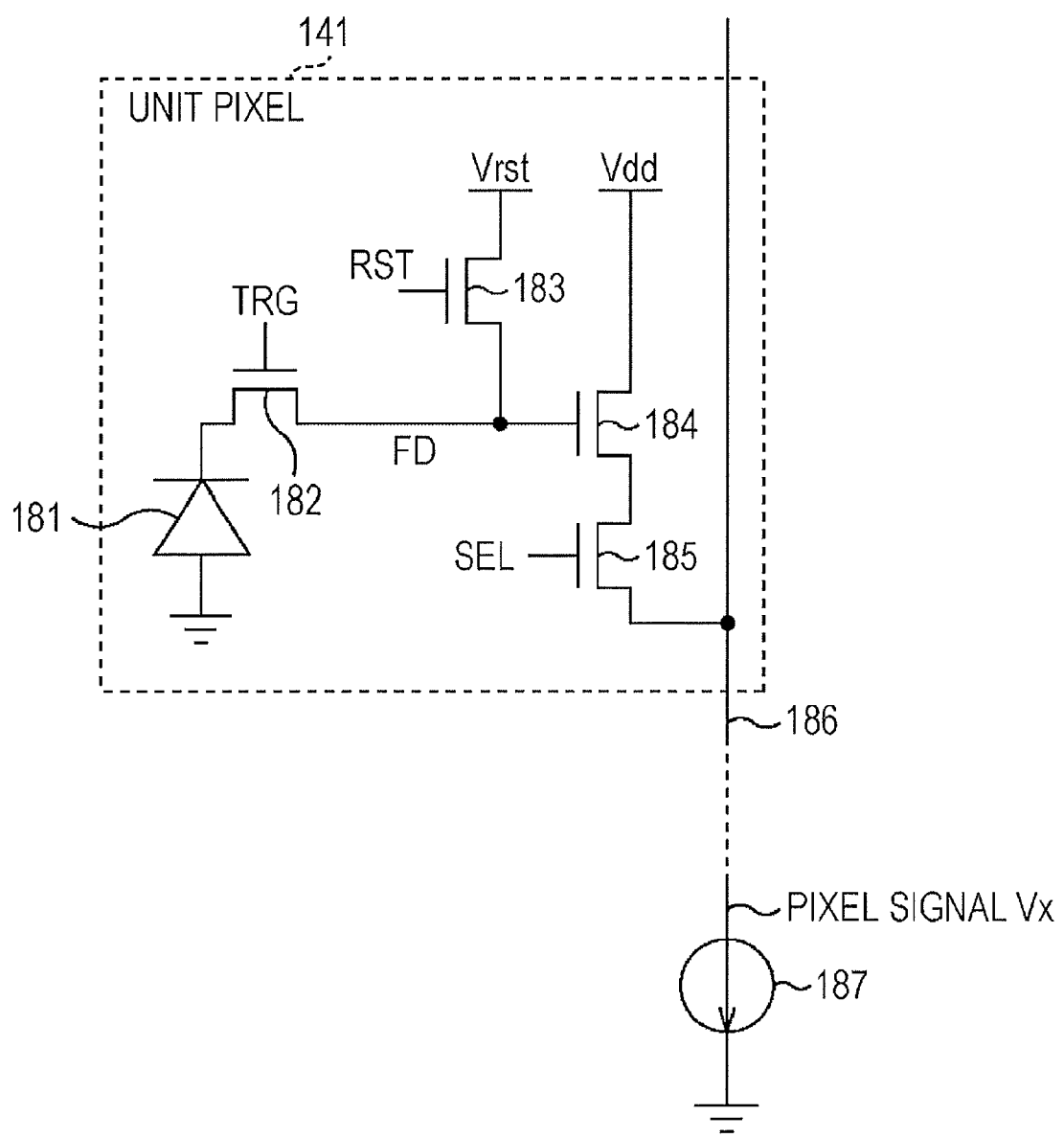
FIG. 7 is a diagram illustrating an example of a main configuration of a unit pixel.

The unit pixels 141 illustrated in FIG. 5 will now be described. FIG. 7 is a diagram illustrating an example of a main configuration of each of the unit pixels 141. As illustrated in FIG. 7, the unit pixel 141 includes a photodiode 181, a transfer transistor 182, a reset transistor 183, an amplification transistor 184, and a selection transistor 185. Further, the unit pixel 141 is connected to a vertical signal line 186. In addition to the unit pixel 141, a low current source 187 representing a load is also connected to the vertical signal line 186.

Optical electric charge generated in the photodiode 181, which is an example of a photoelectric conversion element, is transferred to a parasitic capacitor at a node FD in accordance with a control signal TRG at a gate of the transfer transistor 182, and is subjected to electric charge/voltage conversion. The resulting voltage is connected to the gate of the amplification transistor 184, and is output to the vertical signal line 186 as a pixel signal Vx when a pixel is selected by the control signal SEL at the gate of the selection transistor 185. Further, the node FD is set to a predetermined voltage Vrst by a control signal RST at a gate of the reset transistor 183, and can be output as a pixel signal Vx representing the variation component of the amplification transistor 184 and the like.

In the following description, the pixel signal Vx set to the predetermined voltage Vrst by the control signal RST is referred to as a first analog signal, and the pixel signal Vx to which optical electric charge is transferred and the signal level is added is referred to as a second analog signal.

Figure 8:
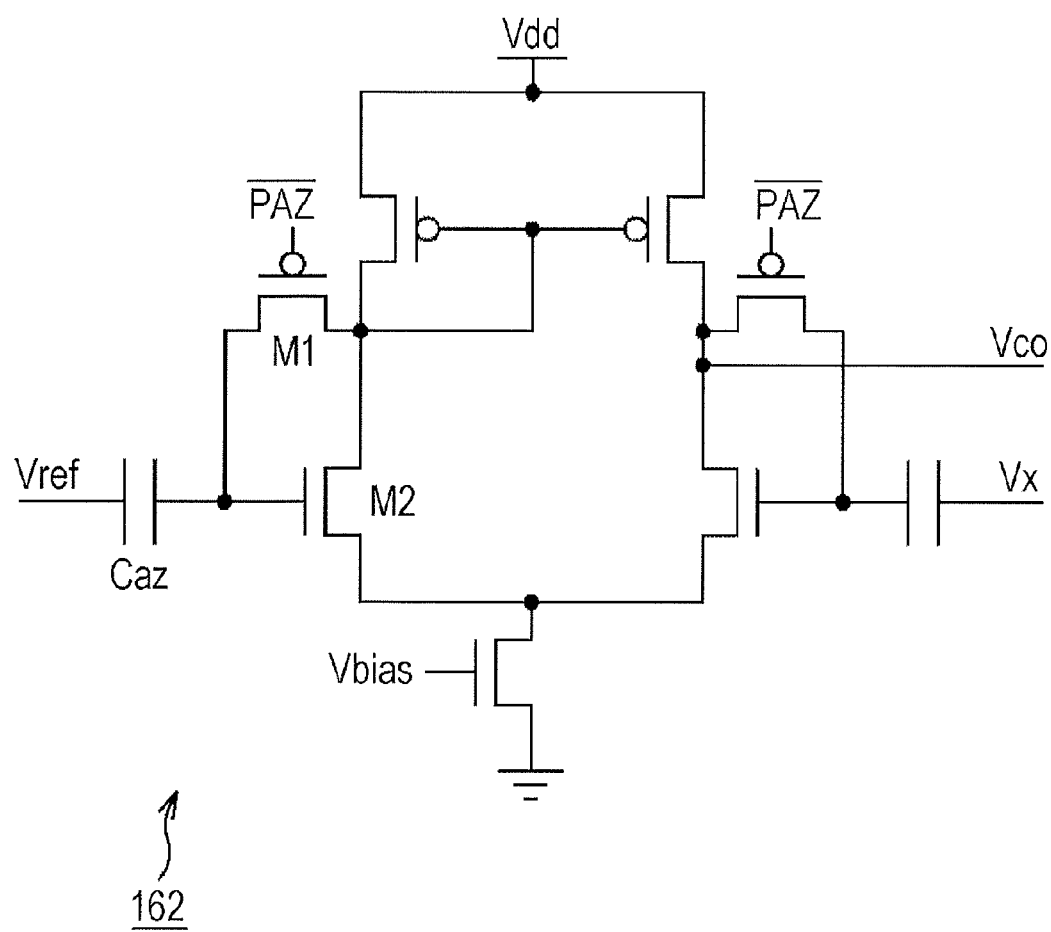
FIG. 8 is a diagram illustrating an example of a main configuration of a comparison unit.

The comparison unit 162 will now be described. FIG. 8 is a diagram illustrating an example of a main configuration of the comparison unit 162.

If the magnitude relationship between the pixel signal Vx and the reference voltage Vref is inverted, the comparison result Vco transitions from one state to the other state. By storing an offset error of a differential amplification circuit by a control signal PAZ, the comparison unit 162 can more accurately compare the pixel signal Vx with the reference voltage Vref.

<Timing Chart for First Embodiment>

Figure 9:
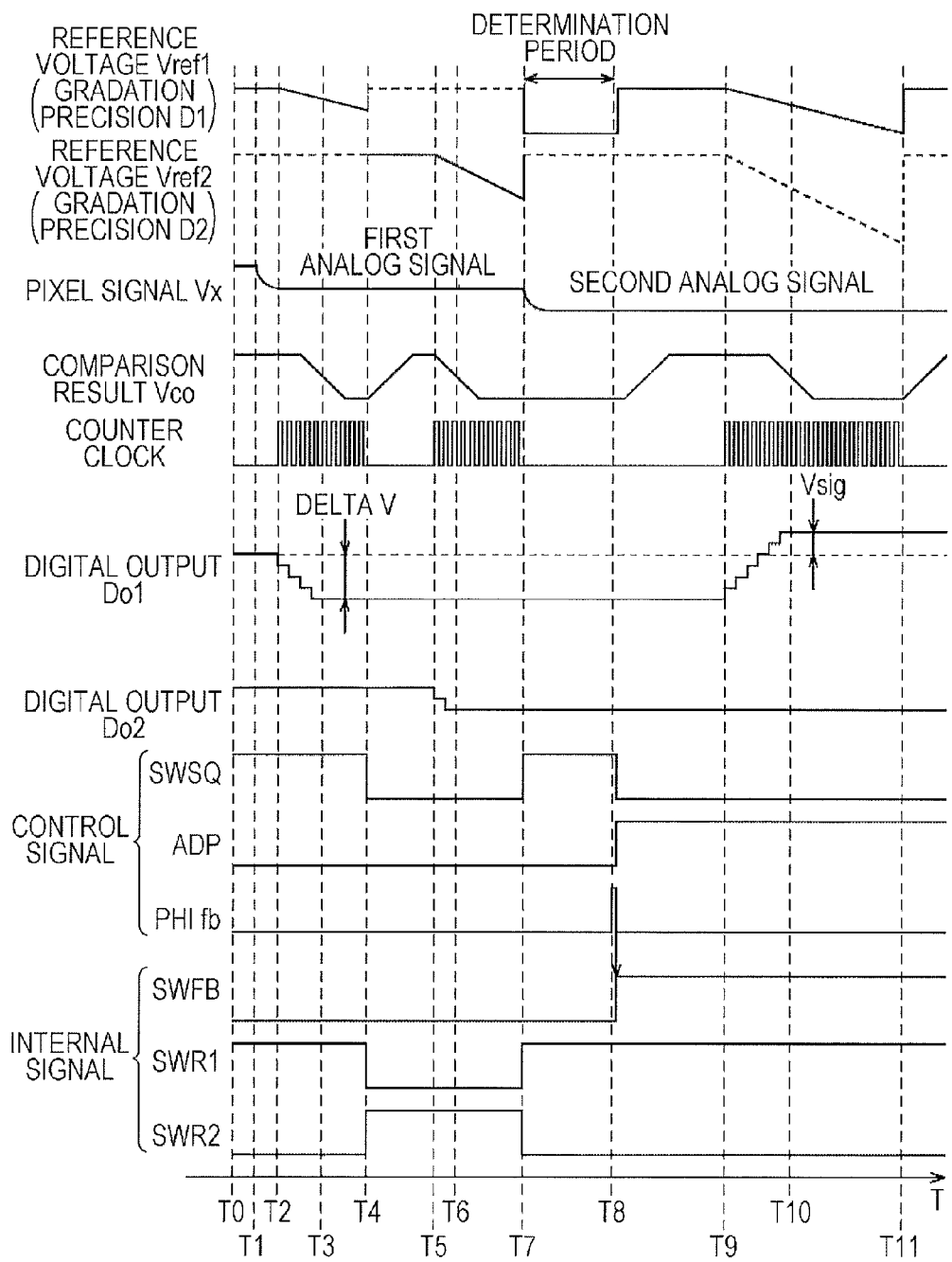
FIG. 9 is a timing chart illustrating an example of A/D conversion.

Next, the operation of the CMOS image sensor 100 and a control flow will be described. FIG. 9 is a timing chart illustrating an example of A/D conversion when the incident light intensity is low, that is, when the amplitude of the second analog signal is small. Here, the timing of the operations in A/D conversion processing to be performed on a pixel signal Vx read from a certain unit pixel 141 will be described.

At time T0, when the reading of a pixel signal Vx from a unit pixel 141 is started, then, at time T1, the reading of the first analog signal (variation component DELTA V) is started.

At time T2, the reference voltage generation unit 131 starts the voltage scanning of the reference voltage Vref1. The reference voltage generation unit 131 scans the reference voltage Vref1 in steps of gradation precision D1 (for example, 60 uV/LSB) in a high to low direction (or the comparison direction) (that is, scans the voltage from the dark side to the bright side). This scanning continues until time T4.

During the period from the time T0 to the time T4, the control signal SWSQ is set at the high level, the control signal ADP is set at the low level, and the control signal PHI fb is set at the low level. That is, the selection unit 163 selects the reference voltage Vref1, and the switching unit 161 causes the reference voltage Vref1 generated by the reference voltage generation unit 131 to be supplied to the comparison unit 162.

During the period from the time T2 to the time T4, during which the reference voltage Vref1 is scanned, the comparison unit 162 compares the pixel signal Vx (first analog signal) with the reference voltage Vref1. The timing measurement unit 164 starts to count the clocks of the counter at the time T2. The counting continues until the comparison result Vco of comparison between the pixel signal Vx (first analog signal) and the reference voltage Vref1 changes or until the time T4 has been reached.

It is assumed that the comparison result Vco changes at the time T3 prior to the time T4. In this case, the timing measurement unit 164 finishes counting at the time T3. The timing measurement unit 164 outputs the current count value as a digital output Do1. That is, the digital output Do1 is a digital value of the variation component DELTA V.

When the comparison between the reference voltage Vref1 and the first analog signal is completed, then, the first analog signal is compared with the reference voltage Vref2. At the time T4, the control signal SWSQ is switched to the low level, and the switching unit 161 causes the reference voltage Vref2 generated by the reference voltage generation unit 132 to be supplied to the comparison unit 162.

After waiting for the value of the comparison result Vco to transition, at time T5, the reference voltage generation unit 132 starts the voltage scanning of the reference voltage Vref2. The reference voltage generation unit 132 scans the reference voltage Vref2 in steps of gradation precision D2 (for example, 240 uV/LSB) different from the gradation precision D1 in a high to low direction (or the comparison direction) (that is, scans the voltage from the dark side to the bright side). This scanning continues until time T.

During this period, the comparison unit 162 compares the pixel signal Vx (first analog signal) with the reference voltage Vref2. The timing measurement unit 164 starts to count the clocks of the counter at the time T5. This counting continues until the comparison result Vco of comparison between the pixel signal Vx (first analog signal) and the reference voltage Vref2 changes or until the time T7 has been reached.

It is assumed that the comparison result Vco changes at the time T6 prior to the time T7. In this case, the timing measurement unit 164 finishes counting at the time T6. The timing measurement unit 164 outputs the current count value as a digital output Do2. That is, the digital output Do2 is a digital value of the variation component DELTA V.

When the comparison between the reference voltages Vref1 and Vref2 and the first analog signal is completed, then, the second analog signal is compared with the reference voltages Vref1 and Vref2. At the time T4, the control signal SWSQ is switched to the low level, and the switching unit 161 causes the reference voltage Vref2 generated by the reference voltage generation unit 132 to be supplied to the comparison unit 162.

Accordingly, the column A/D conversion unit 151 sequentially performs A/D conversion on the first analog signal using the reference voltage Vref1 and the reference voltage Vref2. The comparison result Vco changes at the timing at which the pixel signal Vx and the reference voltage Vrefx match by the voltage scanning of the reference voltages, and the timing is measured to make it possible to obtain a voltage value as a digital value. The timing may be measured using, for example, a counter circuit. The number of clocks of the counter is counted, and the counting is stopped at the timing of change of the comparison result Vco. Thus, the period of time, or the voltage width over which the reference voltage is scanned until the comparison result Vco changes, is recorded as a digital value.

The result of conversion with the reference voltage Vref1 and the result of conversion with the reference voltage Vref2 are held in the digital outputs Do1 and Do2, respectively. The digital values obtained here are based on the first analog signal and are therefore values obtained by the resetting of the pixel, or the value of the variation component DELTA V. Since the digital outputs Do1 and Do2 are obtained through the A/D conversion of the same first analog signal with different levels of gradation precision, the magnitudes of the digital values are different.

Then, during a period from the time T7 to time T8, the column A/D conversion unit 151 sets the reference voltage Vref1 to a predetermined determination value less than or equal to the maximum amplitude of the reference voltage Vref1 with respect to the second analog signal, and compares the second analog signal with the set reference voltage Vref1.

This comparison is performed using the comparison unit 162 used in A/D conversion. At the time T8, the obtained comparison result Vco is latched into the latch 171 of the selection unit 163 in response to a pulse of the control signal PHI fb, and is captured as a signal SWFB.

On the basis of this comparison result, the reference voltage to be compared with the second analog signal is selected. In the example illustrated in FIG. 9, the amplitude of the second analog signal is small. Thus, the second analog signal is compared with the reference voltage Vref1. In the example illustrated in FIG. 9, the signal SWFB at the low level transitions to the high level in response to the capture at the time T8.

After the comparison result Vco is captured, the control signal ADP transitions to the high level, and the reference voltage to be supplied to the comparison unit 162 is selected on the basis of the signal SWFB. In the example illustrated in FIG. 9, since the signal SWFB becomes the high level, the control signal SWR1 becomes the high level and the control signal SWR2 becomes the low level. As described above, the reference voltage Vref1 is selected.

After waiting for the value of the comparison result Vco to transition, at time T9, the reference voltage generation unit 131 starts the voltage scanning of the reference voltage Vref1. The reference voltage generation unit 131 scans the reference voltage Vref1 in steps of the gradation precision D1 in a high to low direction (or the comparison direction) (that is, scans the voltage from the dark side to the bright side). This scanning continues until time T11.

During this period, the comparison unit 162 compares the pixel signal Vx (second analog signal) with the reference voltage Vref1. The timing measurement unit 164 starts to count the clocks of the counter at the time T9. This counting continues until the comparison result Vco of comparison between the pixel signal Vx (second analog signal) and the reference voltage Vref1 changes or until the time T11 has been reached.

It is assumed that the comparison result Vco changes at the time T10 prior to the time T11. In this case, the timing measurement unit 164 finishes counting at the time T10. The timing measurement unit 164 outputs the current count value as a digital output Do1.

Since the second analog signal contains the variation component DELTA V and the signal component Vsig, the column A/D conversion unit 151 performs A/D conversion on the second analog signal to produce a digital value, and subtracts the previously determined digital value of the first analog signal from the produced digital value to obtain a digital value corresponding to the signal component Vsig.

During this period (from the time T9 to the time T11), the reference voltage generation unit 132 also scans the reference voltage Vref2 in steps of the gradation precision D2 in a high to low direction (or the comparison direction) (that is, scans the voltage from the dark side to the bright side). In FIG. 9, however, the amplitude of the second analog signal is small. Thus, the reference voltage Vref2 is not supplied to the comparison unit 162 (or is not compared with the second analog signal) under control of the switching unit 161.

Next, an example of A/D conversion when the incident light intensity is high, that is, when the amplitude of the second analog signal is large, will be described with reference to a timing chart illustrated in FIG. 10.

Figure 10:
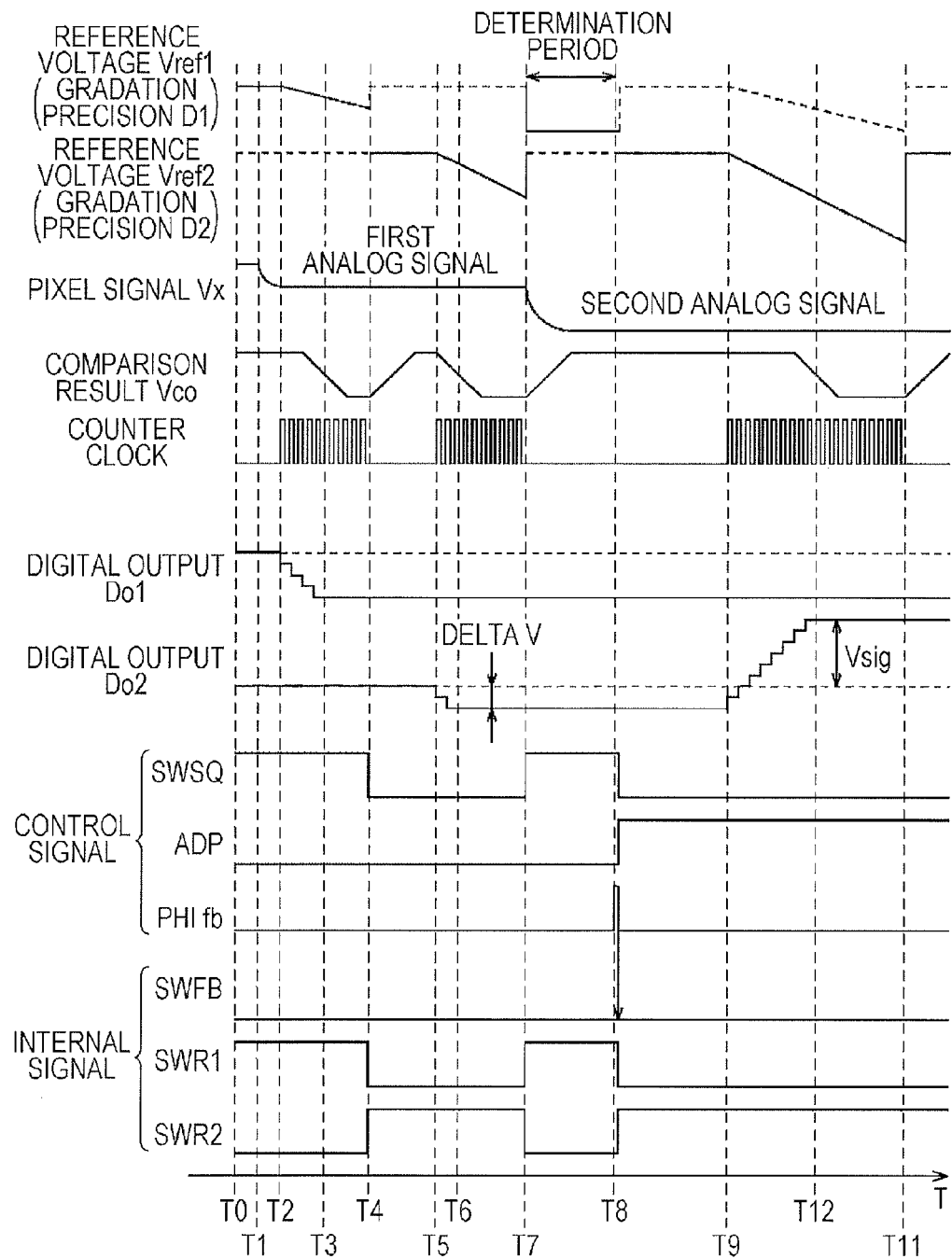
FIG. 10 is a timing chart illustrating an example of A/D conversion.

Also in FIG. 10, the comparison between the first analog signal and the reference voltages is performed in a manner similar to that described above with reference to FIG. 9. That is, the reference voltages (Vref1 and Vref2) are sequentially compared with the first analog signal.

The comparison between the second analog signal and the reference voltage Vref1 set to a predetermined determination value less than or equal to the maximum amplitude with respect to the second analog signal is also performed in a manner similar to that illustrated in FIG. 9. That is, the process during a period from time T0 to time T8 is performed in a manner similar to that illustrated in FIG. 9.

However, in the example illustrated in FIG. 10, since the amplitude of the second analog signal is large, the second analog signal is compared with the reference voltage Vref2. In the example illustrated in FIG. 10, the signal SWFB is still at the low level after the time T8.

When the comparison result Vco is captured, the control signal ADP transitions to the high level. On the basis of the signal SWFB, the control signal SWR1 becomes the low level and the control signal SWR2 becomes the high level. That is, as described above, the reference voltage Vref2 is selected.

At time T9, the reference voltage generation unit 132 starts the voltage scanning of the reference voltage Vref2. The reference voltage generation unit 132 scans the reference voltage Vref2 in steps of the gradation precision D2 in a high to low direction (or the comparison direction) (that is, scans the voltage from the dark side to the bright side). This scanning continues until time T11.

During this period, the comparison unit 162 compares the pixel signal Vx (second analog signal) with the reference voltage Vref2. The timing measurement unit 164 starts to count the clocks of the counter at the time T9. This counting continues until the comparison result Vco of comparison between the pixel signal Vx (second analog signal) and the reference voltage Vref2 changes or until the time T11 has been reached.

It is assumed that the comparison result Vco changes at time T12 prior to the time T11. In this case, the timing measurement unit 164 finishes counting at the time T12. The timing measurement unit 164 outputs the current count value as a digital output Do2.

Through the process described above, the column A/D conversion unit 151 subtracts the previously determined digital value of the first analog signal from the digital value of the second analog signal to obtain a digital value corresponding to the signal component Vsig.

During this period (from the time T9 to the time T11), the reference voltage generation unit 131 also scans the reference voltage Vref1 in steps of the gradation precision D1 in a high to low direction (or the comparison direction) (that is, scans the voltage from the dark side to the bright side). In FIG. 10, however, the amplitude of the second analog signal is large. Thus, the reference voltage Vref1 is not supplied to the comparison unit 162 (or is not compared with the second analog signal) under control of the switching unit 161.

Further, the timing measurement unit 164 may have a counter capable of counting up and down in a switchable manner, and may be configured to perform A/D conversion on the first analog signal and the second analog signal in different counting directions. This may allow the subtraction of the variation component DELTA V to be performed simultaneously with A/D conversion. Further, A/D of conversion results obtained through a plurality of levels of gradation precision for the first analog signal may be held in separate timing measurement units. In this case, by using the value of the signal SWFB indicating a determination result, it is possible to easily determine which timing measurement unit to use to subtract the second analog signal.

Accordingly, the column A/D conversion unit 151 may suppress, or at least reduce, the occurrence of errors in A/D conversion. In addition, the A/D conversion unit 112 including the column A/D conversion unit 151, and the CMOS image sensor 100 may also suppress, or at least reduce, the occurrence of errors in A/D conversion. The scanning directions (comparison directions) of the reference voltage Vref1 and the reference voltage Vref2 are arbitrary. However, it is preferable that the scanning directions (comparison directions) of each reference voltage when the first analog signal is subjected to A/D conversion and when the second analog signal is subjected to A/D conversion be the same in order to facilitate the calculation of the signal component Vsig.

<Other Example of Timing Chart>

In the examples illustrated in FIGS. 9 and 10 described above, the first analog signal is subjected to A/D conversion a plurality of times with different levels of gradation precision. In this case, the comparison result Vco that transitions in each A/D conversion operation is cause to transition again before the next A/D conversion operation starts. For this reason, a settling period of time occurs between a plurality of A/D conversion operations. In other words, an unnecessary standby period occurs, and the processing time for A/D conversion may become undesirably long (the A/D conversion speed may be reduced).

Figure 11:
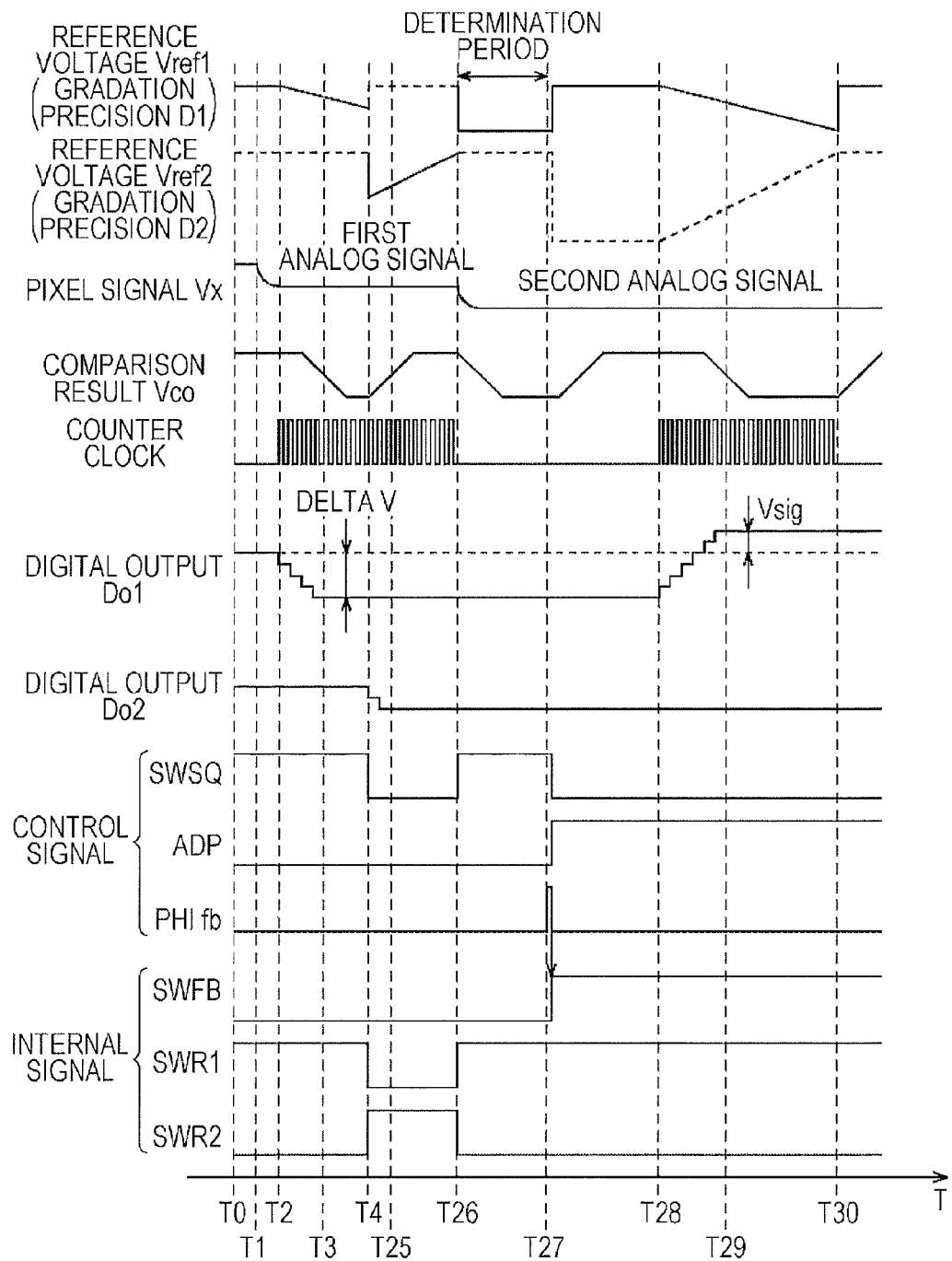
FIG. 11 is a timing chart illustrating an example of A/D conversion.
Figure 12:
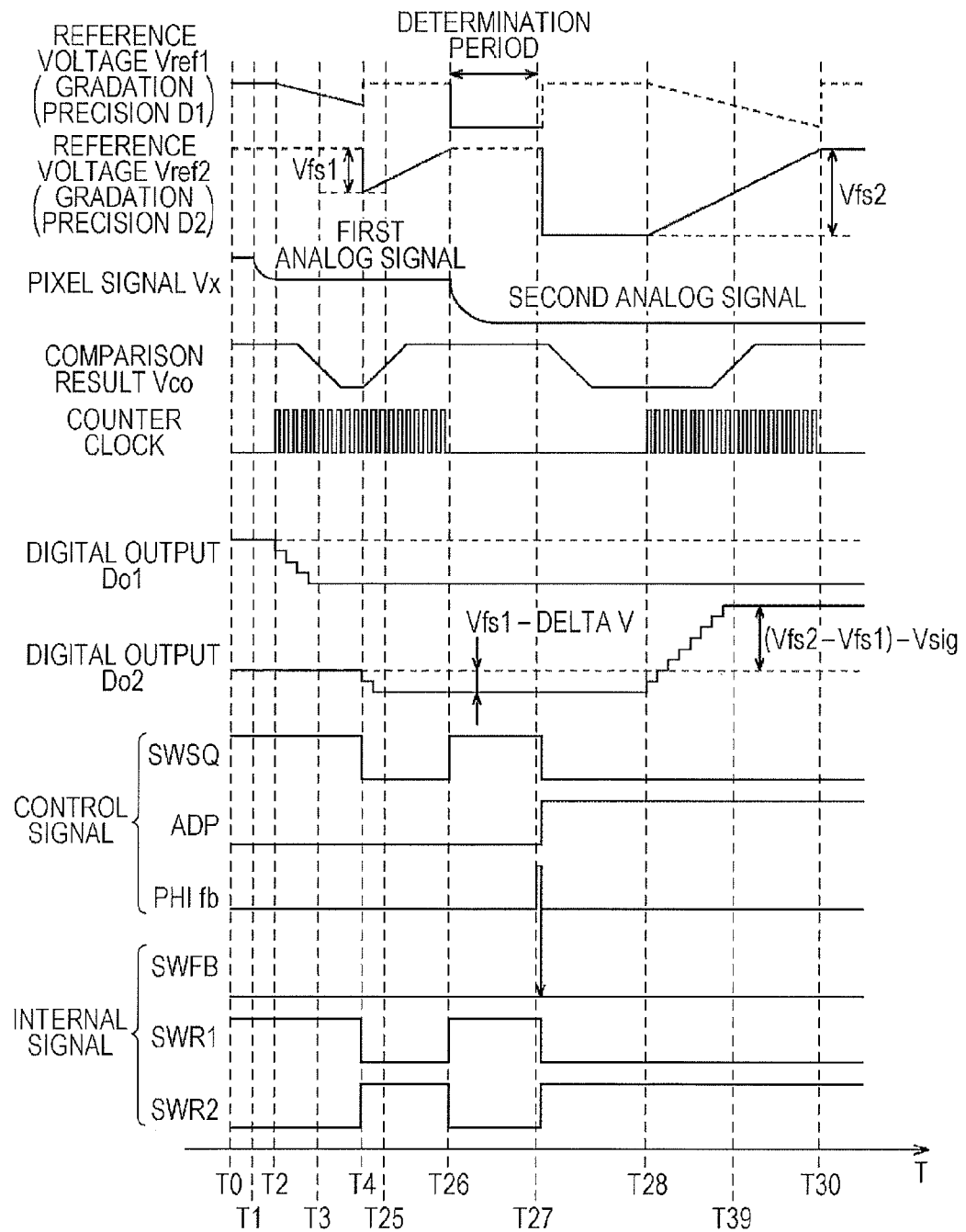
FIG. 12 is a timing chart illustrating an example of A/D conversion.

Accordingly, as illustrated in FIGS. 11 and 12, the voltage scanning directions of the reference voltages Vref1 and Vref2 with different levels of gradation precision may sequentially alternate. This can prevent the transition of the comparison result Vco during a period from the time when the comparison between the reference voltage Vref1 and the first analog signal is completed to the time when the comparison between the reference voltage Vref2 and the first analog signal begins. Thus, the column A/D conversion unit 151 can suppress the occurrence of the settling period of time, thus achieving high-speed A/D conversion processing.

FIG. 11 is a timing chart when the incident light intensity is low, that is, when the amplitude of the second analog signal is small. FIG. 12 is a timing chart when the incident light intensity is high, that is, when the amplitude of the second analog signal is large.

Since it is not necessary for the value of the comparison result Vco to transition, as illustrated in FIGS. 11 and 12, the comparison between the reference voltage Vref2 and the first analog signal can begin at the time T4. That is, compared to FIGS. 9 and 10, at least the settling period of time from the time T4 to the time T5 can be omitted.

In this case, as illustrated in FIGS. 11 and 12, the reference voltage generation unit 132 scans the reference voltage Vref2 in a low to high direction (or the comparison direction opposite to that for the reference voltage Vref1) (that is, scans the voltage from the bright side to the dark side). This scanning continues until time T26.

Further, it is assumed that the comparison result Vco changes at time T25 prior to the time T26. In this case, the timing measurement unit 164 finishes counting at the time T25. The timing measurement unit 164 outputs the current count value as a digital output Do2.

Also in FIGS. 11 and 12, the comparison between the predetermined determination value of the reference voltage Vref1 having a high level of gradation precision and the second analog signal is performed in a manner similar to that in FIGS. 9 and 10 (from the time T26 to the time T27).

The comparison between the second analog signal and the reference voltage to be scanned is also performed in a manner similar to that in FIGS. 9 and 10 (from time T28 to time T30). Note that the comparison directions of the reference voltages Vref1 and Vref2 when compared with the first analog signal are the same as those when compared with the second analog signal. For example, in the example illustrated in FIG. 11, when compared to the second analog signal, the reference voltage Vref1 is scanned in a high to low direction (that is, scanned from the dark side to the bright side), and the reference voltage Vref2 is scanned in a low to high direction (that is, scanned from the bright side to the dark side).

In the example illustrated in FIG. 11, it is assumed that the comparison result Vco changes at time T29 prior to time T30. In this case, the timing measurement unit 164 finishes counting at the time T29. The timing measurement unit 164 outputs the current count value as a digital output Do1. As in FIG. 9, the column A/D conversion unit 151 can easily obtain a digital value of the signal component Vsig.

In the example illustrated in FIG. 12, it is assumed that the comparison result Vco changes at time T39 prior to the time T30. In this case, the timing measurement unit 164 finishes counting at the time T39, and outputs the current count value as a digital output Do2.

As illustrated in FIG. 12, when the scanning direction of a reference voltage is opposite, the timing from when the scanning of the reference voltage begins to when the comparison result Vco changes is measured to obtain a digital value, given by Vfs1−DELTA V, for the first analog signal. A digital value, given by Vfs2−(Vsig+DELTA V), is obtained for the second analog signal. When subtraction is performed using an up/down counter, the final output is given by (Vfs2−Vfs1)−Vsig, where Vfs1 denotes the voltage amplitude of the reference voltage scanned with respect to the first analog signal and Vfs2 denotes the voltage amplitude of the reference voltage scanned with respect to the second analog signal, both amplitudes having already been obtained. Thus, the column A/D conversion unit 151 can easily calculate the signal component Vsig from the digital values described above.

<Still Other Example of Timing Chart>

In the example illustrated in FIGS. 11 and 12, the comparison result Vco transitions once after the determination period before the second analog signal is subjected to A/D conversion. This is because since the reference voltage Vref1 used for a second analog signal having a smaller amplitude (that is, darker) than a predetermined determination value is scanned from the dark side, the reference voltage exceeds the pixel signal Vx when changing from the predetermined determination value to the scan start value.

Similarly, the reference voltage Vref2 is scanned from the bright side with respect to a second analog signal having a larger amplitude (that is, bright) than the predetermined determination value. Since the reference voltage Vref2 exceeds the pixel signal Vx when changing from the predetermined determination value to the scan start value, the transition of the comparison result Vco occurs.

Therefore, the column A/D conversion unit 151 is allowed to start A/D conversion until the transition of the comparison result Vco is made stable.

Thus, the comparison direction (scanning direction) of each reference voltage is made opposite to that illustrated in FIGS. 11 and 12. That is, the reference voltage generation unit 131 is configured to scan the reference voltage Vref1 having a high level of gradation precision in a low to high direction (that is, from the bright side to the dark side). Further, the reference voltage generation unit 132 is configured to scan the reference voltage Vref2 having a low level of gradation precision in a high to low direction (that is, from the dark side to the bright side). This can prevent the transition of the comparison result Vco during a period after the determination period until the next A/D conversion operation. Therefore, the column A/D conversion unit 151 can achieve higher A/D conversion speed.

Figure 13:
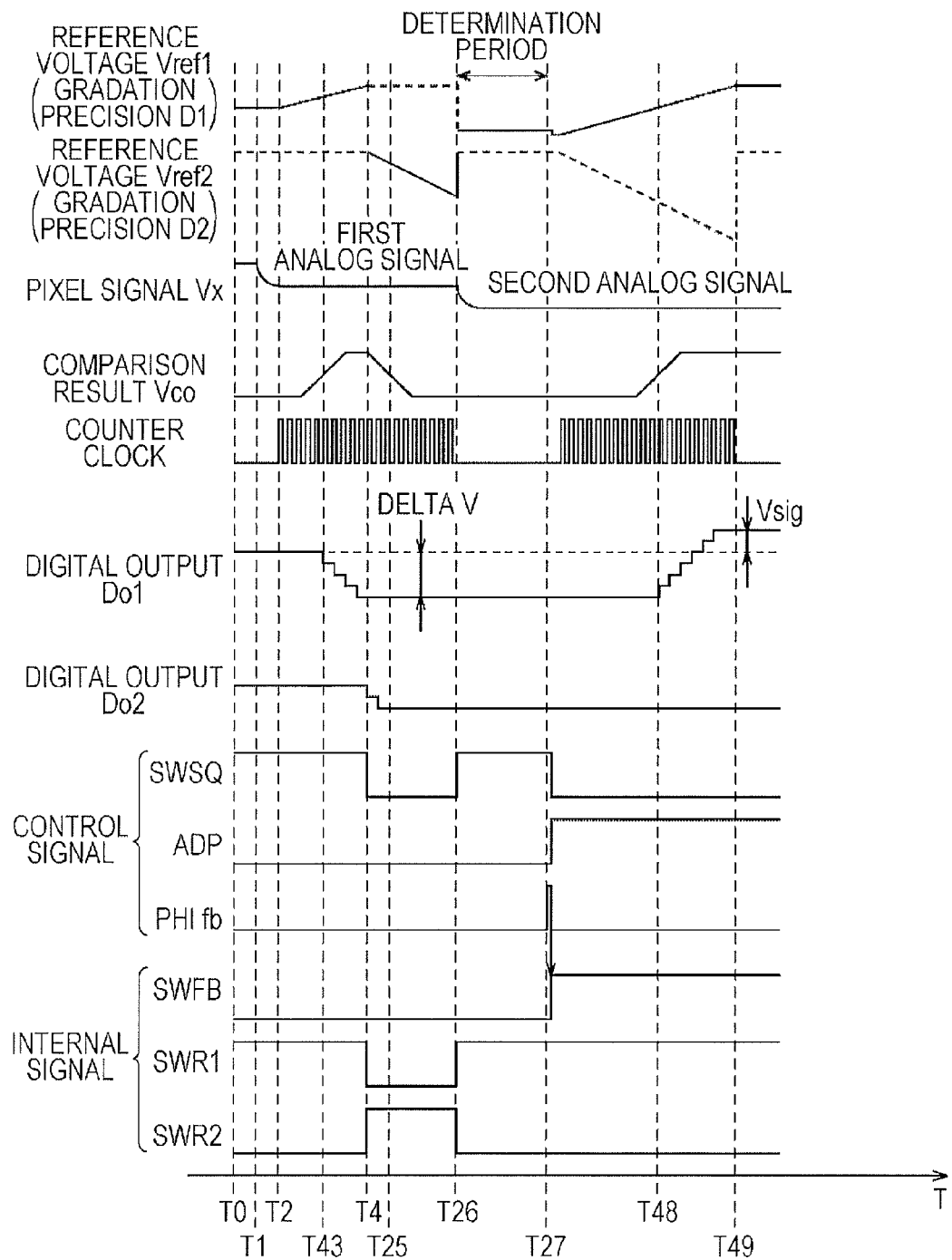
FIG. 13 is a timing chart illustrating an example of A/D conversion.
Figure 14:
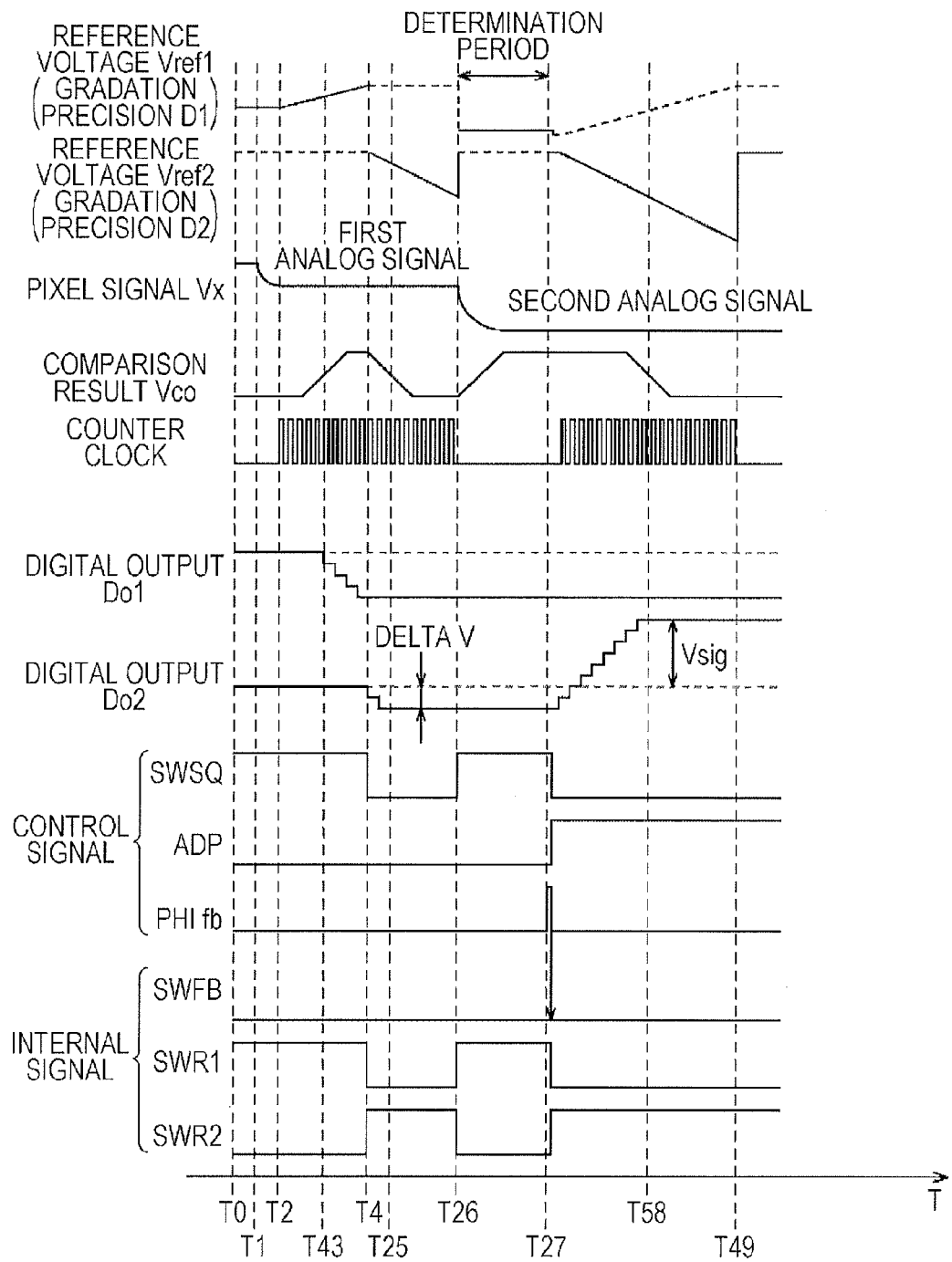
FIG. 14 is a timing chart illustrating an example of A/D conversion.

FIGS. 13 and 14 illustrate an example of a timing chart in the above case. FIG. 13 illustrates a timing chart when the incident light intensity is low, that is, when the amplitude of the second analog signal is small. FIG. 14 illustrates a timing chart when the incident light intensity is high, that is, when the amplitude of the second analog signal is large.

As illustrated in FIGS. 13 and 14, the scanning directions (comparison directions) of the reference voltage Vref1 and the reference voltage Vref2 are opposite to those in the example illustrated in FIGS. 11 and 12. Thus, when the second analog signal is subjected to A/D conversion, a pulse of the control signal PHI fb is generated after the determination period (time T27), and the reference voltage Vref1 and the reference voltage Vref2 can be scanned at the time when the control signal ADP transitions to the high level. That is, the comparison between the second analog signal and the reference voltage Vref1 or the reference voltage Vref2 can be performed from this point of time. Therefore, the column A/D conversion unit 151 can omit the settling period of time from the time T27 to the time T28 illustrated in FIGS. 11 and 12, and can achieve high A/D conversion speed.

In the example illustrated in FIGS. 11 and 12, when comparing the reference voltage Vref2 with the first analog signal or the second analog signal, like the reference voltage Vref1, the timing measurement unit 164 measures the length of the period from when scanning begins to when the comparison result Vco changes although the reference voltage Vref2 is scanned in a direction opposite to that of the reference voltage Vref1. This makes it difficult to directly obtain a digital value corresponding to the signal component Vsig.

However, as in the example illustrated in FIGS. 13 and 14, by measuring the period from the timing of change of the comparison result Vco to the timing at which the scanning of the reference voltages is completed, the timing measurement unit 164 can directly obtain a digital value corresponding to the signal component Vsig.

For example, in the example illustrated in FIG. 13, when comparing the reference voltage Vref1 with the first analog signal, the timing measurement unit 164 measures the period from time T43 at which the comparison result Vco changes to time T4 at which the scanning of the reference voltages is completed. Further, when comparing the reference voltage Vref1 with the second analog signal, the timing measurement unit 164 measures the period from time T48 at which the comparison result Vco changes to time T49 at which the scanning of the reference voltages is completed. Such measurement described above allows the timing measurement unit 164 to directly obtain a digital value corresponding to the signal component Vsig. Therefore, the timing measurement unit 164 can obtain the signal component Vsig as a digital output when performing subtraction using an up/down counter. In the example illustrated in FIGS. 11 and 12, the timing measurement unit 164 may perform counting for the reference voltage Vref2 in a manner similar to that described above.

<Other Examples of Selection Unit>

Meanwhile, the comparison result Vco obtained through the comparison with a predetermined determination value is held as SWFB by the selection unit 163 illustrated in FIG. 6, and is used to control the switching unit 161 to switch between reference voltages. The predetermined determination value is supplied from the reference voltage generation unit 131. Thus, when the reference voltage is switched by reflecting the comparison result Vco in SWFB, noise may occur in the reference voltage. As in the CMOS image sensor 100 illustrated in FIG. 5, in a case where the plurality of column A/D conversion units 151 use a common reference voltage, the timings at which the control signal PHI fb is supplied to the column A/D conversion units 151 may be shifted with respect to each other. In this case, one of the column A/D conversion units 151 for which the comparison result has been reflected may add noise to the reference voltage, and an error may be added to the comparison results of the other column A/D conversion units 151, resulting in a reference voltage being incorrectly selected.

Figure 15A:
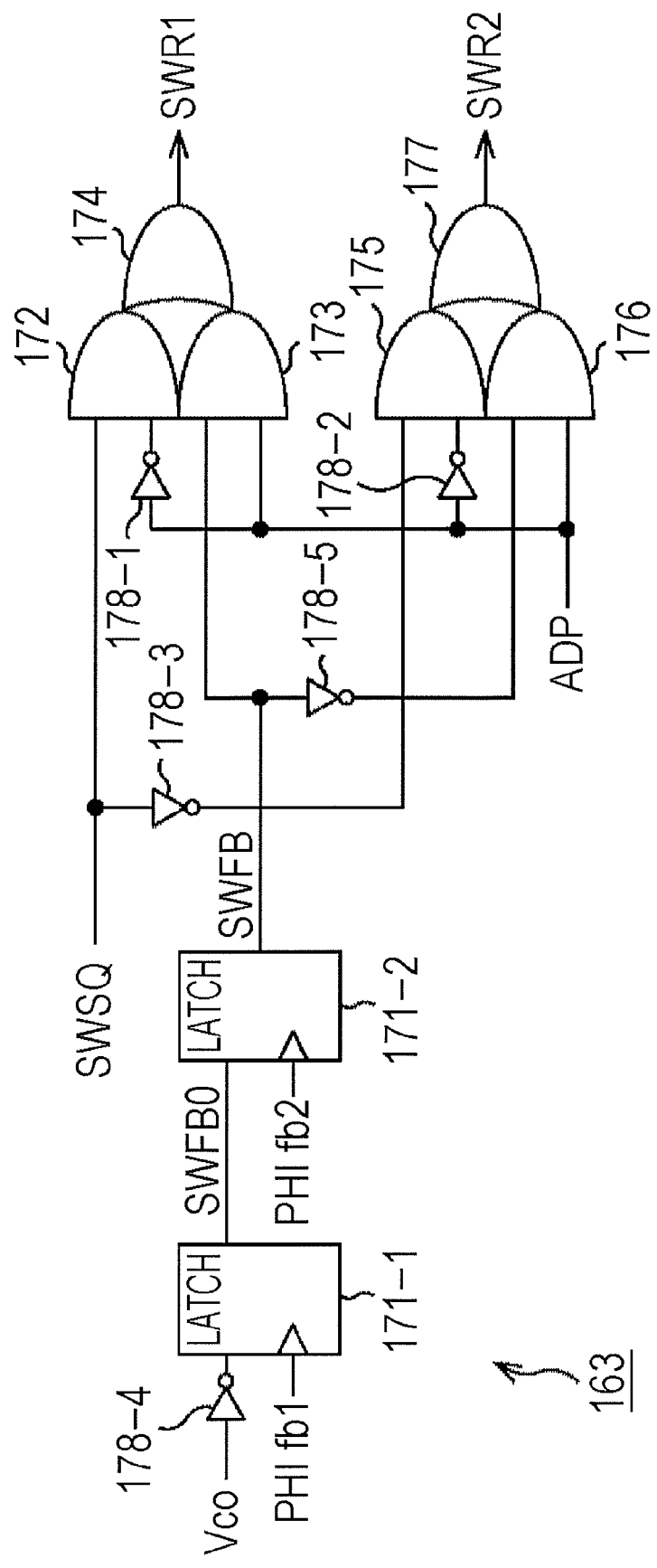
FIG. 15A is a diagram illustrating an example of a main configuration of a selection unit.

Accordingly, as illustrated in FIG. 15A, the selection unit 163 may be configured to hold the comparison result Vco in a two-phase operation using control signals PHI fb1 and PHI fb2. Comparison results to be reflected in SWFB for all the column A/D conversion units 151 are defined in response to the control signal PHI fb1, and then a reference voltage may be switched in response to the control signal PHI fb2.

FIG. 15A is a diagram illustrating an example of a main configuration of the selection unit 163. In FIG. 15A, the selection unit 163 includes a latch 171-1 and a latch 171-2 in place of the latch 171 having the configuration illustrated in FIG. 6. The latch 171-1 and the latch 171-2 are processing units similar to the latch 171 illustrated in FIG. 6. The latch 171-1 and the latch 171-2 will be referred to simply as latches 171 unless otherwise individually specified. The latch 171-1 holds the negation of the comparison result Vco at the timing controlled by the control signal PHI fb1, and outputs the value held therein as a signal SWFB0. The latch 171-2 holds the signal SWFB0 output from the latch 171-1 at the timing controlled by the control signal PHI fb2, and outputs the value held therein as a signal SWFB.

That is, as illustrated in a timing chart in FIG. 15B, the latch 171-1 holds the negation of the comparison result Vco, all the column A/D conversion units 151 hold the negation of the comparison result Vco, and then the latch 171-2 holds the negation of the held comparison result Vco. That is, the value of the signal SWFB is defined. Thus, the CMOS image sensor 100 can reduce the influence of a reference voltage selected by one of the column A/D conversion units 151 on the selection of a reference voltage by another column A/D conversion unit 151.

Figure 17:
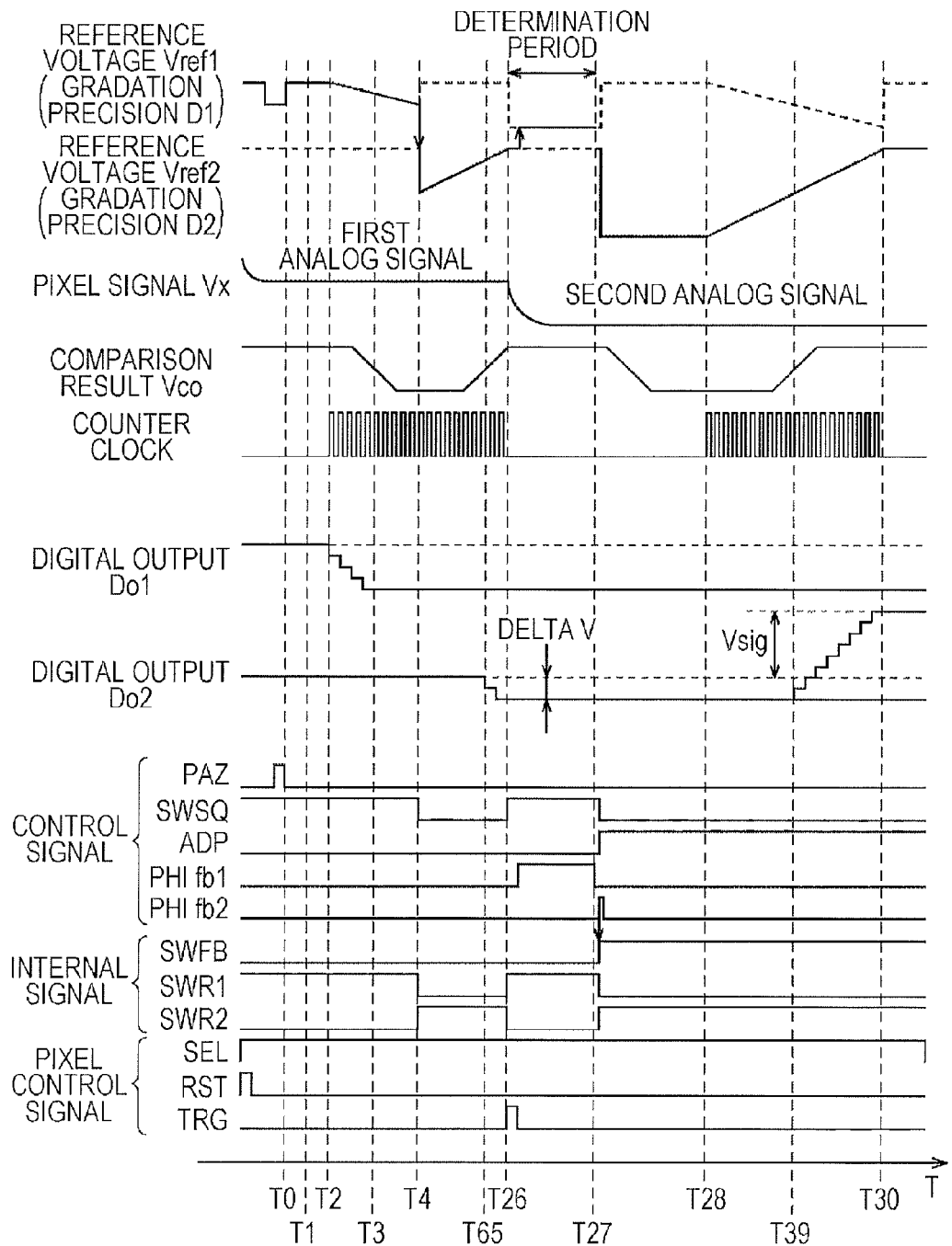
FIG. 17 is a timing chart illustrating an example of A/D conversion.

FIGS. 16 and 17 are timing charts illustrating an example of A/D conversion performed by the CMOS image sensor 100 illustrated in FIG. 5 when the CMOS image sensor 100 includes the selection unit 163 described above, the unit pixel 141 illustrated in FIG. 7, and the comparison unit 162 illustrated in FIG. 8. FIG. 16 is a timing chart when the incident light intensity is low, that is, when the amplitude of the second analog signal is small. FIG. 17 is a timing chart when the incident light intensity is high, that is, when the amplitude of the second analog signal is large.

The comparison directions (scanning directions) of the reference voltage Vref1 and the reference voltage Vref2 are similar to those in FIGS. 11 and 12. In the example illustrated in FIG. 17, however, as described in the previous Still Other Example of Timing Chart section, the timing measurement unit 164 measures the period from the timing of change of the comparison result Vco to the timing of completion of the scanning of the reference voltages for the reference voltage Vref2. Thus, the timing measurement unit 164 can directly obtain a digital value corresponding to the signal component Vsig.

<Other Example of CMOS Image Sensor of First Embodiment>

Figure 18:
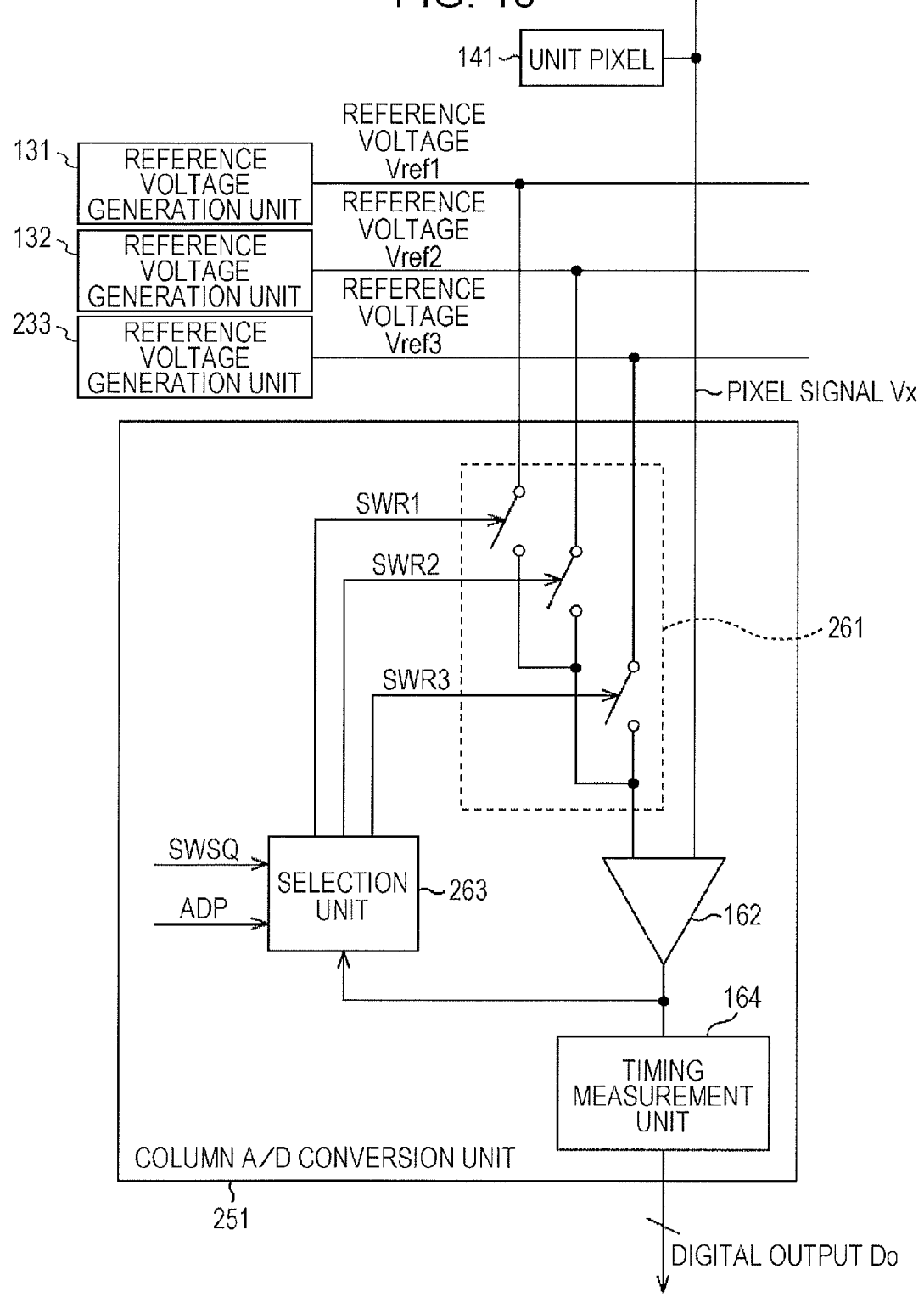
FIG. 18 is a diagram illustrating an example of a main configuration of part of a CMOS image sensor.

The number of levels of gradation precision to be applied may be three or more. FIG. 18 is a diagram illustrating an example of a main configuration of part of the CMOS image sensor 100 using three levels of gradation precision.

As illustrated in FIG. 18, the CMOS image sensor 100 includes a reference voltage generation unit 233 in addition to the reference voltage generation unit 131 and the reference voltage generation unit 132. The reference voltage generation unit 233, which is a processing unit similar to the reference voltage generation unit 131 and the reference voltage generation unit 132, generates a reference voltage Vref3 scanned with gradation precision D3 having a level different from those of the reference voltage Vref1 and the reference voltage Vref2.

The CMOS image sensor 100 includes a column A/D conversion unit 251 in place of the column A/D conversion unit 151. The column A/D conversion unit 251 has basically a configuration similar to that of the column A/D conversion unit 151, and performs processing similar to that of the column A/D conversion unit 151, except that the column A/D conversion unit 251 performs A/D conversion on a pixel signal Vx using three reference voltages (reference voltage Vref1, reference voltage Vref2, and reference voltage Vref3). Specifically, the column A/D conversion unit 251 includes a switching unit 261 in place of the switching unit 161, and a selection unit 263 in place of the selection unit 163.

As illustrated in FIG. 18, the switching unit 261 has a switch that connects one of the reference voltage generation units 131, 132, and 233 to the comparison unit 162 under control of the selection unit 263, and that disconnects the remaining reference voltage generation units from the comparison unit 162. Specifically, the switching unit 261 supplies one of the reference voltages Vref1 to Vref3 to the comparison unit 162 in accordance with control signals SWR1 to SWR3 supplied from the selection unit 263.

The selection unit 263 selects the reference voltage to be supplied to the comparison unit 162 in accordance with control of the A/D conversion control unit 110. A control signal ADP and a control signal SWSQ are supplied to the selection unit 263 from the A/D conversion control unit 110. The selection unit 263 selects one of the reference voltages Vref1 to Vref3 at the timing based on the values of the control signal ADP and the control signal SWSQ in accordance with a comparison result Vco supplied from the comparison unit 162. The selection unit 263 determines the values of the control signals SWR1 to SWR3 so that the switching unit 261 can supply the selected reference voltage to the comparison unit 162, and supplies the control signals SWR1 to SWR3 to the switching unit 261.

Figure 19:
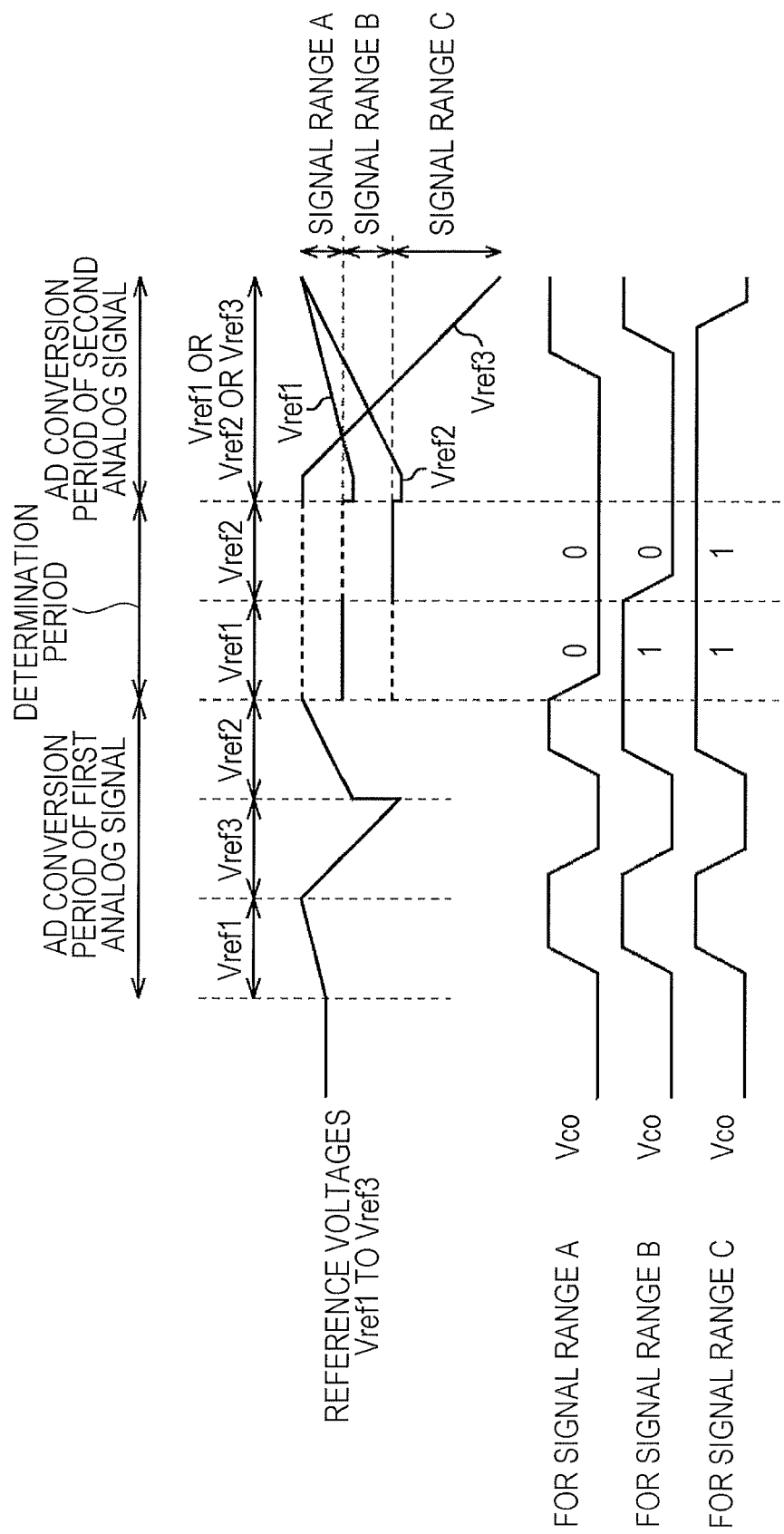
FIG. 19 is a timing chart illustrating an example of A/D conversion.

FIG. 19 is a timing chart illustrating an example of A/D conversion in this case.

In FIG. 19, for ease of illustration, the reference voltages Vref1 to Vref3 are collectively illustrated as one. The reference voltage Vref1 with the highest level of gradation precision is scanned from the bright side to the dark side, and the reference voltage Vref3 with the lowest level of gradation precision is scanned from the dark side to the bright side. The scanning of the intermediate reference voltage, namely, the reference voltage Vref2, is set from the bright side to the dark side so that the scanning direction sequentially alternates during the A/D conversion period of the first analog signal.

Since a reference voltage with a higher level of gradation precision is used as a predetermined determination value during the determination period, the boundary between the reference voltage Vref1 and the reference voltage Vref2 is determined using the reference voltage Vref1, and the boundary between the reference voltage Vref2 and the reference voltage Vref3 is determined using the reference voltage Vref2. If comparison results Vco obtained through determination performed twice are "0, 0", the second analog signal is in a signal range A, and therefore the reference voltage Vref1 is used. If the comparison results Vco are "1, 0", the second analog signal is a signal range B, and therefore the reference voltage Vref2 is used. If the comparison results Vco are "1, 1", the second analog signal is a signal range C, and therefore the reference voltage Vref3 is used. Here, in each reference voltage, the same scanning direction as the scanning direction applied to the first analog signal is also applied to the second analog signal. One of the reference voltages Vref1 to Vref3 is applied to the second analog signal in accordance with the determined signal range. As illustrated in FIG. 19, it is not necessary for the comparison result Vco to transition within a period after the determination period and before A/D conversion, and a high-speed operation can be achieved.

In the high-speed operation, the scanning direction of the intermediate reference voltage, namely, the reference voltage Vref2, is arbitrary. For example, if it is necessary to scan the reference voltage Vref2 in a direction opposite to that illustrated in FIG. 19 (from the dark side to the bright side), the reference voltages are applied in the order of Vref2, Vref1, and Vref3 during the A/D conversion period of the first analog signal, thus allowing the reference voltages to sequentially alternate. In addition, the predetermined determination value is applied to the reference voltages in the order of Vref2 and Vref1 during the determination period, thus preventing an increase in the number of times the comparison result Vco transitions even if the scanning direction of the reference voltage Vref2 is opposite (to that illustrated in FIG. 19).

Accordingly, A/D conversion is applied with levels of gradation precision in accordance with the pixel output level, thus achieving a high-speed and low-power consumption AD conversion operation while applying a high level of gradation precision to a low-output region having a low noise level. In particular, an increase in the area of an additional circuit for determining an output level can be prevented, and an increase in AD conversion period caused by the increase in the voltage range of the reference voltage due to a determination error can be prevented. In addition, a settling period of time between AD conversion operations when a plurality of reference voltages having different levels of gradation precision are applied can be reduced, resulting in high AD conversion speed.

<Second Embodiment>
<Distributed Constant Circuits>

Figure 20:
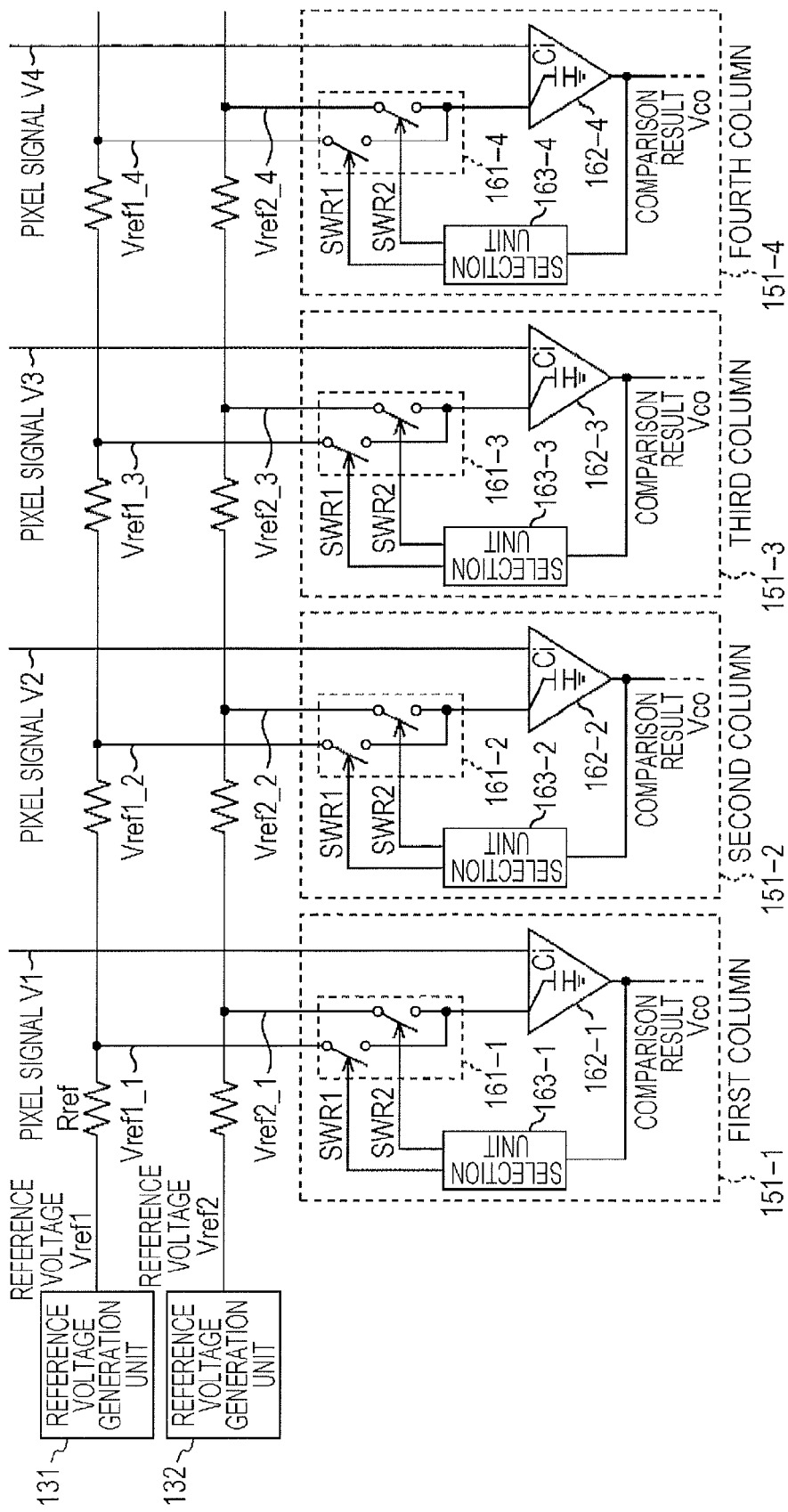
FIG. 20 is a diagram illustrating an example of a main configuration of part of a CMOS image sensor.

As described above in the first embodiment, in the CMOS image sensor 100, the reference voltage Vref1 and the reference voltage Vref2 are connected to a plurality of column A/D conversion units 151. For example, as illustrated in FIG. 20, four column A/D conversion units 151 (column A/D conversion units 151-1, 151-2, 151-3, and 151-4) are arranged in parallel.

In the illustrated arrangement, parasitic resistors Rref are added to lines connected from the reference voltage generation unit 131 or the reference voltage generation unit 132 to the individual column A/D conversion units 151. Further, in the column A/D conversion units 151, parasitic capacitors such as input capacitors Ci in comparison units 162-1 to 162-4 are added as distributed constant circuits.

Figure 21:
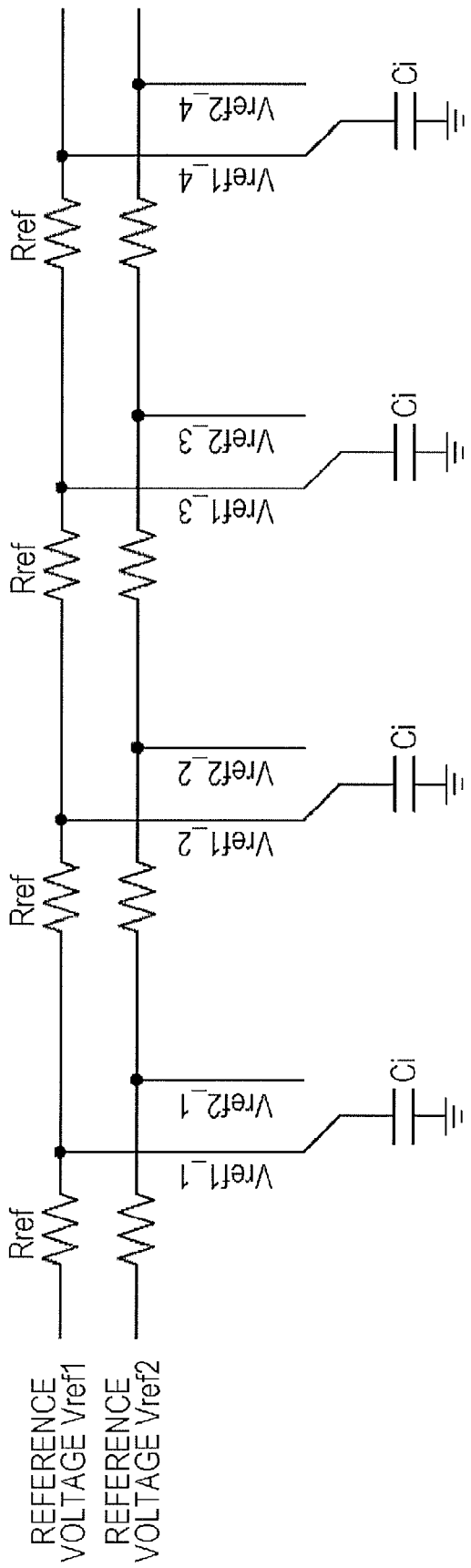
FIG. 21 is a diagram illustrating an example of a distributed constant circuit.

In order to compare the first analog signal with the reference voltage Vref1, a distributed constant circuit illustrated in FIG. 21 may be used. In order to compare the first analog signal with the reference voltage Vref2, a distributed constant circuit illustrated in FIG. 22 may be used. In the illustrated cases, all the column A/D conversion units 151 are connected to one of the reference voltage Vref1 and the reference voltage Vref2.

Meanwhile, for example, when all the second analog signals are within an output range where A/D conversion is performed using the reference voltage Vref1, the connection state illustrated in FIG. 21 is obtained, and the same distributed constant circuit as that when the first analog signal is subjected to A/D conversion using the reference voltage Vref1 is obtained.

Figure 23:
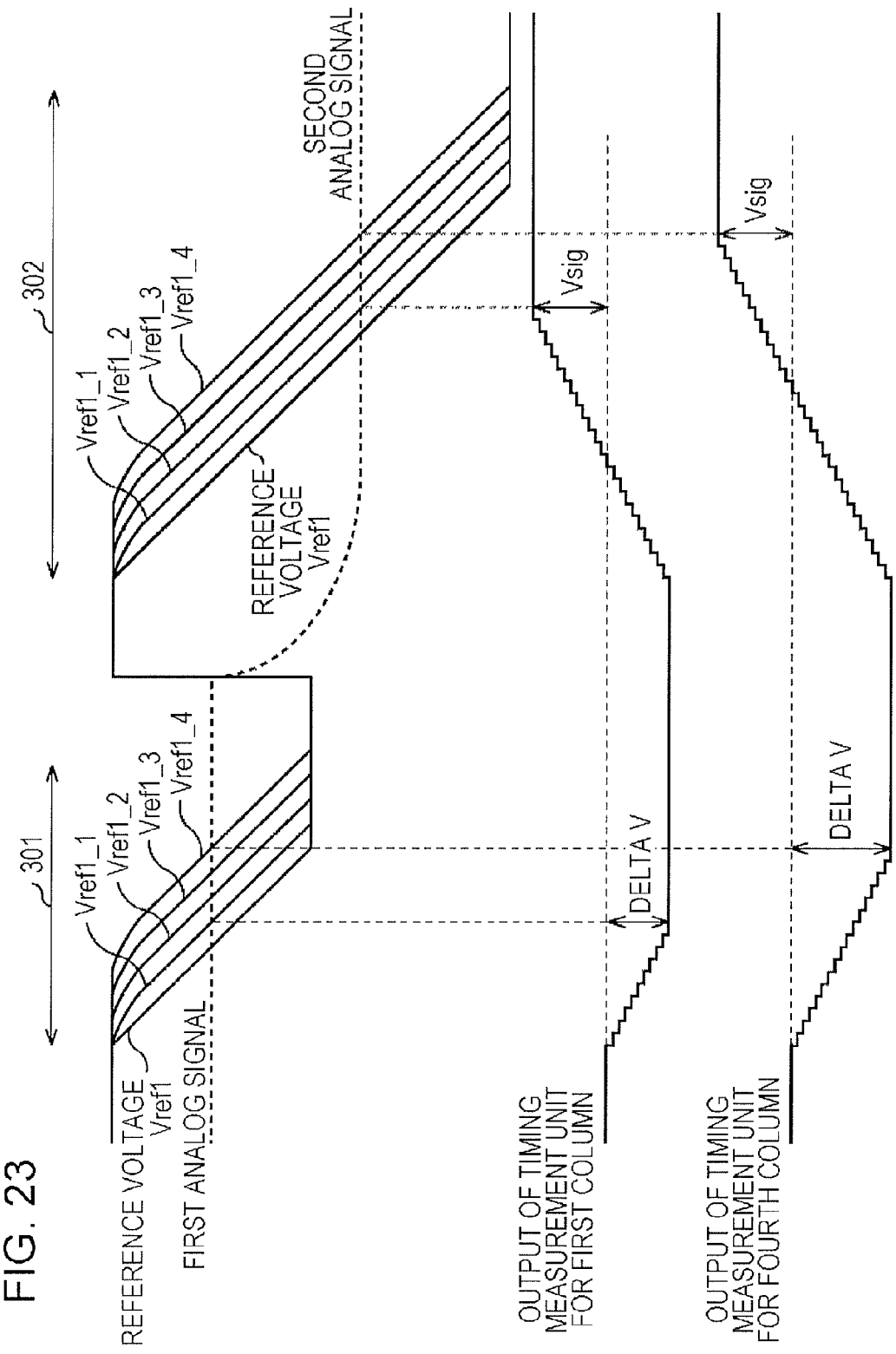
FIG. 23 is a timing chart illustrating an example of A/D conversion.

Thus, as illustrated in FIG. 23, even if variations in delay occur in the reference voltage Vref1 for the first to fourth columns due to the parasitic resistors and the parasitic capacitors, such as Vref1_1, Vref1_2, Vref1_3, and Vref1_4, delays at individual nodes in the A/D conversion the first analog signal and in the A/D conversion of the second analog signal (delays in the period indicated by a double-sided arrow 301 and delays in the period indicated by a double-sided arrow 302 for the respective columns) are the same. Thus, digital values corresponding to the signal components Vsig are correctly output as the result of A/D conversion. In FIG. 23, for ease of illustration, the illustration of the A/D conversion period of the first analog signal with the reference voltage Vref2 and the brightness determination period is omitted.

Figure 22:
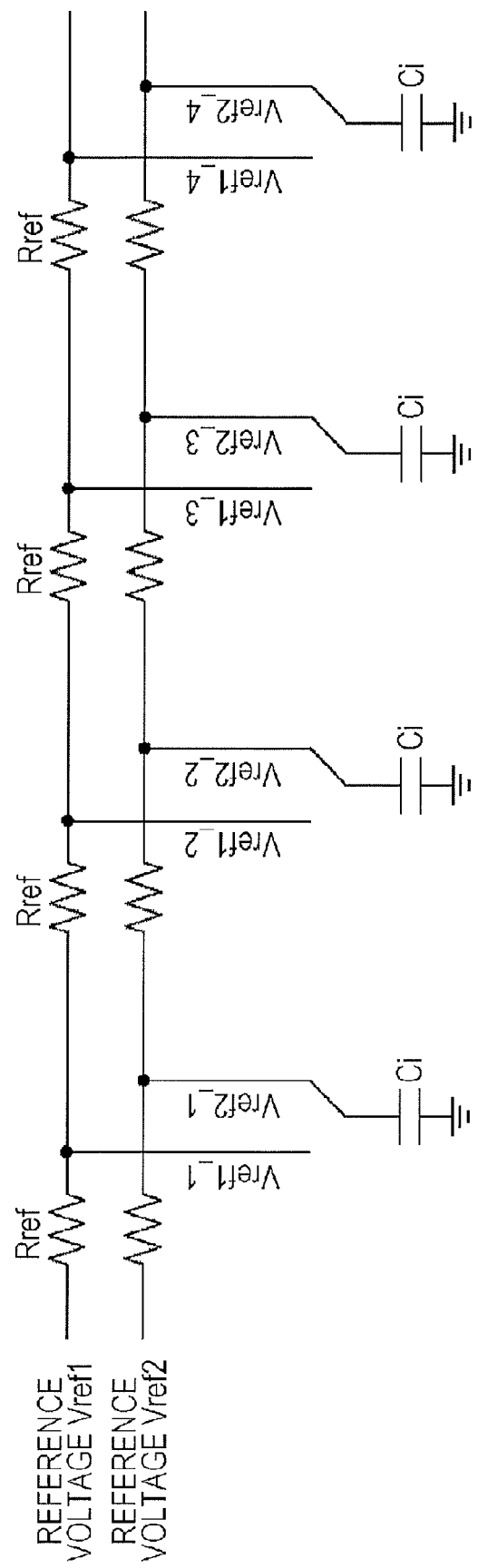
FIG. 22 is a diagram illustrating an example of a distributed constant circuit.

The same applies to the case where all the second analog signals are within an output range where A/D conversion is performed using the reference voltage Vref2. Since the distributed constant circuit illustrated in FIG. 22 is used for the A/D conversion period of the second analog signal, a delay at each node Vref2_x matches that at the corresponding node in the AD conversion period of the first analog signal, and the signal component Vsig is correctly converted into a digital signal.

For the second analog signal, however, in some cases, the voltage ranges of second analog signals V1 to V4 for the respective columns include the A/D conversion range for the reference voltage Vref1 and the A/D conversion range for the reference voltage Vref2, that is, large and small voltages may be contained for a predetermined determination value. In such cases, the reference voltage Vref1 or the reference voltage Vref2 is selected in accordance with a determination result of the column A/D conversion unit 151 for each column.

For example, it is assumed that the second analog signal V1 for the first column and the second analog signal V4 for the fourth column have a signal amplitude smaller than a predetermined determination value, and the second analog signal V2 for the second column and the second analog signal V3 for the third column have a signal amplitude larger than the predetermined determination value. In this case, the reference voltage Vref1 is employed for the first and fourth columns, and the reference voltage Vref2 is employed for the second and third columns.

Figure 24:
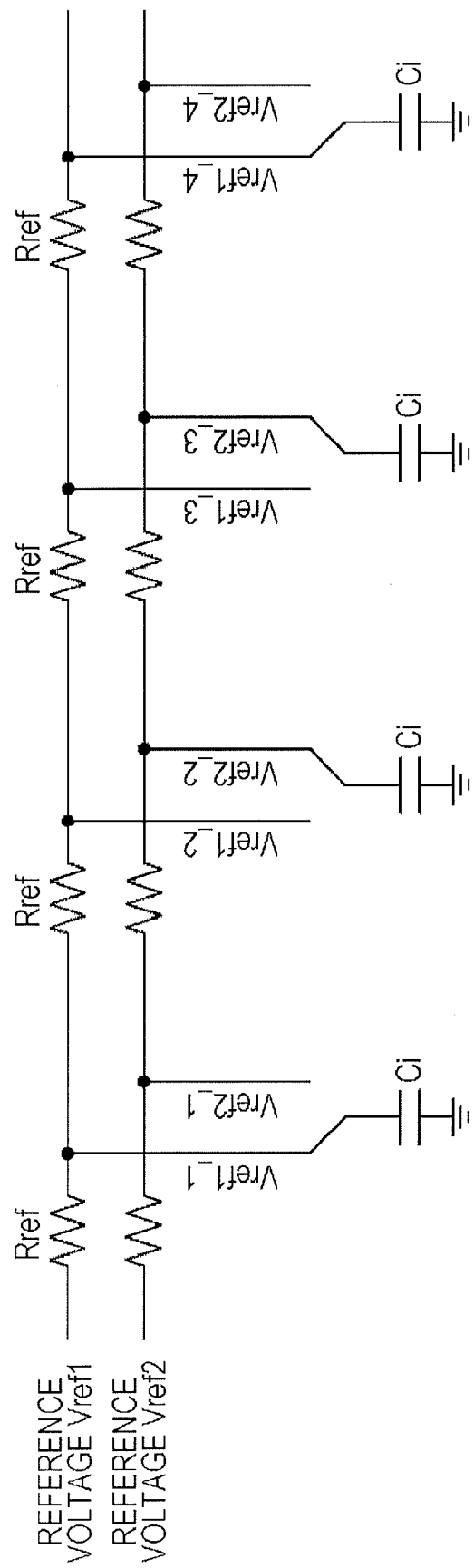
FIG. 24 is a diagram illustrating an example of a distributed constant circuit.

In this case, a distributed constant circuit illustrated in FIG. 24 is used. The illustrated distributed constant circuit is different from that in the example illustrated in FIG. 21 or in the example illustrated in FIG. 22.

Figure 25:
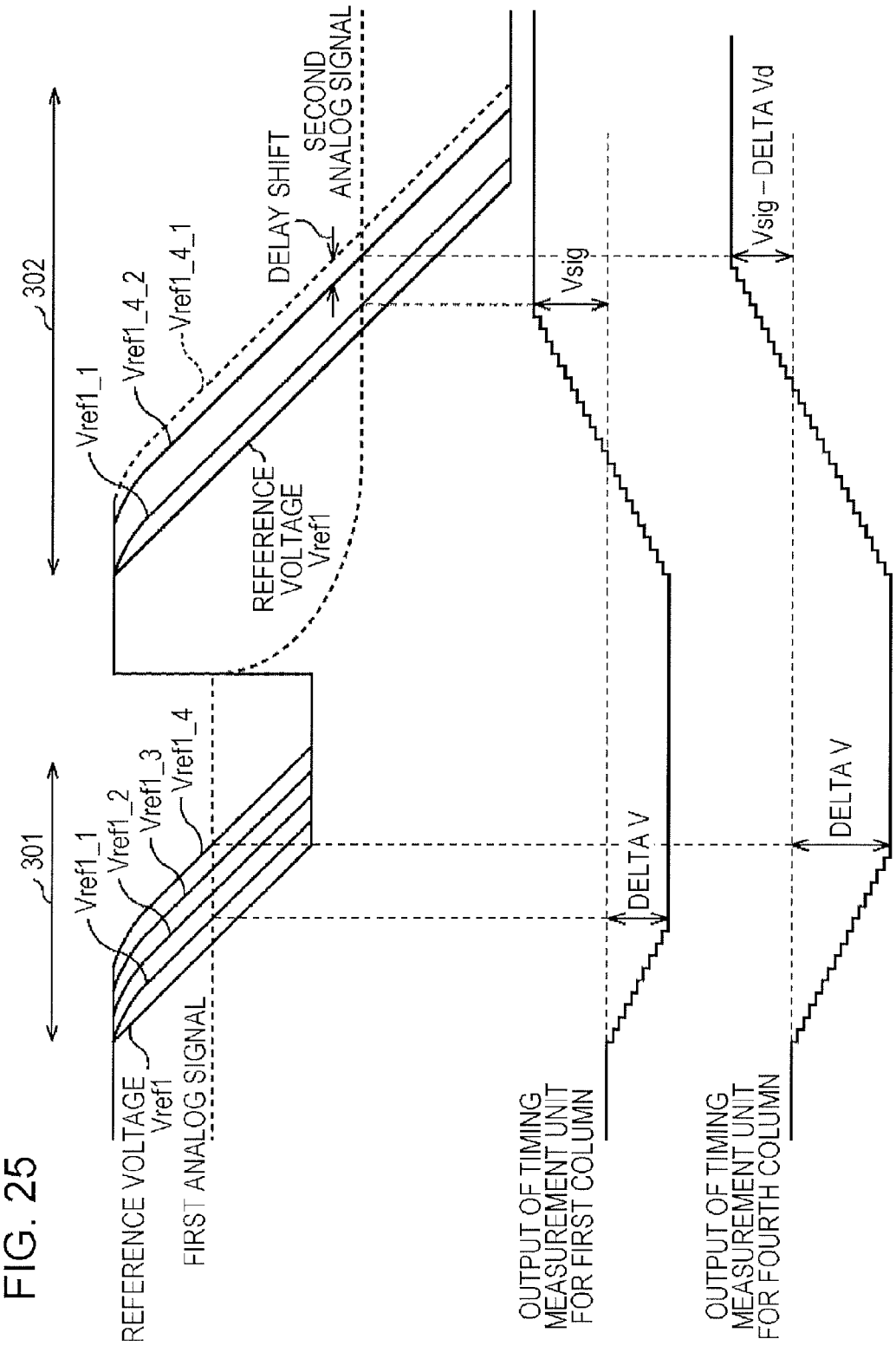
FIG. 25 is a timing chart illustrating an example of A/D conversion.

In the example illustrated in FIG. 24, focusing on the reference voltage Vref1, as illustrated in FIG. 25, the delays of the reference voltages Vref1_x for the respective columns differ between the period indicated by the double-sided arrow 301 and the period indicated by the double-sided arrow 302. Particularly, the reference voltage Vref1_4 for the fourth column, which is located at a position distant from the reference voltage generation unit 131 and the reference voltage generation unit 132, has a small delay because a reduced load. Thus, the output value of the reference voltage Vref1_4 for the fourth column has an error of DELTA Vd, which corresponds to the amount by which the delay is reduced, with respect to the signal component Vsig obtained with the reference voltage Vref1_1 for the first column.

Actually, the reference voltage Vref1_1 for the first column also has a smaller delay than that in FIG. 23, and has an error with respect to the signal component Vsig. The error of the reference voltage Vref1_1 for the first column is smaller than that of the reference voltage Vref1_4 for the fourth column. Thus, in FIG. 25, for ease of illustration, the illustration of the error of the reference voltage Vref1_1 for the first column is omitted. Further, although the waveforms of the reference voltage Vref1_2 for the second column and the reference voltage Vref1_3 for the third column in the period indicated by the double-sided arrow 302 are not illustrated in FIG. 25, the reference voltage Vref1_2 for the second column and the reference voltage Vref1_3 for the third column also have a small delay like the reference voltage Vref1_4 for the fourth column, resulting in timings being shifted. The same applies to the reference voltage Vref2.

The error may vary in accordance with the ratio and positional distribution at which the plurality of second analog signals are included in a voltage range assigned different levels of gradation precision. Thus, it is not easy to correct such an error with the subsequent image processing, and the error may cause noise which degrades image quality.

<Improvement in Distributed Constant Circuits>

Accordingly, a signal processing device includes the following elements. A comparison unit is configured to compare an analog signal output from a unit pixel with a certain voltage. A switching unit is configured to switch a reference voltage to be supplied to the comparison unit, if necessary, and configured to connect one of a plurality of reference voltages having different levels of gradation precision to the comparison unit and connect the other reference voltages to a certain load capacitor. A measurement unit is configured to measure a timing of change of a comparison result of comparison by the comparison unit between the analog signal and a reference voltage supplied to the comparison unit under switching control of the switching unit.

Thus, the signal processing device can use similar distributed constant circuits for each column for the A/D conversion of the first analog signal and for the A/D conversion of the second analog signal. That is, for each column, a shift in the delay can be suppressed, or at least minimized, for the A/D conversion of the first analog signal and for the A/D conversion of the second analog signal, and the signal component Vsig can be more accurately acquired as a digital value. In other words, the occurrence of errors in A/D conversion can be suppressed or at least reduced.

The load capacitor may have a capacitance equivalent to or approximate to a capacitance of the comparison unit.

By making the load capacitor approach the equivalent capacitance of the comparison unit as much as possible, the signal processing device can more accurately align the delays for the respective columns, and can more accurately acquire the signal component Vsig as a digital value.

The signal processing device may further include a plurality of sets each including the comparison unit, the switching unit, and the measurement unit. In each of the plurality of sets, each of the plurality of reference voltages may be supplied to the switching unit via an amplification unit configured to amplify a signal level, and outputs of the amplification units may be connected to each other across the sets for each level of gradation precision.

The signal processing device includes a buffer, and supplies a reference voltage to the comparison unit via the buffer, thereby preventing propagation of noise generated in the comparison unit. The signal processing device further includes a common column line, thereby smoothing offset variations across the columns. Also in this case, the switching unit includes a load capacitor. Thus, the signal processing device can more accurately acquire the signal component Vsig as a digital value.

The signal processing device may further include a selection unit configured to select one of a plurality of reference voltages having different levels of gradation precision in accordance with a comparison result of comparison by the comparison unit between the analog signal and the at least one or more predetermined determination values, and the switching unit may control connection to the comparison unit or the load capacitor for each of the plurality of reference voltages in accordance with a selection result obtained by the selection unit.

Therefore, as described above in the first embodiment, the signal processing device can reduce the voltage range margin of a reference voltage, which affects the comparison precision of determination (offset error), and can achieve the advantages of high speed or low power consumption.

The predetermined determination value may be supplied from a reference voltage generation unit configured to supply a reference voltage having a high level of gradation precision among the plurality of reference voltages.

Thus, as described above in the first embodiment, the signal processing device can further reduce the voltage range margin of a reference voltage, which affects the comparison precision (offset error).

Further, the selection unit may select a reference voltage having a high level of gradation precision among the plurality of reference voltages when it is determined, as a result of comparison performed by the comparison unit, that the analog signal is smaller than the predetermined determination value, and select a reference voltage having a low level of gradation precision among the plurality of reference voltages when it is determined that the analog signal is larger than the predetermined determination value. The switching unit may connect the reference voltage selected by the selection unit to the comparison unit, and connects the other reference voltages to the load capacitor.

Thus, as described above in the first embodiment, the signal processing device can supply a predetermined determination value without increasing the number of circuits. In addition, the voltage setting error can also be canceled.

Further, the comparison unit may compare each of a first analog signal that is a noise signal of the unit pixel and a second analog signal that is a signal including data of the pixel with the reference voltage. The measurement unit may determine a difference between a measured timing of change of a comparison result of comparison by the comparison unit between the first analog signal and the reference voltage and a measured timing of change of a comparison result of comparison by the comparison unit between the second analog signal and the reference voltage.

Thus, as described above in the first embodiment, the signal processing device can perform subtraction processing for removing the variation component in the digital domain, and can prevent an increase in circuit scale or power consumption caused by the subtraction processing.

Further, the selection unit may sequentially select reference voltages for the first analog signal, the switching unit may connect the reference voltages selected by the selection unit to the comparison unit and connects the other reference voltages to the load capacitor, and the comparison unit may sequentially compare the first analog signal with each of the reference voltages in accordance with control of the switching unit. Further, the selection unit may select one of the plurality of reference voltages for the second analog signal in accordance with a comparison result of comparison by the comparison unit between the second analog signal and the at least one or more predetermined determination values, the switching unit may connect the reference voltage selected by the selection unit to the comparison unit and connects the other reference voltages to the load capacitor, and the comparison unit may compare the second analog signal with the reference voltage selected by the selection unit in accordance with control of the switching unit. The measurement unit may determine a difference between a measured timing of change of a comparison result of comparison between the second analog signal and the reference voltage selected by the selection unit and a measured timing of change of a comparison result of comparison between the first analog signal and the reference voltage selected by the selection unit.

Thus, as described above in the first embodiment, the signal processing device can perform A/D conversion on the second analog signal (signal component+variation component) at any level of gradation precision.

The signal processing device may further include a reference voltage supply unit configured to supply the plurality of reference voltages to the switching unit.

Thus, as described above in the first embodiment, the signal processing device can easily perform scanning control of reference voltages.

Further, the reference voltage supply unit may supply the plurality of reference voltages to the switching unit so that a voltage in a predetermined range is compared with the first analog signal and the second analog signal in a first comparison direction that is a direction in which the voltage increases from low to high or a second comparison direction that is a direction in which the voltage decreases from high to low. The switching unit may connect the reference voltage selected by the selection unit among the plurality of reference voltages supplied from the reference voltage supply unit to the comparison unit, and connect the other reference voltages to the load capacitor.

Thus, as described above in the first embodiment, the comparison unit can compare the first analog signal and the second analog signal with reference voltages of a voltage in a predetermined range.

Further, the reference voltage supply unit may supply the plurality of reference voltages to the switching unit so that the plurality of reference voltages are compared with the first analog signal in order of gradation precision in such a manner that each of the plurality of reference voltages is compared with the first analog signal in a comparison direction opposite to the comparison direction of a preceding reference voltage.

Thus, as described above in the first embodiment, the signal processing device can reduce the settling period of time between A/D conversion operations, and achieve a further increase in speed.

Further, the reference voltage supply unit may supply the reference voltage selected by the selection unit to the switching unit so that the reference voltage is compared with the second analog signal in the same comparison direction as a comparison direction in which the reference voltage is compared with the first analog signal.

Thus, as described above in the first embodiment, the signal processing device can achieve low-noise A/D conversion without impairing removal precision of the variation component (that is, the first analog signal) due to nonlinearity (or hysteresis) differing depending on the scanning direction of the reference voltage.

Further, the reference voltage supply unit may supply a reference voltage having the highest level of gradation precision among the plurality of reference voltages so that a voltage in the range is compared with the first analog signal and the second analog signal in the second comparison direction, and supply a reference voltage having the lowest level of gradation precision among the plurality of reference voltages so that a voltage in the range is compared with the first analog signal and the second analog signal in the first comparison direction.

Thus, as described above in the first embodiment, the signal processing device can perform A/D conversion on the second analog signal with the respective levels of gradation precision from the logical value to which the comparison unit transitions in the determination result of the predetermined voltage. Therefore, the signal processing device no longer waits for a period during which the comparison unit transitions before A/D conversion to make the logic stable and can therefore achieve a further increase in speed.

An embodiment of the present technology may also be implemented as a signal processing method for the signal processing device.

An embodiment may provide an imaging element including the following elements. A pixel array has unit pixels arranged thereon, each unit pixel including a photoelectric conversion element configured to perform photoelectric conversion on incident light. A comparison unit is configured to compare an analog signal output from a unit pixel in the pixel array with a certain voltage. A switching unit is configured to switch a reference voltage to be supplied to the comparison unit, and configured to connect one of a plurality of reference voltages having different levels of gradation precision to the comparison unit and connect the other reference voltages to a certain load capacitor. A measurement unit is configured to measure a timing of change of a comparison result of comparison by the comparison unit between the analog signal and a reference voltage supplied to the comparison unit under switching control of the switching unit.

An embodiment may further provide an imaging apparatus including the following elements. An imaging unit is configured to capture an image of a subject. An image processing unit is configured to perform image processing on image data obtained by capturing the image by using the imaging unit. The imaging unit includes the following elements. A pixel array has unit pixels arranged thereon, each unit pixel including a photoelectric conversion element configured to perform photoelectric conversion on incident light. A comparison unit is configured to compare an analog signal output from a unit pixel in the pixel array with a certain voltage. A switching unit is configured to switch a reference voltage to be supplied to the comparison unit, and configured to connect one of a plurality of reference voltages having different levels of gradation precision to the comparison unit and connect the other reference voltages to a certain load capacitor. A measurement unit is configured to measure a timing of change of a comparison result of comparison by the comparison unit between the analog signal and a reference voltage supplied to the comparison unit under switching control of the switching unit.

Therefore, an embodiment of the present technology may be implemented as a signal processing device or any apparatus configured to perform signal processing similar to that described above. Part or all the control processes may be implemented by software.

A more specific description will be given hereinafter.

<Other Example of Switching Unit>

Figure 26:
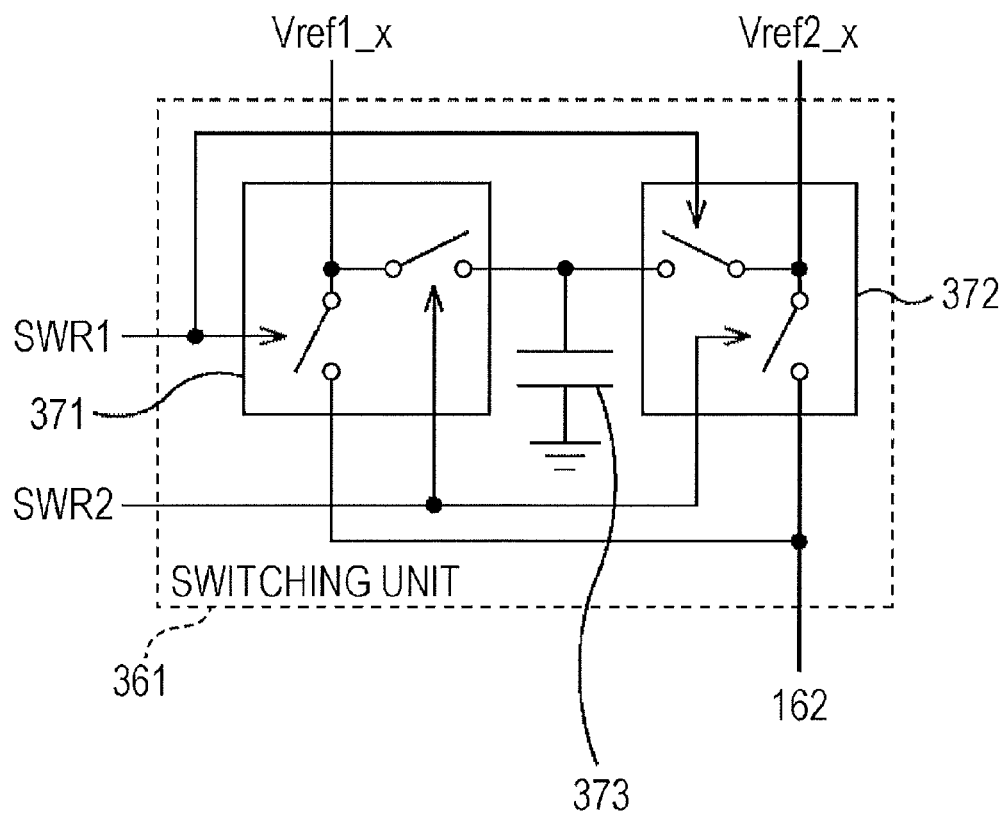
FIG. 26 is a diagram illustrating an example of a main configuration of a switching unit.

In order to use similar distributed constant circuits for the A/D conversion of the first analog signal and the A/D conversion of the second analog signal for each column, for example, the CMOS image sensor 100 illustrated in FIG. 5 includes a switching unit 361 illustrated in FIG. 26 in place of the switching unit 161.

As illustrated in FIG. 26, the switching unit 361 includes a switch 371, a switch 372, and a load capacitor 373.

The switch 371 connects the reference voltage generation unit 131 that supplies a reference voltage Vref1_x to the comparison unit 162 or the load capacitor 373 in accordance with the values of the control signal SWR1 and the control signal SWR2. For example, the switch 371 connects the reference voltage generation unit 131 to the comparison unit 162 and disconnects the reference voltage generation unit 131 from the load capacitor 373 in accordance with the values of the control signal SWR1 and the control signal SWR2. Further, for example, the switch 371 disconnects the reference voltage generation unit 131 from the comparison unit 162 and connects the reference voltage generation unit 131 to the load capacitor 373 in accordance with the values of the control signal SWR1 and the control signal SWR2.

The switch 372 connects the reference voltage generation unit 132 that supplies a reference voltage Vref2_x to the comparison unit 162 or the load capacitor 373 in accordance with the values of the control signal SWR1 and the control signal SWR2. For example, the switch 372 connects the reference voltage generation unit 132 to the comparison unit 162 and disconnects the reference voltage generation unit 132 from the load capacitor 373 in accordance with the values of the control signal SWR1 and the control signal SWR2. Further, for example, the switch 372 disconnects the reference voltage generation unit 132 from the comparison unit 162 and connects the reference voltage generation unit 132 to the load capacitor 373 in accordance with the values of the control signal SWR1 and the control signal SWR2.

In other words, the switch 371 and the switch 372 select a reference voltage generation unit to be connected to the comparison unit 162 and the load capacitor 373. That is, the switch 371 and the switch 372 connect one of the reference voltage generation unit 131 and the reference voltage generation unit 132 to the comparison unit 162 and connect the other to the load capacitor 373 in accordance with the values of the control signal SWR1 and the control signal SWR2.

The load capacitor 373 is designed to have a capacitance Cj equivalent to or approximate to the input capacitance Ci of the comparison unit 162. The load capacitor 373 is formed of, for example, a capacitor or the like.

Figure 27:
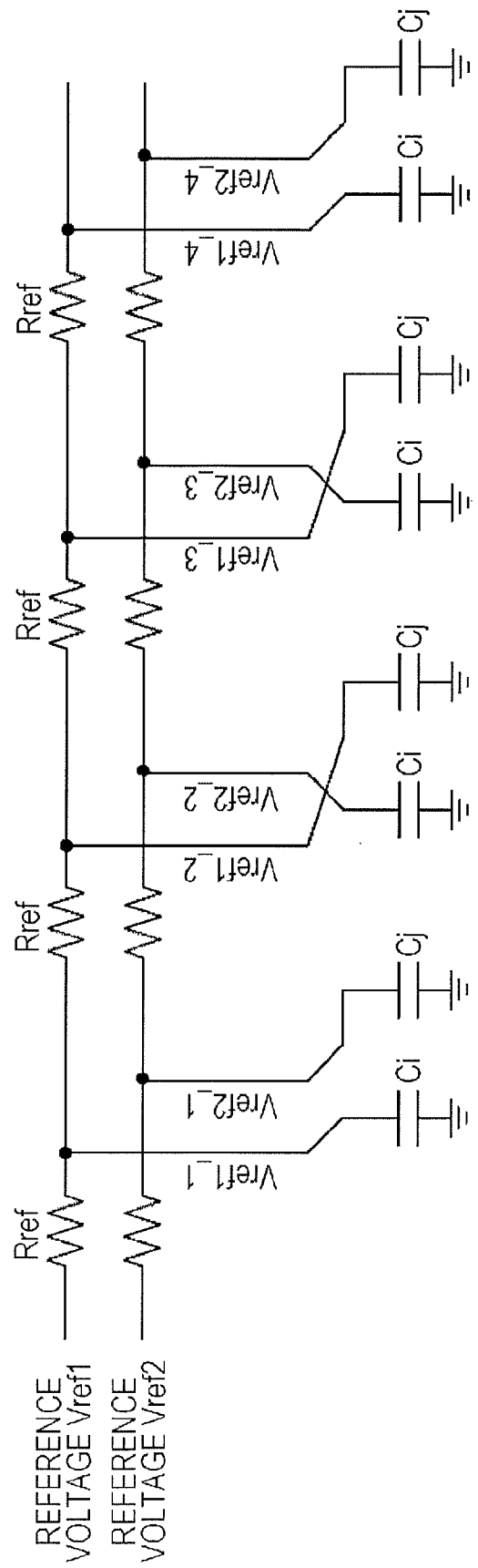
FIG. 27 is a diagram illustrating an example of a distributed constant circuit.

The switching unit 361 is used in each of the column A/D conversion units 151. Thus, as in FIG. 24, even if reference voltages having different levels of gradation precision are selected, a distributed constant circuit illustrated in FIG. 27 is obtained. That is, as in the distributed constant circuits in the example illustrated in FIGS. 21 and 22, a shift in the delay of the reference voltage Vref between the A/D conversion of the first analog signal and the A/D conversion of the second analog signal can be suppressed, or at least minimized, for all the columns.

Figure 28:
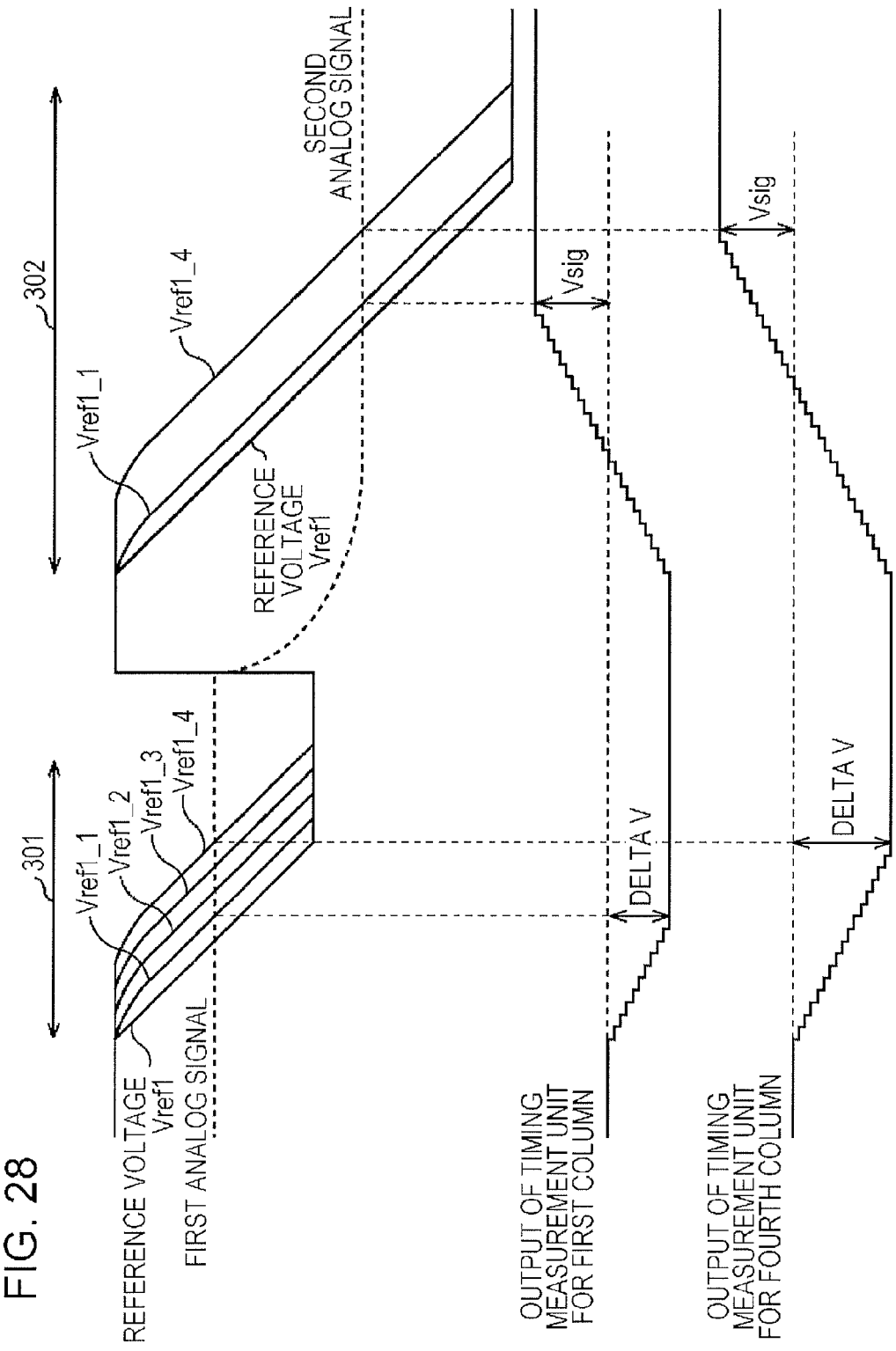
FIG. 28 is a timing chart illustrating an example of A/D conversion.

Accordingly, as illustrated in FIG. 28, the delays of the reference voltages Vref1_x for the respective columns in the period indicated by the double-sided arrow 301 are similar to those in the period indicated by the double-sided arrow 302, and the signal component Vsig can be correctly obtained as a digital value in both periods. Also for the reference voltages Vref2_x, a shift in the delay can be suppressed or at least minimized. In other words, the occurrence of errors in A/D conversion can be suppressed or at least reduced.

The capacitance Cj of the load capacitor 373 in the switching unit 361 is designed to be equal to or approximate to the input capacitance Ci of the comparison unit 162. The comparison unit 162 is configured in a manner illustrated in, for example, FIG. 8. In this case, the input capacitance of the comparison unit 162 is constituted by the ca-pacitances of a capacitor Caz, a transistor M1, and a transistor M2.

Figure 29:
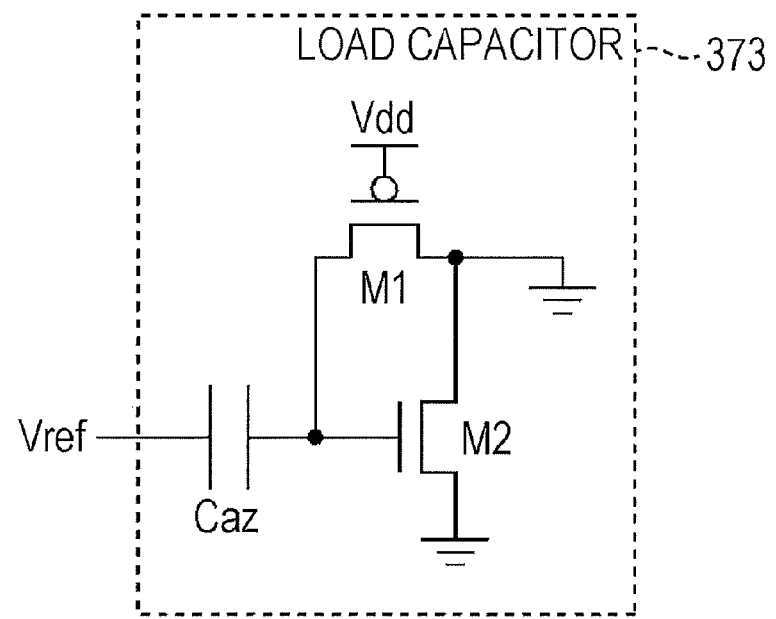
FIG. 29 is a diagram illustrating an example of a main configuration of a capacitor.

Therefore, as illustrated in FIG. 29, the load capacitor 373 may be configured using, for example, an equivalent circuit including a capacitor Caz, a transistor M1, and a transistor M2.

Figure 30:
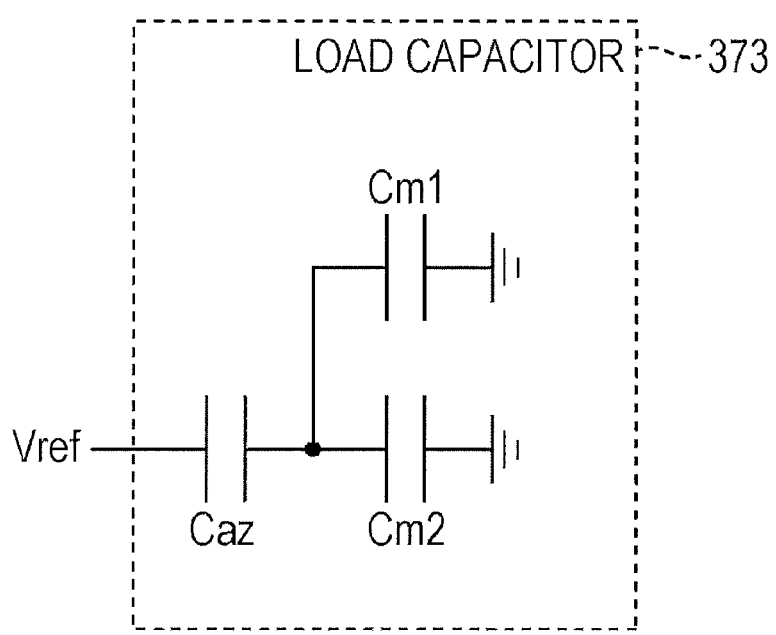
FIG. 30 is a diagram illustrating another example of a main configuration of the capacitor.

The load capacitor 373 may also be configured using a circuit in which, as illustrated in FIG. 30, for example, the transistor M1 is replaced by a capacitor Cm1 having a capacitance approximate to that of the transistor M1 and the transistor M2 is replaced by a capacitor Cm2 having a capacitance approximate to that of the transistor M2. Note that only one of the transistors M1 and M2 may be replaced by a capacitor.

Figure 31:
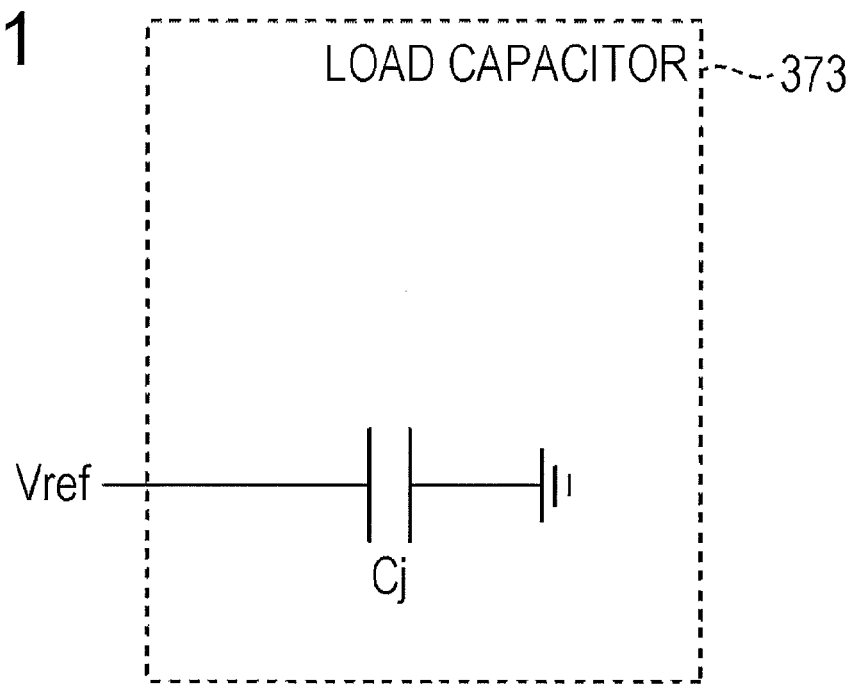
FIG. 31 is a diagram illustrating still another example of a main configuration of the capacitor.

The load capacitor 373 may also be formed of, for example, as illustrated in FIG. 31, one capacitor having a capacitance equivalent to or approximate to the combined capacitance of the capacitor Caz, the transistor M1, and the transistor M2.

<Other Example of CMOS Image Sensor of Second Embodiment>

Figure 32:
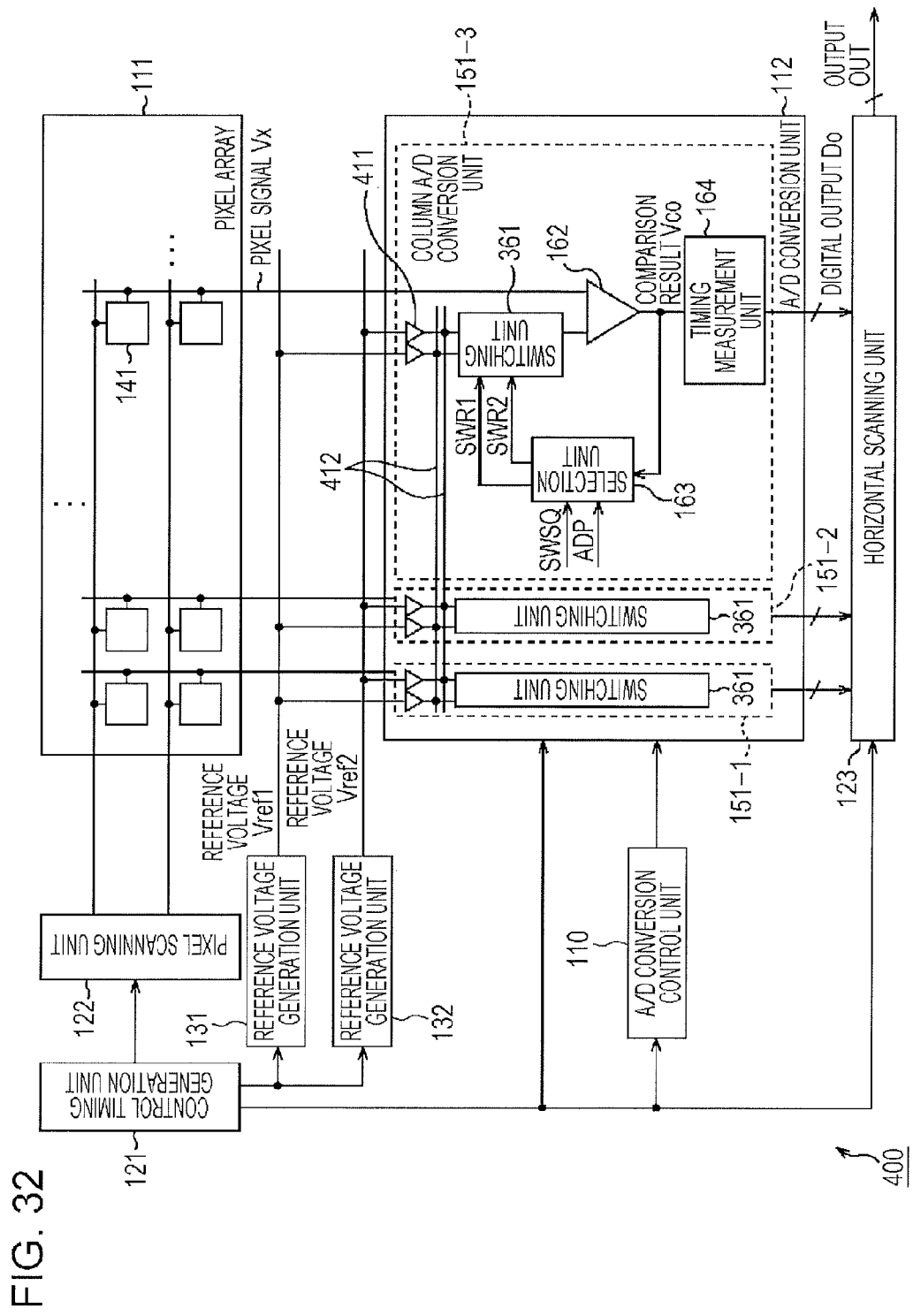
FIG. 32 is a diagram illustrating an example of a main configuration of a CMOS image sensor.

FIG. 32 is a diagram illustrating an example of a main configuration of a CMOS image sensor 400. The CMOS image sensor 400 illustrated in FIG. 32 is an image sensor basically similar to the CMOS image sensor 100, and is configured to have a configuration similar to that of the CMOS image sensor 100 and perform processes similar to those of the CMOS image sensor 100. The CMOS image sensor 400 is configured such that each of the column A/D conversion units 151 includes buffers 411 and the column A/D conversion units 151 are connected to one another via common column lines 412. Furthermore, the CMOS image sensor 400 includes the switching units 361 in place of the switching units 161.

The buffers 411 are amplification units located between respective signal output lines of the reference voltage generation unit 131 and the reference voltage generation unit 132 and the inputs of the switching units 361. The reference voltages Vref are supplied to the switching units 361 via the buffers 411. This arrangement can prevent noise generated in the comparison unit 162 of one of the column A/D conversion units 151 from affecting the other column A/D conversion units 151 via a reference voltage.

Each of the common column lines 412 connects the outputs of the buffers 411 corresponding to the same reference voltage. Thus, offset variations of the buffers 411 over the respective column A/D conversion units 151 can be smoothed.

However, since the column A/D conversion units 151 are connected to one another via the common column lines 412, as in the CMOS image sensor 100 described above, due to a change in a distributed constant circuit, variations in the delays of the reference voltages may also occur in the CMOS image sensor 400.

To address such an issue, each of the column A/D conversion units 151 includes the switching unit 361, and a shift in the delay of the reference voltages can be suppressed or at least minimized. In other words, the occurrence of errors in A/D conversion can be suppressed or at least reduced.

In addition, for example, the subtraction between the first analog signal and the second analog signal may be performed by an analog operation circuit prior to the input of the comparison unit 162, and a result of the operation, that is, the signal component obtained after the variation component has been removed, may be compared using a predetermined determination value. Then, a gradation precision (reference voltage) may be selected, and a digital value may be obtained through a single A/D conversion operation. Also in this case, even for the same signal voltage, there is still a problem in that the delay of the reference voltage varies in accordance with the gradation precision selected by the other pixel signals and causes an error in a digital value. The use of the switching units 361 can suppress, or at least minimize, a shift in the delay of the reference voltage. In other words, the occurrence of errors in A/D conversion can be suppressed or at least reduced.

Further, the timing measurement unit 164 may use any measurement method. For example, the timing measurement unit 164 may include a counter, and may be configured to perform measurement by stopping the counter in accordance with the comparison result Vco output from the comparison unit 162. Alternatively, the timing measurement unit 164 may include an up/down counter, and may be configured to compute the difference between the first analog signal and the second analog signal during an A/D conversion period or to hold a count value in a latch circuit at the timing of the comparison result Vco. Any other method may also be used, or a plurality of methods may be used in combination. For example, the target to be processed may be divided into parts such as high and low bits using a desired method, and different methods may be applied to the parts.

Accordingly, a load capacitor provided in a switching unit can eliminate or reduce A/D conversion errors caused by changes in the delay time of a reference signal due to concurrent use of A/D conversion operations with different levels of gradation precision. Thus, degradation in image quality can be prevented or at least minimized.

<Third Embodiment>
<Crosstalk and Insufficient Slope>
FIGS. 33A to 33C are diagrams depicting an example of coupling and crosstalk. As illustrated in FIG. 33A, if a plurality of reference voltages such as the reference voltage Vref1 and the reference voltage Vref2 exist, it is realistically difficult to completely remove the parasitic capacitance between lines or coupling via other signal lines such as GND. Thus, signal crosstalk can arise between reference signals.

For example, as illustrated in FIG. 33B, when the incident light intensity is low, an image output is the difference between a result of obtaining a reset level for the first time using the reference voltage Vref1 and a result of obtaining a signal level using the reference voltage Vref1 selected after the determination of intensity.

When a reset level is to be obtained, all the column A/D conversion units 151 operate using the reference voltage Vref1. On the other hand, when a signal level is to be obtained, the reference voltage Vref2 may also be employed in accordance with incident light intensity, and thus all the reference voltages Vref operate.

Thus, for example, referring to FIG. 33B, crosstalk is generated in the reference voltage Vref1 due to the reference voltage Vref2, and an error may occur between the slopes of the reference voltage Vref1 when a reset level is obtained and when a signal level is obtained. Also in the example illustrated in FIG. 33C, an error may occur between the slopes of the reference voltage Vref2 when a reset level is obtained and when a signal level is obtained.

Further, at the beginning of the slope of the reference voltages, a certain settling period of time may be taken until the slope is made stable from the time constant of a signal line. If the slope is not sufficiently stable, an error may occur when the difference between a signal level and a reset level is obtained.

Figure 34A:
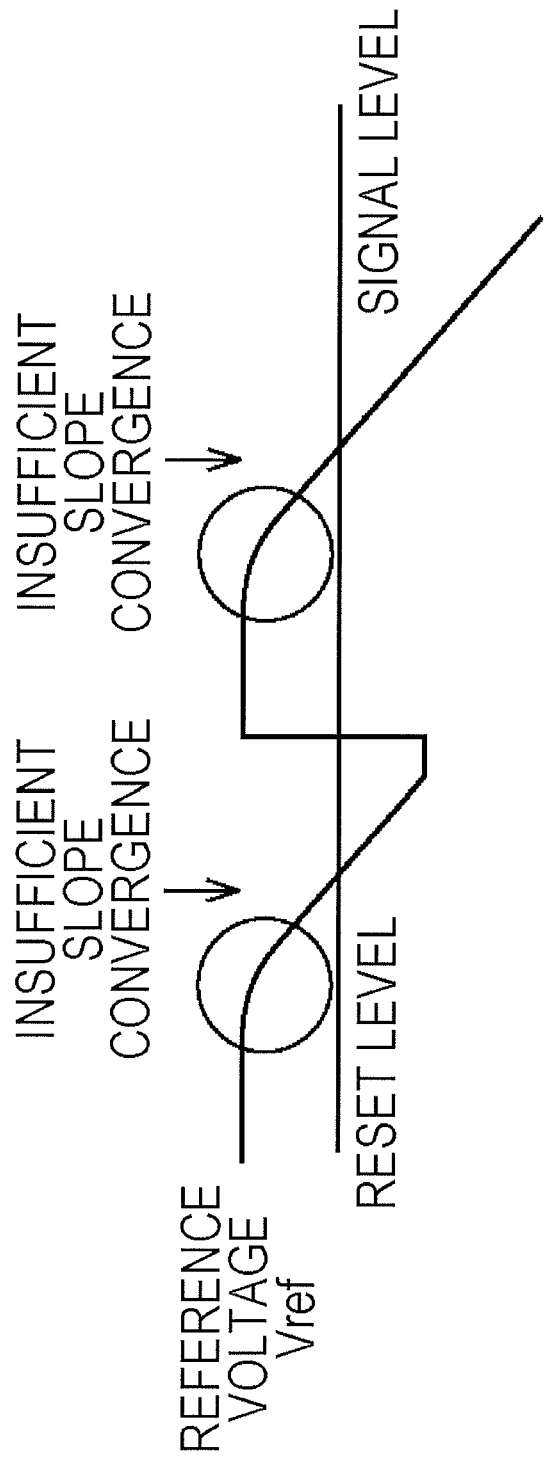
FIG. 34A is a diagram depicting an example of insufficient slope convergence in a reference voltage.

However, the problem described above is substantially negligible in a bright region where the nonlinearity of the light receiving element or a reading circuit is accumulated. That is, the problem is noticeable in a region having a small signal amplitude (or a region with a low incident light intensity). Thus, as illustrated in FIG. 34A, when a reference voltage is scanned from the dark region to the bright region, if the signal amplitude is small, the slopes when a reset level is obtained and when a signal level is obtained substantially match and no problem may arise even though the slopes are not sufficiently constant.

In contrast, as illustrated in FIG. 34B, when a reference voltage is scanned from the bright region to the dark region, if the signal amplitude is small, the slope is not sufficiently constant when a reset level is obtained, whereas the slope is stable when a signal level is obtained. Thus, an error may occur.

<Improvement in Crosstalk and Insufficient Slope>
Accordingly, a signal processing device includes the following elements. A comparison unit is configured to compare an analog signal output from a unit pixel with a certain voltage. A reference voltage supply unit is configured to supply a plurality of reference voltages having different levels of gradation precision. A switching unit is configured to switch a reference voltage to be supplied to the comparison unit, if necessary, and configured to connect one of the plurality of reference voltages supplied from the reference voltage supply unit to the comparison unit. A measurement unit is configured to measure a timing of change of a comparison result of comparison by the comparison unit between the analog signal and a reference voltage supplied to the comparison unit under switching control of the switching unit. The reference voltage supply unit repeatedly supplies all the plurality of reference voltages for a first analog signal a number of times equal to the number of reference voltages, the first analog signal being a noise signal of the unit pixel. The switching unit sequentially supplies the reference voltages supplied from the reference voltage supply unit to the comparison unit one by one. The comparison unit sequentially compares the first analog signal with each of the reference voltages in accordance with control of the switching unit. The reference voltage supply unit supplies all the plurality of reference voltages for a second analog signal, the second analog signal being a signal including data of the unit pixel. The switching unit supplies one of the plurality of reference voltages supplied from the reference voltage supply unit to the comparison unit. The comparison unit compares the reference voltage supplied in accordance with control of the switching unit with the second analog signal. The measurement unit determines a difference between a measured timing of change of a comparison result of comparison by the comparison unit between the second analog signal and the reference voltage and a measured tuning of change of a comparison result of comparison by the comparison unit between the first analog signal and the reference voltage.

Thus, the signal processing device can generate the same crosstalk for the acquisition of a reset level and the acquisition of a signal level. Therefore, the signal processing device can overcome a slope error in the acquisition of a reset level and the acquisition of a signal level, and can suppress degradation in image quality. In other words, the occurrence of errors in A/D conversion can be suppressed or at least reduced.

The reference voltage supply unit may supply each of the plurality of reference voltages to the switching unit so that a voltage in a predetermined range is compared in a common comparison direction for a plurality of times reference voltages are supplied for the first analog signal and for every time the plurality of reference voltages are supplied for the second analog signal.

Thus, the signal processing device can easily generate the same crosstalk for the acquisition of a reset level and the acquisition when a signal level.

The reference voltage supply unit may set an offset of each reference voltage so that an end value of the reference voltage in a current operation is set to an initial value in a next operation in the plurality of times reference voltages are supplied for the first analog signal.

If the length of the reference voltage is sufficiently increased, reference voltages for the acquisition of a reset level may converge to a certain slope. However, the A/D conversion time may be increased and the frame rate may drop. To address such an inconvenience, by scanning the reference voltages so that the slope waveform when a reset level is obtained is extended, the signal processing device can allow the slope to sufficiently converge when a reset level is obtained without reducing the frame rate, and can eliminate or minimize errors between when a reset level is obtained and when a signal level is obtained.

Further, the reference voltage supply unit may supply the plurality of reference voltages to the switching unit so that the plurality of reference voltages are compared with the first analog signal in order of gradation precision in such a manner that each of the plurality of reference voltages is compared with the first analog signal in a comparison direction opposite to the comparison direction of a preceding reference voltage.

The comparison directions of reference voltages having different levels of gradation precision to be sequentially applied to the first analog signal sequentially alternate, thus making it possible to eliminate the transition of the comparison result Vco before the comparison with the next gradation precision begins. Therefore, the signal processing device can reduce the settling period of time between A/D conversion operations, and achieve a further increase in speed.

An embodiment of the present technology may also be implemented as a signal processing method for the signal processing device.

An embodiment may provide an imaging element including the following elements. A pixel array has unit pixels arranged thereon, each unit pixel including a photoelectric conversion element configured to perform photoelectric conversion on incident light. A comparison unit is configured to compare an analog signal output from a unit pixel in the pixel array with a certain voltage. A reference voltage supply unit is configured to supply a plurality of reference voltages having different levels of gradation precision. A switching unit is configured to switch a reference voltage to be supplied to the comparison unit, if necessary, and configured to connect one of the plurality of reference voltages supplied from the reference voltage supply unit to the comparison unit. A measurement unit is configured to measure a timing of change of a comparison result of comparison by the comparison unit between the analog signal and a reference voltage supplied to the comparison unit under switching control of the switching unit. The reference voltage supply unit repeatedly supplies all the plurality of reference voltages for a first analog signal that is a noise signal of the unit pixel a number of times equal to the number of reference voltages. The switching unit sequentially supplies the reference voltages supplied from the reference voltage supply unit to the comparison unit one by one. The comparison unit sequentially compares the first analog signal with each of the reference voltages in accordance with control of the switching unit. The reference voltage supply unit supplies all the plurality of reference voltages for a second analog signal that is a signal including data of the unit pixel. The switching unit supplies one of the plurality of reference voltages supplied from the reference voltage supply unit to the comparison unit. The comparison unit compares the reference voltage supplied in accordance with control of the switching unit with the second analog signal. The measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

Another embodiment of the present technology may provide an imaging apparatus including the following elements. An imaging unit is configured to capture an image of a subject. An image processing unit is configured to perform image processing on image data obtained by capturing the image by using the imaging unit. The imaging unit includes the following elements. A pixel array has unit pixels arranged thereon, each unit pixel including a photoelectric conversion element configured to perform photoelectric conversion on incident light. A comparison unit is configured to compare an analog signal output from a unit pixel in the pixel array with a certain voltage. A reference voltage supply unit is configured to supply a plurality of reference voltages having different levels of gradation precision. A switching unit is configured to switch a reference voltage to be supplied to the comparison unit, if necessary, and configured to connect one of the plurality of reference voltages supplied from the reference voltage supply unit to the comparison unit. A measurement unit is configured to measure a timing of change of a comparison result of comparison by the comparison unit between the analog signal and a reference voltage supplied to the comparison unit under switching control of the switching unit. The reference voltage supply unit repeatedly supplies all the plurality of reference voltages for a first analog signal that is a noise signal of the unit pixel a number of times equal to the number of reference voltages. The switching unit sequentially supplies the reference voltages supplied from the reference voltage supply unit to the comparison unit one by one. The comparison unit sequentially compares the first analog signal with each of the reference voltages in accordance with control of the switching unit. The reference voltage supply unit supplies all the plurality of reference voltages for a second analog signal that is a signal including data of the unit pixel. The switching unit supplies one of the plurality of reference voltages supplied from the reference voltage supply unit to the comparison unit. The comparison unit compares the reference voltage supplied in accordance with control of the switching unit with the second analog signal. The measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

Accordingly, an embodiment of the present technology may be implemented as a signal processing device or any apparatus configured to perform signal processing similar to that described above. Part or all the control processes may be implemented by software.

A more specific description will be given hereinafter.

<Timing Chart for Third Embodiment>

Figure 35:
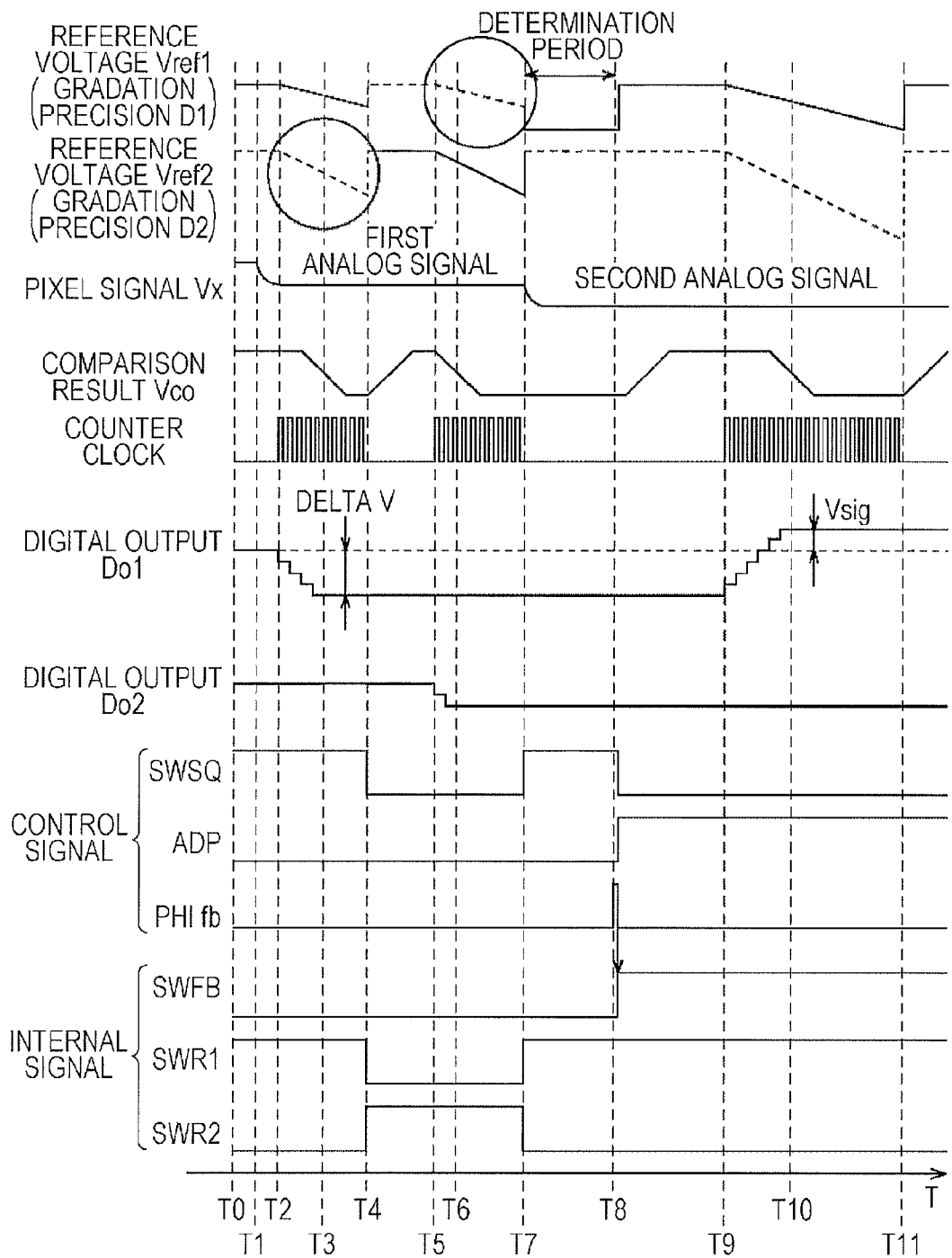
FIG. 35 is a timing chart illustrating an example of A/D conversion.
Figure 36:
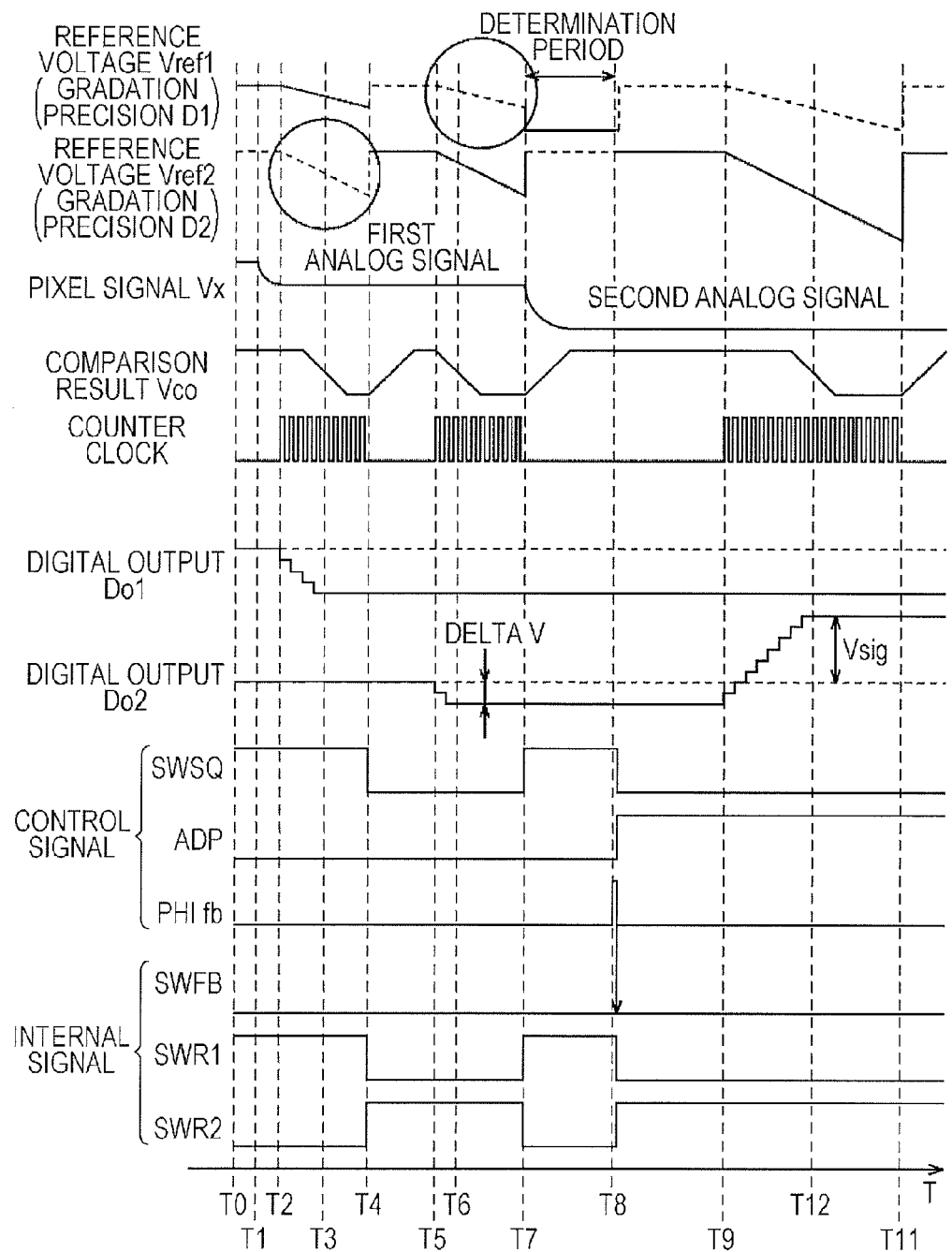
FIG. 36 is a timing chart illustrating an example of A/D conversion.

For example, in FIGS. 9 and 10, as indicated by circles in FIGS. 35 and 36, a reference voltage that is not selected in the A/D conversion of the first analog signal is also scanned.

Specifically, the reference voltage Vref2 is also scanned during a period from time T2 to time T4, and the reference voltage Vref1 is also scanned during a period from time T5 to time T7. Thus, crosstalk can also be generated during the A/D conversion of the first analog signal in a manner similar to that during the A/D conversion of the second analog signal. Therefore, the column A/D conversion unit 151 can eliminate or reduce slope errors when a reset level is obtained and when a signal level is obtained, and can prevent, or at least minimize, degradation in image quality. In other words, the occurrence of errors in A/D conversion can be suppressed or at least reduced.

Figure 37:
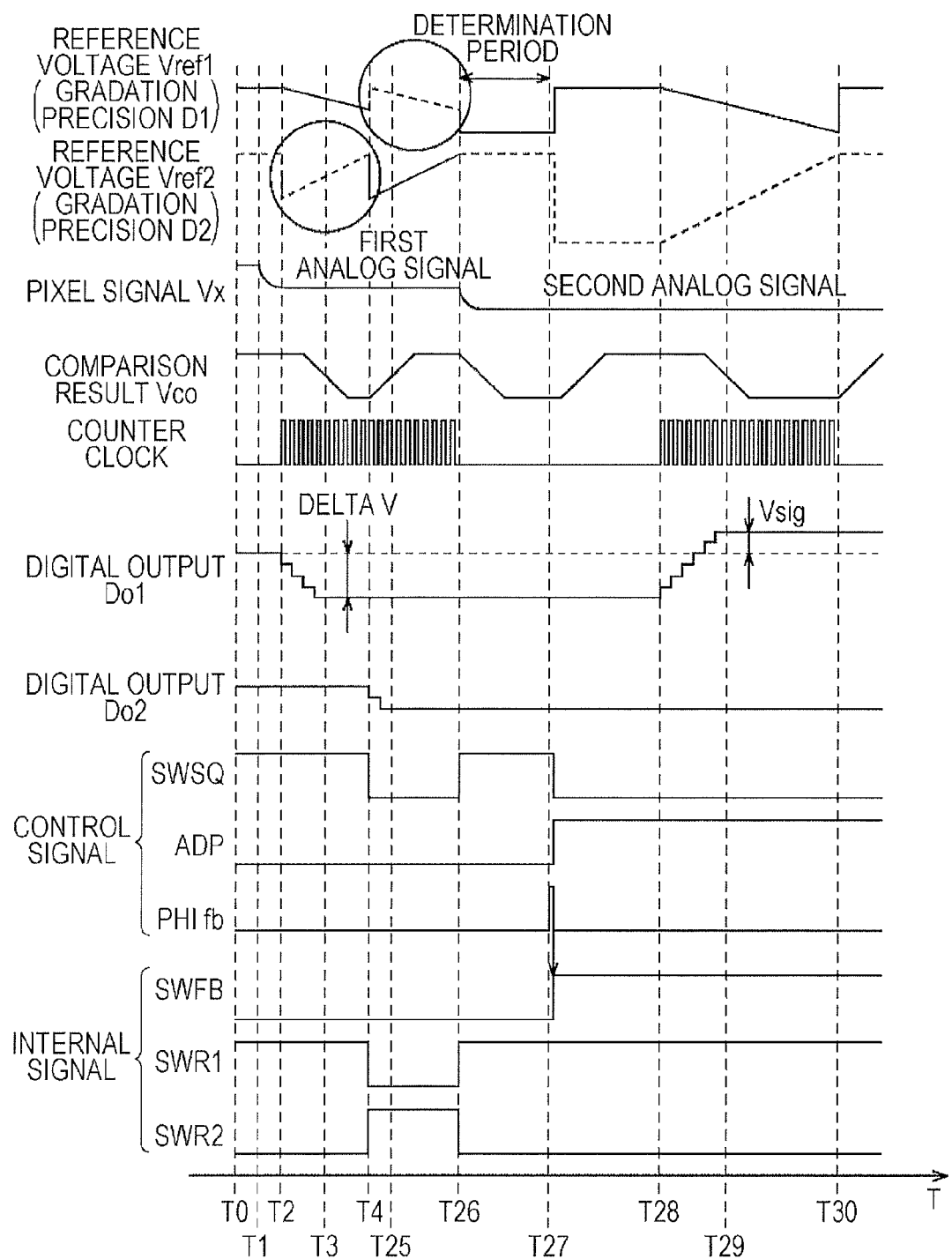
FIG. 37 is a timing chart illustrating an example of A/D conversion.
Figure 38:
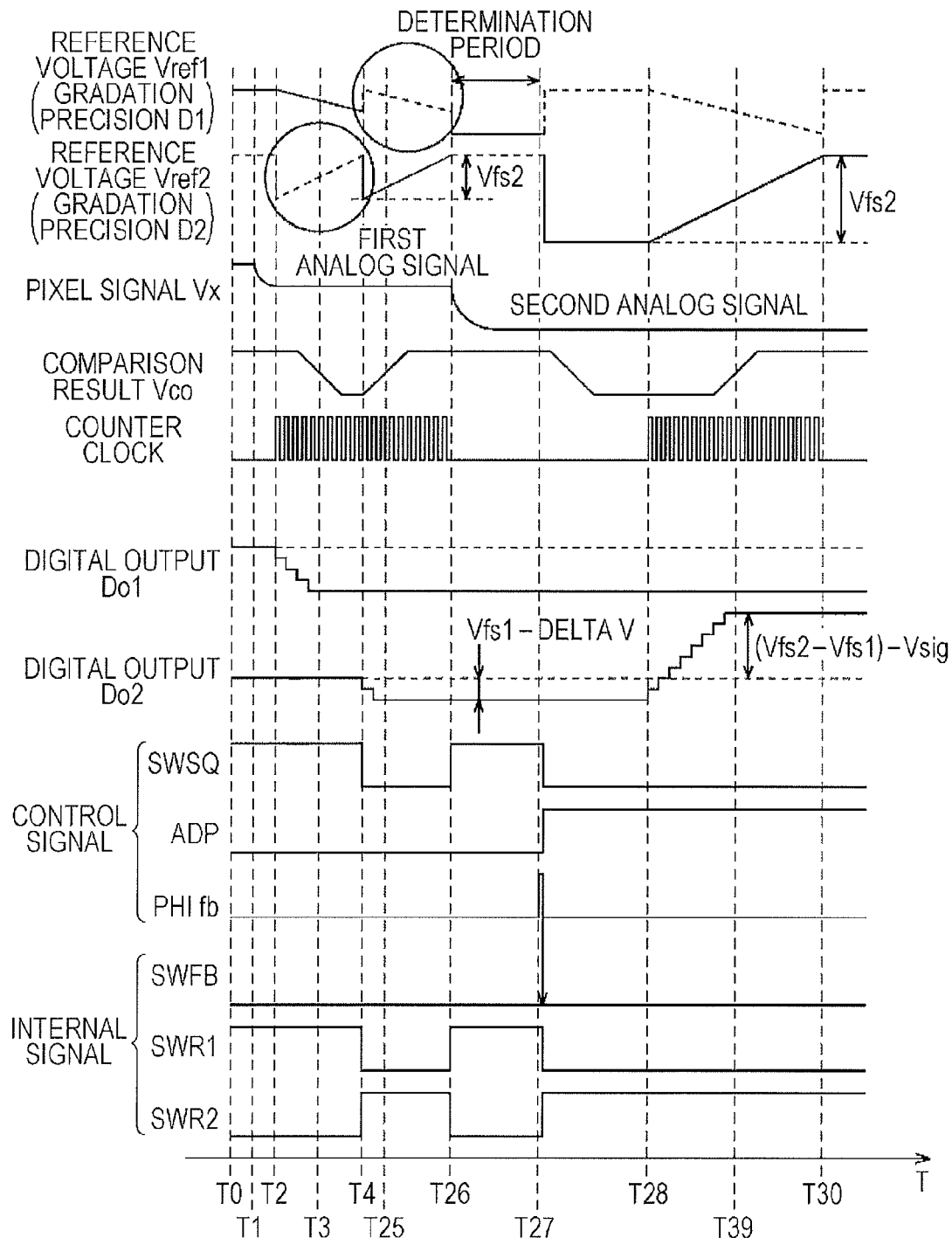
FIG. 38 is a timing chart illustrating an example of A/D conversion.

When reference voltages are scanned in the timing charts illustrated in FIGS. 11 and 12, as in timing charts illustrated in FIGS. 37 and 38, as indicated by circles in FIGS. 37 and 38, a reference voltage that is not selected during the A/D conversion of the first analog signal may be scanned.

Figure 39:
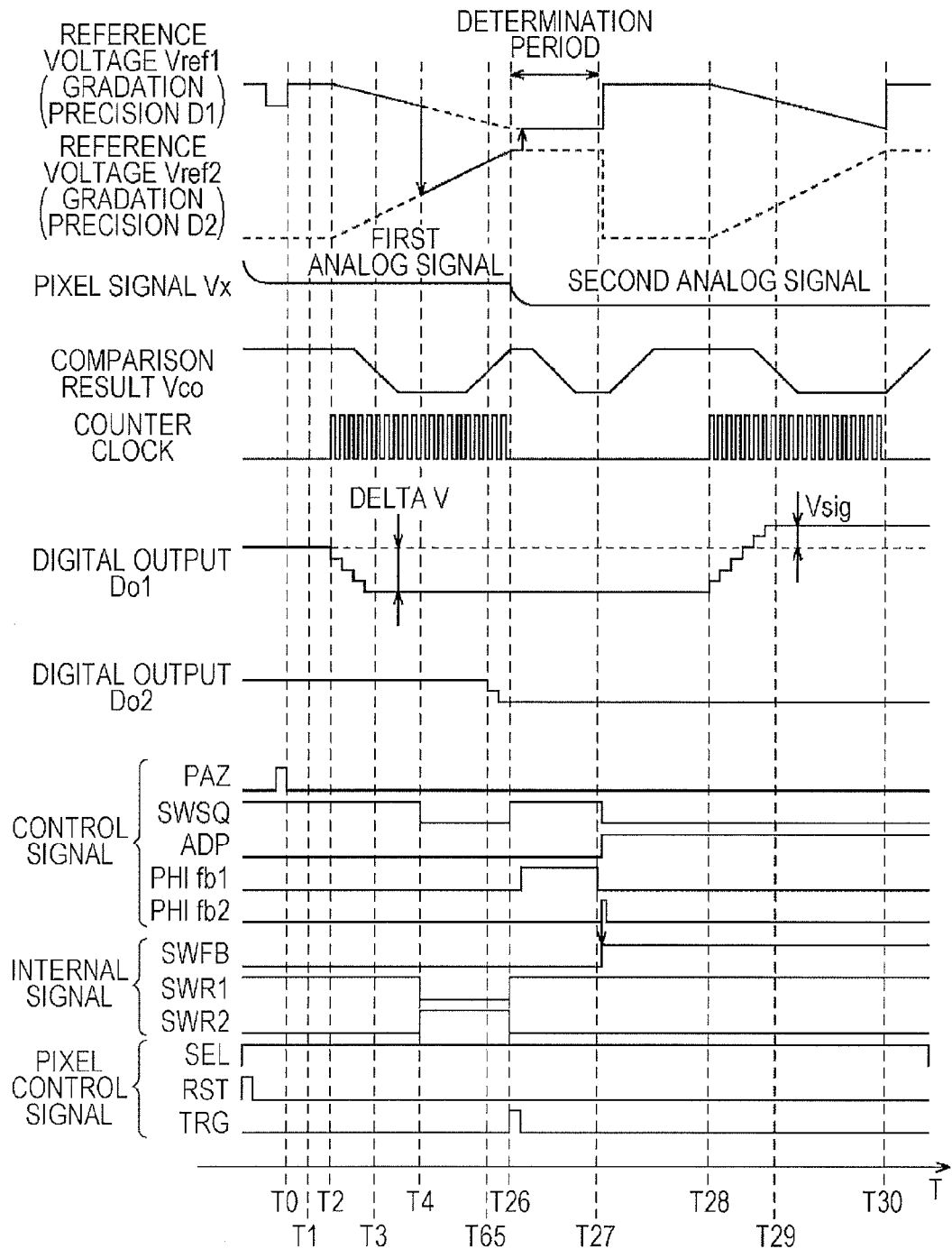
FIG. 39 is a timing chart illustrating an example of A/D conversion.
Figure 40:
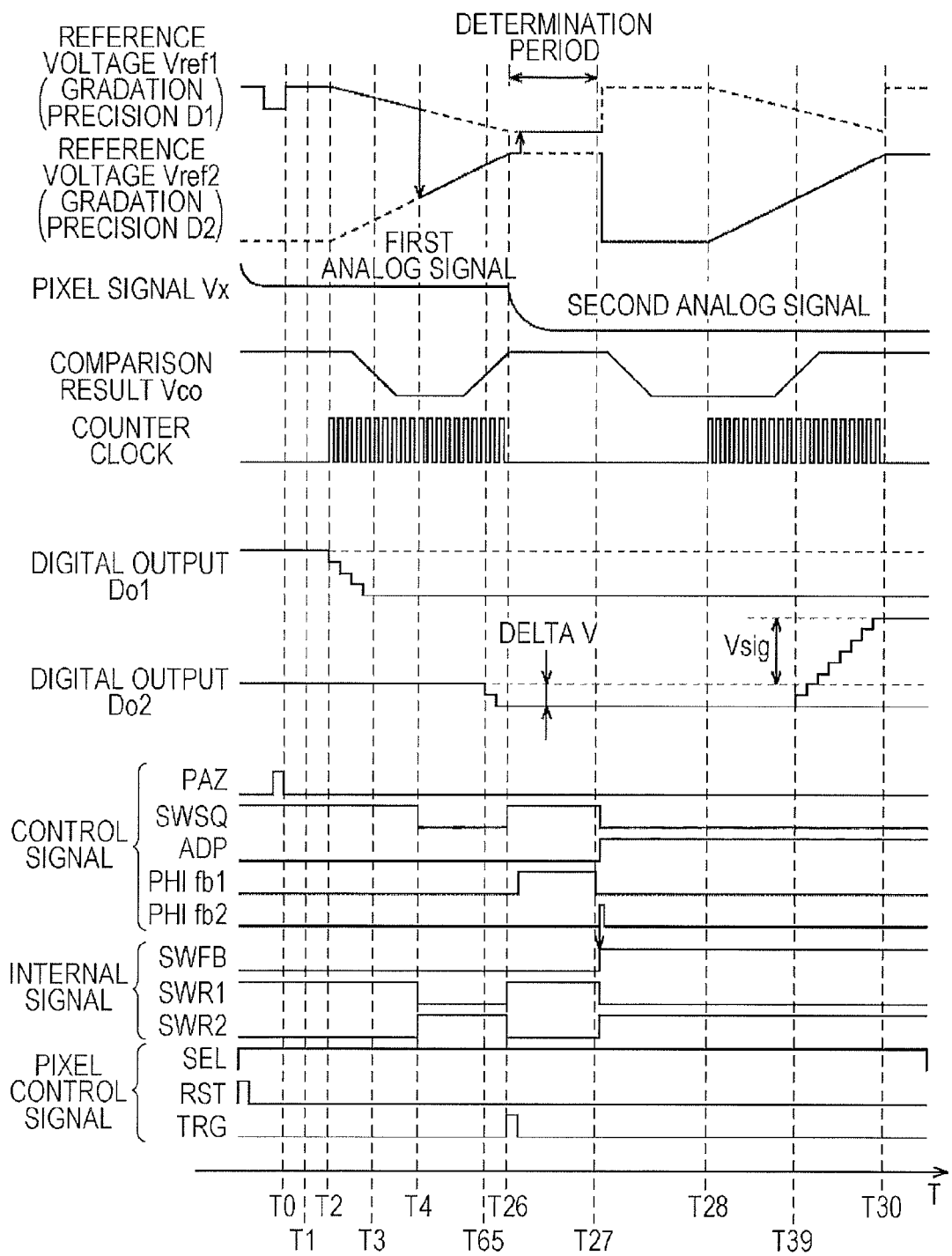
FIG. 40 is a timing chart illustrating an example of A/D conversion.

When reference voltages are scanned in the timing charts illustrated in FIGS. 16 and 17, as in timing charts illustrated in FIGS. 39 and 40, a reference voltage that is not selected during the A/D conversion of the first analog signal may be scanned.

As illustrated in FIGS. 39 and 40, reference voltages Vref are scanned during the A/D conversion of the first analog signal so that the slope waveform when a reset level is obtained is extended. Thus, the signal processing device allows the slope to sufficiently converge when a reset level is obtained without reducing the frame rate, and can eliminate or minimize errors between when a reset level is obtained and when a signal level is obtained.

<Fourth Embodiment>
<Imaging Device>

Figure 41:
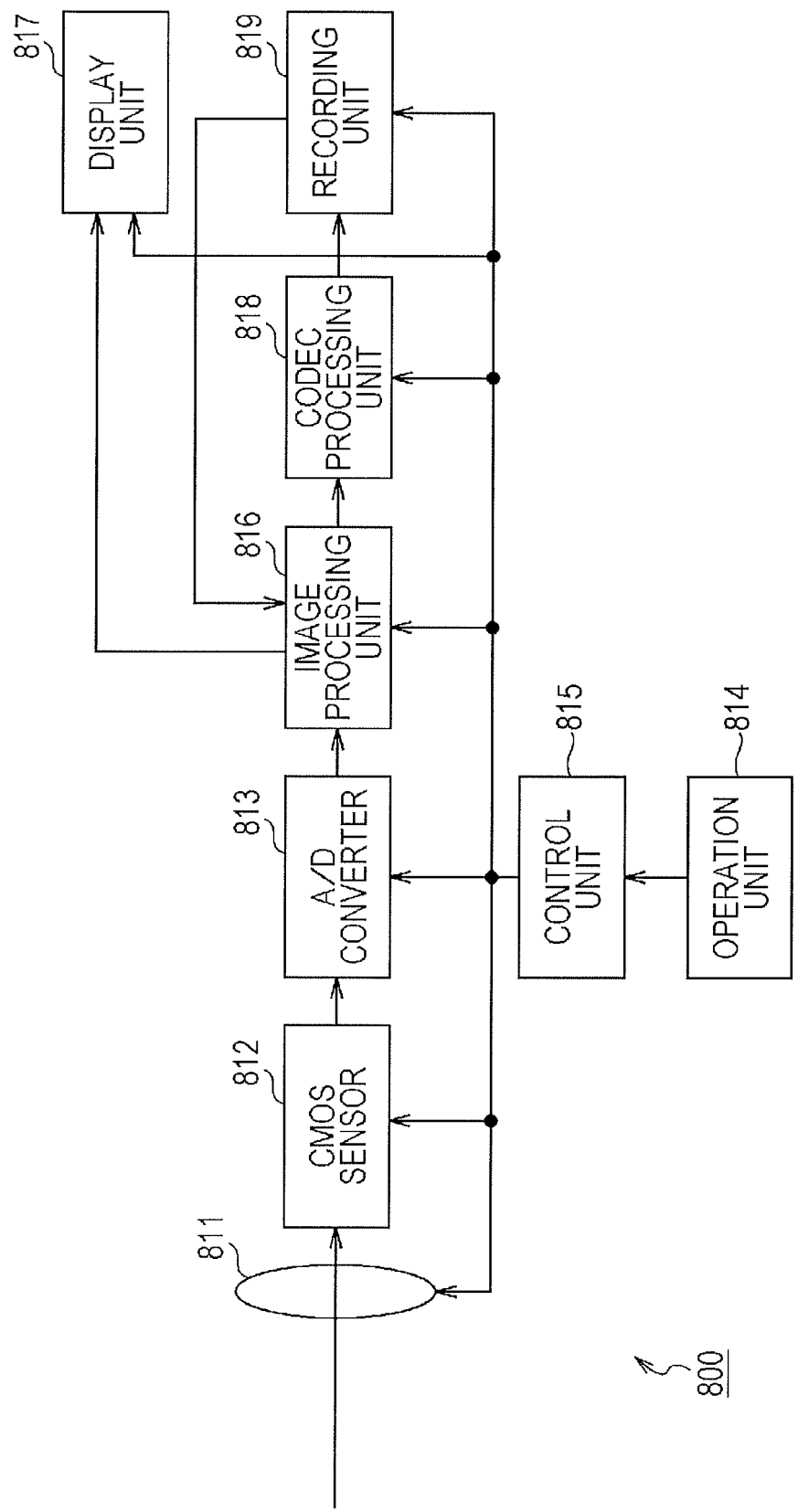
FIG. 41 is a diagram illustrating an example of a main configuration of an imaging apparatus.

FIG. 41 is a block diagram illustrating an example configuration of an imaging apparatus 800 including the signal processing device described above. The imaging apparatus 800 illustrated in FIG. 41 is an apparatus configured to capture an image of a subject and to convert the image of the subject into an electrical signal to output the electrical signal.

As illustrated in FIG. 41, the imaging apparatus 800 includes an optical unit 811, a CMOS sensor 812, an A/D converter 813, an operation unit 814, a control unit 815, an image processing unit 816, a display unit 817, a codec processing unit 818, and a recording unit 819.

The optical unit 811 includes a lens that adjusts the focal distance to the subject and that collects light from a position where the subject is in focus, an aperture stop that adjusts exposure, a shutter that controls the timing of capturing an image, and so forth. The optical unit 811 allows the light (incident light) from the subject to pass therethrough, and supplies the light to the CMOS sensor 812.

The CMOS sensor 812 performs photoelectric conversion on the incident light to produce an electrical signal, and supplies the signal (pixel signal) to the A/D converter 813 on a pixel-by-pixel basis.

The A/D converter 813 converts the pixel signal supplied from the CMOS sensor 812 at a predetermined timing into digital data (image data), and sequentially supplies the digital data to the image processing unit 816 at a predetermined timing.

The operation unit 814 includes, for example, a jog dial (trademark), a key pad, buttons, a touch panel, and so forth. The operation unit 814 receives an operation input given by a user, and supplies a signal corresponding to the operation input to the control unit 815.

The control unit 815 controls the driving of the optical unit 811, the CMOS sensor 812, the A/D converter 813, the image processing unit 816, the display unit 817, the codec processing unit 818, and the recording unit 819 in accordance with the signal corresponding to the operation input given by the user, which is input from the operation unit 814, to cause the individual units to perform processes relating to the capture of an image.

The image processing unit 816 performs various types of image processing, such as color mixture correction, black level correction, white balance adjustment, de-mosaicing, matrixing, gamma correction, and YC conversion, on the image data supplied from the A/D converter 813. The image processing unit 816 supplies the image data subjected to image processing to the display unit 817 and the codec processing unit 818.

The display unit 817 is configured as, for example, a liquid crystal display, and displays an image of the subject based on the image data supplied from the image processing unit 816.

The codec processing unit 818 encodes the image data supplied from the image processing unit 816 using a predetermined method, and supplies the encoded data to the recording unit 819.

The recording unit 819 records the encoded data supplied from the codec processing unit 818. The encoded data recorded on the recording unit 819 is read and decoded by the image processing unit 816, if necessary. Image data obtained by decoding processing is supplied to the display unit 817, and a corresponding image is displayed.

Any of the foregoing embodiments of the present technology may be used as a processing unit including the CMOS sensor 812 and the A/D converter 813 of the imaging apparatus 800. The CMOS image sensor (for example, the CMOS image sensor 100 or the CMOS image sensor 400) described above in the first to third embodiments may be used as a processing unit including the CMOS sensor 812 and the A/D converter 813. Thus, the processing unit including the CMOS sensor 812 and the A/D converter 813 can suppress, or at least reduce, the occurrence of errors in A/D conversion. Therefore, the imaging apparatus 800 can obtain an image with a higher quality by capturing an image of a subject.

An imaging apparatus according to an embodiment of the present technology is not limited to the configuration described above, and any other configuration may be used. For example, a charge-coupled device (CCD) image sensor according to an embodiment of the present technology may be used in place of the CMOS sensor 812. An imaging apparatus according to an embodiment of the present technology may be, for example, an information processing apparatus having an image capture function, such as a mobile phone, a smartphone, a tablet device, or a personal computer, as well as a digital still camera or a video camera. An imaging apparatus according to an embodiment of the present technology may also be a camera module attached to another information processing apparatus for use (or incorporated as a built-in device).

<Fifth Embodiment>
<Computer>

The series of processes described above (for example, a process for controlling A/D conversion described above in the foregoing embodiments (for example, a process for supplying various control signals, etc.)) may be executed by hardware or software.

For example, in the CMOS image sensor 100 illustrated in FIG. 5, the A/D conversion control unit 110 may execute a process for supplying various control signals by software. Processes performed in, but not limited to, the example illustrated in FIG. 5, such as the processes in the example illustrated in FIG. 32, may be implemented by software. Processes performed by devices other than the A/D conversion control unit 110, such as the process for supplying reference voltages by using the reference voltage generation unit 131, the reference voltage generation unit 132, and the like, may also be implemented by software.

When the series of processes is executed by software, a program constituting the software is installed in a computer. Examples of the computer include a computer incorporated in dedicated hardware, and a general-purpose personal computer capable of executing various functions by installing various programs therein.

FIG. 42 is a block diagram illustrating an example configuration of hardware of a computer 900 that executes the series of processes described above by using a program.

In the computer 900 illustrated in FIG. 42, a central processing unit (CPU) 901, a read only memory (ROM) 902, and a random access memory (RAM) 903 are connected to one another via a bus 904.

An input/output interface 910 is also connected to the bus 904. An input unit 911, an output unit 912, a storage unit 913, a communication unit 914, and a drive 915 are connected to the input/output interface 910.

The input unit 911 includes, for example, a keyboard, a mouse, a microphone, a touch panel, an input terminal, and so forth. The output unit 912 includes, for example, a display, a speaker, an output terminal, and so forth. The storage unit 913 includes, for example, a hard disk, a RAM disk, a non-volatile memory, and so forth. The communication unit 914 includes, for example, a network interface and so forth. The drive 915 drives a removable medium 921 such as a magnetic disk, an optical disk, a magneto-optical disk, or a semiconductor memory.

In the computer 900 having the configuration described above, the CPU 901 loads a program stored in, for example, the storage unit 913 into the RAM 903 via the input/output interface 910 and the bus 904, and executes the program to perform the series of processes described above. The RAM 903 also stores data and the like necessary for the CPU 901 to execute various processes, if necessary.

The program to be executed by the computer 900 (namely, the CPU 901) may be recorded on the removable medium 921 serving as, for example, a package medium or the like for use. The program may also be provided via a wired or wireless transmission medium such as a local area network, the Internet, or digital satellite broadcasting.

In the computer 900, the program can be installed into the storage unit 913 via the input/output interface 910 by inserting the removable medium 921 in the drive 915. The program can also be received by the communication unit 914 via a wired or wireless transmission medium, and can be installed into the storage unit 913. The program may also be installed in advance in the ROM 902 or the storage unit 913.

The computer-executable program may be a program in which processes are performed in a time-series manner in the order stated herein, or may be a program in which processes are performed in parallel or at necessary timings such as when called.

In this specification, steps describing a program stored in a recording medium include processes to be performed in a time-series manner in the order stated, but not necessarily, and processes to be executed in parallel or individually.

In this specification, the term "system" refers to a set of constituent elements (apparatuses, modules (components), etc.) regardless of whether all the constituent elements are accommodated in the same housing or not. Thus, a plurality of apparatuses accommodated in separated housings and connected via a network, and a single apparatus including a plurality of modules accommodated in a single housing may be defined as a system.

A configuration described above as a single apparatus (or processing unit) may be divided into a plurality of apparatuses (or processing units). Conversely, a configuration described above as a plurality of apparatuses (or processing units) may be combined into a single apparatus (or processing unit). Additionally, a configuration other than that described above may be added to the configuration of each apparatus (or each processing section). Furthermore, part of the configuration of a certain apparatus (or processing unit) may be included in the configuration of another apparatus (or another processing unit) if the apparatuses (or processing units) have substantially the same configuration and/or operation as a whole system.

While preferred or exemplary embodiments of the present disclosure have been described in detail with reference to the accompanying drawings, the technical scope of the present disclosure is not limited to the examples disclosed herein. It is to be understood that a person having ordinary skill in the art of the present disclosure could readily achieve various changes or modifications without departing from the scope of the technical concept as defined in the appended claims, and such changes or modifications also fall within the technical scope of the present disclosure.

For example, an embodiment of the present technology may be implemented in a cloud computing configuration in which a plurality of apparatuses cooperate to process a single function in a shared manner via a network.

Further, the operations described in the time charts described above may be executed by a single apparatus or by a plurality of apparatuses in a shared manner.

Furthermore, if one step includes a plurality of processes, the plurality of processes included in the one step may be executed by a single apparatus or by a plurality of apparatuses in a shared manner.

The embodiments of the present technology may also provide following configurations.

(1) A signal processing device comprising:
a selection unit configured to select, based on a first comparison of an analog signal with a determination voltage, a selected reference voltage to be compared with the analog signal, the selected reference voltage being selected from a plurality of reference voltages, wherein the plurality of reference voltages include at least a first reference voltage and a second reference voltage.

(2) The signal processing device according to (1), wherein the first reference voltage is generated by a first reference voltage generation unit, and
the second reference voltage is generated by a second reference voltage generation unit.

(3) The signal processing device according to (1), wherein the first reference voltage is scanned in steps of a first gradation precision,
the second reference voltage is scanned in steps of a second gradation precision, and
the first gradation precision is higher than the second gradation precision.

(4) The signal processing device according to (1), further comprising:
a comparison unit configured to perform the first comparison of the analog signal with the determination voltage and output a first comparison output based on the first comparison.

(5) The signal processing device according to (4), wherein the comparison unit further performs a second comparison, in the second comparison the comparison unit comparing the analog signal with the selected reference voltage.

(6) The signal processing device according to (5), wherein the comparison unit further performs a third comparison, in the third comparison the comparison unit comparing another analog signal with the first reference voltage and the second reference voltage.

(7) The signal processing device according to (4), further comprising:
a switching unit configured to switch the selected reference voltage from the plurality of reference voltages to be supplied to the comparison unit based on a first selection result output by the selection unit, the first selection result output being based on the first comparison of the analog signal with the determination voltage.

(8) The signal processing device according to (5), further comprising:
a time measurement unit configured to measure a period of time of the second comparison, the time measurement unit including a counter configured to start a count when the comparison unit starts the second comparison to when a second comparison result changes, the second comparison result being output by the comparison unit.

(9) The signal processing device according to (6), further comprising:
a time measurement unit configured to measure a period of time of the third comparison, the time measurement unit including a counter configured to start a count when the comparison unit begins the third comparison to when to when the comparison unit finishes the third comparison.

(10) The signal processing device according to (1), wherein the determination voltage is generated by a determination voltage generation unit.

(11) The signal processing device according to (1), wherein
the first reference voltage is scanned in a first scanning direction,
the second reference voltages is scanned in a second scanning direction, and
the first scanning direction is opposite from the second scanning direction.

(12) The signal processing device according to (11), wherein
the first scanning direction is a voltage increase from low to high, and
the second scanning direction is a voltage decrease from high to low.

(13) The signal processing device according to (11), wherein
the first scanning direction is a voltage increase from high to low, and
the second scanning direction is a voltage decrease from low to high.

(14) The signal processing device according to (6), wherein
the analog signal and the another analog signal are received from an electric charge accumulated in a light receiving portion of an image sensor.

(15) The signal processing device according to (14), wherein
the analog signal is an image data signal detected by the image sensor, and
the another analog signal is a noise signal of the image sensor.

(16) The signal processing device according to (3), wherein, in the case that the analog signal is determined to be less than the determination voltage, the first reference voltage is selected from the plurality of reference voltages as the selected reference voltage.

(17) The signal processing device according to (3), wherein, in the case that the analog signal is determined to be greater than the determination voltage, the second reference voltage is selected from the plurality of reference voltages as the selected reference voltage.

(18) The signal processing device according to (1), wherein
the first reference voltage scans a first reference voltage range,
the second reference voltage scans a second reference voltage range, and
the first reference voltage range is different from the second reference voltage range.

(19) The signal processing device according to (7), wherein
the switching unit is configured to connect a non-selected reference voltage from the plurality of reference voltages to a first load capacitor, the non-selected reference voltage being one of the plurality of reference voltages that is not the selected reference voltage.

(20) The signal processing device according to (19), wherein
the load capacitor includes a first capacitor, a second capacitor, and a third capacitor, the switching unit being configured to connect the non-selected reference voltage to a first electrode of the first capacitor,
a second electrode of the first capacitor is connected to
a first electrode of the second capacitor, a second electrode of the second capacitor being connected to a ground, and
a first of the third capacitor is connected to the second electrode of the first capacitor, a second electrode of the third capacitor being connected to the ground.

(21) The signal processing device according to (6), wherein
during the third comparison, the first reference voltage is scanned while the second reference voltage is scanned.

(22) The signal processing device according to claim 21, wherein
the first reference voltage is scanned in a first scanning direction,
the second reference voltages is scanned in a second scanning direction, and
the first scanning direction and the second scanning direction converge.

(23) The signal processing device according to (22), wherein
the first reference voltage and the second reference voltages sufficiently converge that a reset level is obtained without reducing a frame rate.

(24) A signal processing method comprising the step of:
selecting, based on a first comparison of an analog signal with a determination voltage, a selected reference voltage to be compared with the analog signal, the selected reference voltage being selected from a plurality of reference voltages, wherein
the plurality of reference voltages include at least a first reference voltage and a second reference voltage.

(25) The signal processing method according to (24), further comprising the steps of:
generating the first reference voltage; and
generating the second reference voltage.

(26) The signal processing method according to (24), further comprising the steps of:
scanning the first reference voltage in steps of a first gradation precision; and
scanning the second reference voltage in steps of a second gradation precision,
wherein the first gradation precision is higher than the second gradation precision.

(27) The signal processing method according to (24), further comprising the steps of: performing the first comparison of the analog signal with
the determination voltage; and
outputting a first comparison output based on the first comparison.

(28) The signal processing method according to (27), further comprising the step of: performing a second comparison, the second comparison including comparing the analog signal with the selected reference voltage.

(29) The signal processing method according to (28), further comprising the step of: performing a third comparison, the third comparison including comparing another analog signal with the first reference voltage and the second reference voltage.

(30) The signal processing method according to (24), further comprising the step of: switching the selected reference voltage from the plurality of reference voltages to be supplied to a comparison unit based on a first selection result output by the selection unit, the first selection result output being based on the first comparison of the analog signal with the determination voltage, wherein the comparison unit is configured to perform the first comparison.

(31) The signal processing method according to (28), further comprising the step of: measuring a period of time of the second comparison, the period of time of the second comparison beginning when the second comparison begins to when a second comparison result changes, the second comparison result being output by the comparison unit.

(32) The signal processing method according to (24), further comprising the step of: measuring a period of time of the first comparison, the period of time of the first comparison beginning when the first comparison begins to when the first comparison is finished.

(33) The signal processing method according to (24), further comprising the step of: generating the determination voltage.

(34) The signal processing method according to (24), wherein
the first reference voltage is scanned in a first scanning direction,
the second reference voltages is scanned in a second scanning direction, and
the first scanning direction is opposite from the second scanning direction.

(35) The signal processing method according to (34), wherein
the first scanning direction is a voltage increase from low to high, and
the second scanning direction is a voltage decrease from high to low.

(36) The signal processing method according to (34), wherein
the first scanning direction is a voltage increase from high to low, and
the second scanning direction is a voltage decrease from low to high.

(37) The signal processing method according to (29), wherein
the analog signal and the another analog signal are received from an electric charge accumulated in a light receiving portion of an image sensor.

(38) The signal processing method according to (37), wherein
the analog signal is an image data signal detected by the image sensor, and
the another analog signal is a noise signal of the image sensor.

(39) The signal processing method according to (26), wherein, in the case that the analog signal is determined to be less than the determination voltage, the first reference voltage is selected from the plurality of reference voltages as the selected reference voltage.

(40) The signal processing method according to (26), wherein, in the case that the analog signal is determined to be greater than the determination voltage, the second reference voltage is selected from the plurality of reference voltages as the selected reference voltage.

(41) The signal processing method according to (24), wherein
the first reference voltage scans a first reference voltage range,
the second reference voltages scans a second reference voltage range, and
the first reference voltage range is different from the second reference voltage range.

(42) The signal processing method according to (30), wherein
in the step of switching the selected reference voltage, a non-selected reference voltage from the plurality of reference voltages is connected to a first load capacitor, the non-selected reference voltage being one of the plurality of reference voltages that is not the selected reference voltage.

(43) The signal processing method according to (42), wherein
the load capacitor includes a first capacitor, a second capacitor, and a third capacitor, the switching unit being configured to connect the non-selected reference voltage to a first electrode of the first capacitor,
a second electrode of the first capacitor is connected to a first electrode of the second capacitor, a second electrode of the second capacitor being connected to a ground, and
a first of the third capacitor is connected to the second electrode of the first capacitor, a second electrode of the third capacitor being connected to the ground.

(44) A signal processing device comprising:
means for selecting, based on a first comparison of an analog signal with a determination voltage, a selected reference voltage to be compared with the analog signal, the selected reference voltage being selected from a plurality of reference voltages, wherein
the plurality of reference voltages include at least a first reference voltage and a second reference voltage.

(45) A signal processing device including:
a comparison unit configured to compare an analog signal output from a unit pixel with a certain voltage;
a selection unit configured to select one of a plurality of reference voltages having different levels of gradation precision in accordance with a comparison result of comparison by the comparison unit between the analog signal and at least one or more predetermined determination values;
a switching unit configured to switch a reference voltage to be supplied to the comparison unit in accordance with a selection result obtained by the selection unit; and
a measurement unit configured to measure a timing of change of a comparison result of comparison by the comparison unit between the analog signal and a reference voltage supplied to the comparison unit under switching control of the switching unit.

(46) The signal processing device according to (45), wherein
the predetermined determination value is supplied from a reference voltage generation unit configured to supply a reference voltage having a high level of gradation precision among the plurality of reference voltages.

(47) The signal processing device according to (45) or (46), wherein
the selection unit selects a reference voltage having a high level of gradation precision among the plurality of reference voltages when it is determined, as a result of comparison performed by the comparison unit, that the analog signal is smaller than the predetermined determination value, and selects a reference voltage having a low level of gradation precision among the plurality of reference voltages when it is determined that the analog signal is larger than the predetermined determination value, and
the switching unit causes the reference voltage selected by the selection unit to be supplied to the comparison unit.

(48) The signal processing device according to any of (45) to (47), wherein
the comparison unit compares each of a first analog signal and a second analog signal with the reference voltage supplied to the comparison unit, the first analog signal being a noise signal of the unit pixel, the second analog signal being a signal including data of the unit pixel, and
the measurement unit determines a difference between a measured timing of change of a comparison result of comparison by the comparison unit between the first analog signal and the reference voltage and a measured timing of change of a comparison result of comparison by the comparison unit between the second analog signal and the reference voltage.

(49) The signal processing device according to (48), wherein
the selection unit sequentially selects reference voltages for the first analog signal,
the switching unit causes the reference voltages selected by the selection unit to be supplied to the comparison unit,
the comparison unit sequentially compares the first analog signal with each of the reference voltages in accordance with control of the switching unit,
the selection unit selects one of the plurality of reference voltages for the second analog signal in accordance with a comparison result of comparison by the comparison unit between the second analog signal and the at least one or more predetermined determination values,
the switching unit causes the reference voltage selected by the selection unit to be supplied to the comparison unit,
the comparison unit compares the second analog signal with the reference voltage selected by the selection unit in accordance with control of the switching unit, and the measurement unit determines a difference between a measured timing of change of a comparison result of comparison between the second analog signal and the reference voltage selected by the selection unit and a measured timing of change of a comparison result of comparison between the first analog signal and the reference voltage selected by the selection unit.

(50) The signal processing device according to (49), further including a reference voltage supply unit configured to supply the plurality of reference voltages.

(51) The signal processing device according to (50), wherein the reference voltage supply unit supplies the plurality of reference voltages so that a voltage in a predetermined range is compared with the first analog signal and the second analog signal in a first comparison direction or a second comparison direction, the first comparison direction being a direction in which the voltage increases from low to high, the second comparison direction being a direction in which the voltage decreases from high to low.

(52) The signal processing device according to (51), wherein the reference voltage supply unit supplies the plurality of reference voltages so that the plurality of reference voltages are compared with the first analog signal in order of gradation precision in such a manner that each of the plurality of reference voltages is compared with the first analog signal in a comparison direction opposite to the comparison direction of a preceding reference voltage.

(53) The signal processing device according to (51) or (52), wherein
the reference voltage supply unit supplies the reference voltage selected by the selection unit so that the reference voltage is compared with the second analog signal in the same comparison direction as a comparison direction in which the reference voltage is compared with the first analog signal.

(54) The signal processing device according to any of (51) to (53), wherein
the reference voltage supply unit supplies a reference voltage having the highest level of gradation precision among the plurality of reference voltages so that a voltage in the range is compared with the first analog signal and the second analog signal in the second comparison direction, and supplies a reference voltage having the lowest level of gradation precision among the plurality of reference voltages so that a voltage in the range is compared with the first analog signal and the second analog signal in the first comparison direction.

(55) The signal processing device according to any of (45) to (54), further including a plurality of sets each including the comparison unit, the selection unit, the switching unit, and the measurement unit, wherein
in each of the plurality of sets, the selection unit includes a first holding unit and a second holding unit, the first holding unit and the second holding unit being configured to hold the comparison result,
in each of the plurality of sets, the first holding unit holds the comparison result until comparison results obtained by the comparison unit for all the sets are held in the first holding unit, and
in each of the plurality of sets, the second holding unit holds the comparison result after the first holding unit holds the comparison results for all the sets, and selects one of the plurality of reference voltages in accordance with the held comparison result.

(56) A signal processing method for a signal processing device, the signal processing method being performed by the signal processing device, including:
comparing an analog signal output from a unit pixel with a certain voltage;
selecting one of a plurality of reference voltages having different levels of gradation precision in accordance with a comparison result of comparison between the analog signal and at least one or more predetermined determination values;
switching a reference voltage to be compared with the analog signal in accordance with a selection result; and
measuring a timing of change of a comparison result of comparison between the analog signal and the reference voltage.

(57) An imaging element including:
a pixel array having unit pixels arranged thereon, each unit pixel including a photoelectric conversion element configured to perform photoelectric conversion on incident light;
a comparison unit configured to compare an analog signal output from a unit pixel in the pixel array with a certain voltage;
a selection unit configured to select one of a plurality of reference voltages having different levels of gradation precision in accordance with a comparison result of comparison by the comparison unit between the analog signal and at least one or more predetermined determination values;
a switching unit configured to switch a reference voltage to be supplied to the comparison unit in accordance with a selection result obtained by the selection unit; and
a measurement unit configured to measure a timing of change of a comparison result of comparison by the comparison unit between the analog signal and a reference voltage supplied to the comparison unit under switching control of the switching unit.

(58) An imaging apparatus including:
an imaging unit configured to capture an image of a subject; and
an image processing unit configured to perform image processing on image data obtained by capturing the image by using the imaging unit,
the imaging unit including
a pixel array having unit pixels arranged thereon, each unit pixel including a photoelectric conversion element configured to perform photoelectric conversion on incident light,
a comparison unit configured to compare an analog signal output from a unit pixel in the pixel array with a certain voltage;
a selection unit configured to select one of a plurality of reference voltages having different levels of gradation precision in accordance with a comparison result of comparison by the comparison unit between the analog signal and at least one or more predetermined determination values,
a switching unit configured to switch a reference voltage to be supplied to the comparison unit in accordance with a selection result obtained by the selection unit, and
a measurement unit configured to measure a timing of change of a comparison result of comparison by the comparison unit between the analog signal and a reference voltage supplied to the comparison unit under switching control of the switching unit.

(59) A signal processing device including:
a comparison unit configured to compare an analog signal output from a unit pixel with a certain voltage;
a switching unit configured to switch a reference voltage to be supplied to the comparison unit, if necessary, and configured to connect one of a plurality of reference voltages having different levels of gradation precision to the comparison unit and connect the other reference voltages to a certain load capacitor; and
a measurement unit configured to measure a timing of change of a comparison result of comparison by the comparison unit between the analog signal and a reference voltage supplied to the comparison unit under switching control of the switching unit.
(60) The signal processing device according to (59), wherein the load capacitor has a capacitance equivalent to or approximate to a capacitance of the comparison unit.
(61) The signal processing device according to (59) or (60), further including a plurality of sets each including the comparison unit, the switching unit, and the measurement unit, wherein
in each of the plurality of sets, each of the plurality of reference voltages is supplied to the switching unit via an amplification unit configured to amplify a signal level, and outputs of the amplification units are connected to each other across the sets for each level of gradation precision.
(62) The signal processing device according to any of (59) to (61), further including a selection unit configured to select one of a plurality of reference voltages having different levels of gradation precision in accordance with a comparison result of comparison by the comparison unit between the analog signal and the at least one or more predetermined determination values, wherein
the switching unit controls connection to the comparison unit or the load capacitor for each of the plurality of reference voltages in accordance with a selection result obtained by the selection unit.
(63) The signal processing device according to (62), wherein the predetermined determination value is supplied from a reference voltage generation unit configured to supply a reference voltage having a high level of gradation precision among the plurality of reference voltages.
(64) The signal processing device according to (62) or (63), wherein
the selection unit selects a reference voltage having a high level of gradation precision among the plurality of reference voltages when it is determined, as a result of comparison performed by the comparison unit, that the analog signal is smaller than the predetermined determination value, and selects a reference voltage having a low level of gradation precision among the plurality of reference voltages when it is determined that the analog signal is larger than the predetermined determination value, and
the switching unit connects the reference voltage selected by the selection unit to the comparison unit, and connects the other reference voltages to the load capacitor.
(65) The signal processing device according to any of (62) to (64), wherein the comparison unit compares each of a first analog signal and a second analog signal with the reference voltage, the first analog signal being a noise signal of the unit pixel,
the second analog signal being a signal including data of the unit pixel, and
the measurement unit determines a difference between a measured timing of change of a comparison result of comparison by the comparison unit between the first analog signal and the reference voltage and a measured timing of change of a comparison result of comparison by the comparison unit between the second analog signal and the reference voltage.
(66) The signal processing device according to (65), wherein the selection unit sequentially selects reference voltages for the first analog signal,
the switching unit connects the reference voltages selected by the selection unit to the comparison unit and connects the other reference voltages to the load capacitor, the comparison unit sequentially compares the first analog signal with each of the reference voltages in accordance with control of the switching unit,
the selection unit selects one of the plurality of reference voltages for the second analog signal in accordance with a comparison result of comparison by the comparison unit between the second analog signal and the at least one or more predetermined determination values,
the switching unit connects the reference voltage selected by the selection unit to the comparison unit and connects the other reference voltages to the load capacitor,
the comparison unit compares the second analog signal with the reference voltage selected by the selection unit in accordance with control of the switching unit, and the measurement unit determines a difference between a measured timing of change of a comparison result of comparison between the second analog signal and the reference voltage selected by the selection unit and a measured timing of change of a comparison result of comparison between the first analog signal and the reference voltage selected by the selection unit.
(67) The signal processing device according to (66), further including a reference voltage supply unit configured to supply the plurality of reference voltages to the switching unit.
(68) The signal processing device according to (67), wherein the reference voltage supply unit supplies the plurality of reference voltages to the switching unit so that a voltage in a predetermined range is compared with the first analog signal and the second analog signal in a first comparison direction or a second comparison direction, the first comparison direction being a direction in which the voltage increases from low to high, the second comparison direction being a direction in which the voltage decreases from high to low, and
the switching unit connects the reference voltage selected by the selection unit among the plurality of reference voltages supplied from the reference voltage supply unit to the comparison unit, and connects the other reference voltages to the load capacitor.
(69) The signal processing device according to (68), wherein the reference voltage supply unit supplies the plurality of reference voltages to the switching unit so that the plurality of reference voltages are compared with the first analog signal in order of gradation precision in such a manner that each of the plurality of reference voltages is compared with the first analog signal in a comparison direction opposite to the comparison direction of a preceding reference voltage.
(70) The signal processing device according to (68) or (69), wherein
the reference voltage supply unit supplies the reference voltage selected by the selection unit to the switching unit so that the reference voltage is compared with the second analog signal in the same comparison direction as a comparison direction in which the reference voltage is compared with the first analog signal.
(71) The signal processing device according to any of (68) to (70), wherein
the reference voltage supply unit supplies a reference voltage having the highest level of gradation precision among the plurality of reference voltages so that a voltage in the range is compared with the first analog signal and the second analog signal in the second comparison direction, and supplies a reference voltage having the lowest level of gradation precision among the plurality of reference voltages so that a voltage in the range is compared with the first analog signal and the second analog signal in the first comparison direction.

(72) A signal processing method for a signal processing device, the signal processing method being performed by the signal processing device, including:
comparing an analog signal output from a unit pixel with a certain voltage;
switching a reference voltage to be supplied so that one of a plurality of reference voltages having different levels of gradation precision is compared with the analog signal and the other reference voltages are connected to a certain load capacitor; and measuring a timing of change of a comparison result of comparison between the analog signal and the reference voltage.

(73) An imaging element including:
a pixel array having unit pixels arranged thereon, each unit pixel including a photoelectric conversion element configured to perform photoelectric conversion on incident light;
a comparison unit configured to compare an analog signal output from a unit pixel in the pixel array with a certain voltage;
a switching unit configured to switch a reference voltage to be supplied to the comparison unit, and configured to connect one of a plurality of reference voltages having different levels of gradation precision to the comparison unit and connect the other reference voltages to a certain load capacitor; and
a measurement unit configured to measure a timing of change of a comparison result of comparison by the comparison unit between the analog signal and a reference voltage supplied to the comparison unit under switching control of the switching unit.

(74) An imaging apparatus including:
an imaging unit configured to capture an image of a subject; and
an image processing unit configured to perform image processing on image data obtained by capturing the image by using the imaging unit,
the imaging unit including
a pixel array having unit pixels arranged thereon, each unit pixel including a photoelectric conversion element configured to perform photoelectric conversion on incident light;
a comparison unit configured to compare an analog signal output from a unit pixel in the pixel array with a certain voltage;
a switching unit configured to switch a reference voltage to be supplied to the comparison unit, and configured to connect one of a plurality of reference voltages having different levels of gradation precision to the comparison unit and connect the other reference voltages to a certain load capacitor; and
a measurement unit configured to measure a timing of change of a comparison result of comparison by the comparison unit between the analog signal and a reference voltage supplied to the comparison unit under switching control of the switching unit.

(75) A signal processing device including:
a comparison unit configured to compare an analog signal output from a unit pixel with a certain voltage;
a reference voltage supply unit configured to supply a plurality of reference voltages having different levels of gradation precision;
a switching unit configured to switch a reference voltage to be supplied to the comparison unit, if necessary, and configured to connect one of the plurality of reference voltages supplied from the reference voltage supply unit to the comparison unit; and
a measurement unit configured to measure a timing of change of a comparison result of comparison by the comparison unit between the analog signal and a reference voltage supplied to the comparison unit under switching control of the switching unit, wherein the reference voltage supply unit repeatedly supplies all the plurality of reference voltages for a first analog signal a number of times equal to the number of reference voltages, the first analog signal being a noise signal of the unit pixel,
the switching unit sequentially supplies the reference voltages supplied from the reference voltage supply unit to the comparison unit one by one,
the comparison unit sequentially compares the first analog signal with each of the reference voltages in accordance with control of the switching unit,
the reference voltage supply unit supplies all the plurality of reference voltages for a second analog signal, the second analog signal being a signal including data of the unit pixel,
the switching unit supplies one of the plurality of reference voltages supplied from the reference voltage supply unit to the comparison unit,
the comparison unit compares the reference voltage supplied in accordance with control of the switching unit with the second analog signal, and
the measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

(76) The signal processing device according to (75), wherein
the reference voltage supply unit supplies each of the reference voltages to the switching unit so that a voltage in a predetermined range is compared in a common comparison direction for a plurality of times reference voltages are supplied for the first analog signal and for every time the plurality of reference voltages are supplied for the second analog signal.

(77) The signal processing device according to (76), wherein
the reference voltage supply unit sets an offset of each reference voltage so that an end value of the reference voltage in a current operation is set to an initial value in a next operation in the plurality of times reference voltages are supplied for the first analog signal.

(78) The signal processing device according to any of (75) to (77), wherein
the reference voltage supply unit supplies the plurality of reference voltages to the switching unit so that the plurality of reference voltages are compared with the first analog signal in order of gradation precision in such a manner that each of the plurality of reference voltages is compared with the first analog signal in a comparison direction opposite to the comparison direction of a preceding reference voltage.

(79) A signal processing method for a signal processing device, the signal processing method being performed by the signal processing device, including:
repeatedly supplying all a plurality of reference, voltages for a first analog signal a number of times equal to the number of reference voltages, the first analog signal being a noise signal of a pixel;
sequentially comparing the supplied reference voltages one by one;

sequentially comparing the first analog signal with each of the reference voltages;
supplying all the plurality of reference voltages for a second analog signal, the second analog signal being a signal including data of the pixel;
comparing one of the plurality of supplied reference voltages with the second analog signal;
comparing the supplied reference voltage with the second analog signal; and
determining a difference between a measured timing of change of a comparison result of comparison the second analog signal and the reference voltage and a measured timing of change of a comparison result of comparison between the first analog signal and the reference voltage.

(80) An imaging element including:
a pixel array having unit pixels arranged thereon, each unit pixel including a photoelectric conversion element configured to perform photoelectric conversion on incident light;
a comparison unit configured to compare an analog signal output from a unit pixel in the pixel array with a certain voltage;
a reference voltage supply unit configured to supply a plurality of reference voltages having different levels of gradation precision;
a switching unit configured to switch a reference voltage to be supplied to the comparison unit, if necessary, and configured to connect one of the plurality of reference voltages supplied from the reference voltage supply unit to the comparison unit; and
a measurement unit configured to measure a timing of change of a comparison result of comparison by the comparison unit between the analog signal and a reference voltage supplied to the comparison unit under switching control of the switching unit, wherein the reference voltage supply unit repeatedly supplies all the plurality of reference voltages for a first analog signal a number of times equal to the number of reference voltages, the first analog signal being a noise signal of the unit pixel,
the switching unit sequentially supplies the reference voltages supplied from the reference voltage supply unit to the comparison unit one by one,
the comparison unit sequentially compares the first analog signal with each of the reference voltages in accordance with control of the switching unit,
the reference voltage supply unit supplies all the plurality of reference voltages for a second analog signal, the second analog signal being a signal including data of the unit pixel,
the switching unit supplies one of the plurality of reference voltages supplied from the reference voltage supply unit to the comparison unit,
the comparison unit compares the reference voltage supplied in accordance with control of the switching unit with the second analog signal, and
the measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

(81) An imaging apparatus including:
an imaging unit configured to capture an image of a subject; and
an image processing unit configured to perform image processing on image data obtained by capturing the image by using the imaging unit,
the imaging unit including
a pixel array having unit pixels arranged thereon, each unit pixel including a photoelectric conversion element configured to perform photoelectric conversion on incident light,
a comparison unit configured to compare an analog signal output from a unit pixel in the pixel array with a certain voltage,
a reference voltage supply unit configured to supply a plurality of reference voltages having different levels of gradation precision,
a switching unit configured to switch a reference voltage to be supplied to the comparison unit, if necessary, and configured to connect one of the plurality of reference voltages supplied from the reference voltage supply unit to the comparison unit, and
a measurement unit configured to measure a timing of change of a comparison result of comparison by the comparison unit between the analog signal and a reference voltage supplied to the comparison unit under switching control of the switching unit, wherein the reference voltage supply unit repeatedly supplies all the plurality of reference voltages for a first analog signal a number of times equal to the number of reference voltages, the first analog signal being a noise signal of the unit pixel,
the switching unit sequentially supplies the reference voltages supplied from the reference voltage supply unit to the comparison unit one by one,
the comparison unit sequentially compares the first analog signal with each of the reference voltages in accordance with control of the switching unit,
the reference voltage supply unit supplies all the plurality of reference voltages for a second analog signal, the second analog signal being a signal including data of the unit pixel,
the switching unit supplies one of the plurality of reference voltages supplied from the reference voltage supply unit to the comparison unit,
the comparison unit compares the reference voltage supplied in accordance with control of the switching unit with the second analog signal, and
the measurement unit determines a difference between a measured timing of change of a comparison result of comparison by the comparison unit between the second analog signal and the reference voltage and a measured timing of change of a comparison result of comparison by the comparison unit between the first analog signal and the reference voltage.

The present disclosure contains subject matter related to that disclosed in Japanese Priority Patent Application JP 2012-124213 filed in the Japan Patent Office on May 31, 2012, the entire contents of which are hereby incorporated by reference.

It should be understood by those skilled in the art that various modifications, combinations, sub-combinations and alterations may occur depending on design re-quirements and other factors insofar as they are within the scope of the appended claims or the equivalents thereof.

REFERENCE SIGNS LIST

100 CMOS image sensor
111 Pixel array
112 A/D conversion unit
110 A/D conversion control unit
121 Control timing generation unit 121
122 Pixel scanning unit
123 Horizontal scanning unit
131 and 132 Reference voltage generation unit 141 Unit pixel
151 Column A/D conversion unit
161 Switching unit
162 Comparison unit
163 Selection unit
164 Timing measurement unit
171 Latch
181 Photodiode
233 Reference voltage generation unit
251 Column A/D conversion unit
261 Switching unit
263 Selection unit
361 Switching unit
373 Load capacitance
400 CMOS image sensor
411 Buffer
412 Common column line
800 Imaging device
812 CMOS sensor

The invention claimed is:

1. A signal processing device comprising:
a comparison circuit configured to perform
a first comparison of a noise signal with a plurality of reference voltages,
a second comparison of an image data signal with a determination voltage, and
a third comparison of the image data signal with a selected reference voltage, and
a selection circuit configured to select the selected reference voltage from the plurality of reference voltages based on the second comparison, wherein
the noise signal and the image data signal are detected by an image sensor, and
the plurality of reference voltages include at least a first reference voltage and a second reference voltage.

2. The signal processing device according to claim 1, wherein
the first reference voltage is generated by a first reference voltage generation circuit, and
the second reference voltage is generated by a second reference voltage generation circuit.

3. The signal processing device according to claim 1, wherein
the first reference voltage is scanned in steps of a first gradation precision,
the second reference voltage is scanned in steps of a second gradation precision, and
the first gradation precision is higher than the second gradation precision.

4. The signal processing device according to claim 3, wherein, in the case that the image data signal is determined to be less than the determination voltage, the first reference voltage is selected from the plurality of reference voltages as the selected reference voltage.

5. The signal processing device according to claim 3, wherein, in the case that the image data signal is determined to be greater than the determination voltage, the second reference voltage is selected from the plurality of reference voltages as the selected reference voltage.

6. The signal processing device according to claim 1, further comprising:
a switching circuit configured to switch the selected reference voltage from the plurality of reference voltages to be supplied to the comparison circuit based on a first selection result output by the selection circuit, the first selection result output being based on the second comparison of the image data signal with the determination voltage.

7. The signal processing device according to claim 6, wherein the switching circuit is configured to connect a non-selected reference voltage from the plurality of reference voltages to a first load capacitor, the non-selected reference voltage being one of the plurality of reference voltages that is not the selected reference voltage.

8. The signal processing device according to claim 7, wherein the load capacitor includes a first capacitor, a second capacitor, and a third capacitor, the switching circuit being configured to connect the non-selected reference voltage to a first electrode of the first capacitor,
a second electrode of the first capacitor is connected to a first electrode of the second capacitor, a second electrode of the second capacitor being connected to a ground, and
a first electrode of the third capacitor is connected to the second electrode of the first capacitor, a second electrode of the third capacitor being connected to the ground.

9. The signal processing device according to claim 1, further comprising:
a time measurement circuit configured to measure a period of time of the third comparison, the time measurement circuit including a counter configured to start a count when the comparison circuit starts the third comparison result being output by the comparison circuit.

10. The signal processing device according to claim 1, further comprising:
a time measurement circuit configured to measure a period of time of the first comparison, the time measurement circuit including a counter configured to start a count when the comparison circuit begins the first comparison to when the comparison circuit finishes the first comparison.

11. The signal processing device according to claim 1, wherein the determination voltage is generated by a determination voltage generation circuit.

12. The signal processing device according to claim 1, wherein
the first reference voltage is scanned in a first scanning direction,
the second reference voltages is scanned in a second scanning direction, and
the first scanning direction is opposite from the second scanning direction.

13. The signal processing device according to claim 12, wherein
the first scanning direction is a voltage increase from low to high, and
the second scanning direction is a voltage decrease from high to low.

14. The signal processing device according to claim 12, wherein
the first scanning direction is a voltage increase from high to low, and
the second scanning direction is a voltage decrease from low to high.

15. The signal processing device according to claim 1, wherein
the first reference voltage scans a first reference voltage range,
the second reference voltage scans a second reference voltage range, and the first reference voltage range is different from the second reference voltage range.

16. The signal processing device according to claim 1, wherein
during the first comparison, the first reference voltage is scanned while the second reference voltage is scanned.

17. The signal processing device according to claim 16, wherein
the first reference voltage is scanned in a first scanning direction,
the second reference voltages is scanned in a second scanning direction, and
the first scanning direction and the second scanning direction converge.

18. The signal processing device according to claim 17, wherein
the first reference voltage and the second reference voltages sufficiently converge that a reset level is obtained without reducing a frame rate.

19. A signal processing method comprising the step of:
performing a first comparison of a noise signal with a plurality of reference voltages;
performing a second comparison of an image data signal with a determination Voltage;
selecting a selected reference voltage from the plurality of reference voltages based on the second comparison; and
performing a third comparison of the image data signal with the selected reference voltage, wherein
the noise signal and the image data signal are detected by an image sensor, and
the plurality of reference voltages include at least a first reference voltage and a second reference voltage.

20. The signal processing method according to claim 19, further comprising the steps of:
generating the first reference voltage; and
generating the second reference voltage.

21. The signal processing method according to claim 19, further comprising the steps of:
scanning the first reference voltage in steps of a first gradation precision; and
scanning the second reference voltage in steps of a second gradation precision,
wherein the first gradation precision is higher than the second gradation precision.

22. The signal processing method according to claim 21, wherein, in the case that the image data signal is determined to be less than the determination voltage, the first reference voltage is selected from the plurality of reference voltages as the selected reference voltage.

23. The signal processing method according to claim 21, wherein, in the case that the image data signal is determined to be greater than the determination voltage, the second reference voltage is selected from the plurality of reference voltages as the selected reference voltage.

24. The signal processing method according to claim 19, further comprising the step of:
switching the selected reference voltage from the plurality of reference voltages to be supplied to a comparison circuit based on a first selection result output by a selection circuit, the first selection result output being based on the second comparison of the image data signal with the determination voltage,
wherein the comparison circuit is configured to perform the second comparison.

25. The signal processing method according to claim 24, wherein in the step of switching the selected reference voltage, a non-selected reference voltage from the plurality of reference voltages is connected to a first load capacitor, the non-selected reference voltage being one of the plurality of reference voltages that is not the selected reference voltage.

26. The signal processing method according to claim 25, wherein the load capacitor includes a first capacitor, a second capacitor, and a third capacitor, the switching circuit being configured to connect the non-selected reference voltage to a first electrode of the first capacitor,
a second electrode of the first capacitor is connected to a first electrode of the second capacitor, a second electrode of the second capacitor being connected to a ground, and
a first electrode of the third capacitor is connected to the second electrode of the first capacitor, a second electrode of the third capacitor being connected to the ground.

27. The signal processing method according to claim 19, further comprising the step of:
measuring a period of time of the third comparison, the period of time of the third comparison beginning when the third comparison begins to when a third comparison result changes, the third comparison result being output by the comparison unit.

28. The signal processing method according to claim 19, further comprising the step of:
measuring a period of time of the first comparison, the period of time of the first comparison beginning when the first comparison begins to when the first comparison is finished.

29. The signal processing method according to claim 19, further comprising the step of:
generating the determination voltage.

30. The signal processing method according to claim 19, wherein
the first reference voltage is scanned in a first scanning direction,
the second reference voltages is scanned in a second scanning direction, and
the first scanning direction is opposite from the second scanning direction.

31. The signal processing method according to claim 30, wherein
the first scanning direction is a voltage increase from low to high, and
the second scanning direction is a voltage decrease from high to low.

32. The signal processing method according to claim 30, wherein
the first scanning direction is a voltage increase from high to low, and
the second scanning direction is a voltage decrease from low to high.

33. The signal processing method according to claim 19, wherein
the first reference voltage scans a first reference voltage range,
the second reference voltages scans a second reference voltage range, and
the first reference voltage range is different from the second reference voltage range.

34. A signal processing device comprising:
means for performing a first comparison of a noise signal with a plurality of reference voltages;
means for performing a second comparison of an image data signal with a determination voltage;

means for selecting a selected reference voltage from the plurality of reference voltages based on the second comparison; and means for performing a third comparison of the image data signal with the selected reference voltage, wherein the noise signal and the image data signal are detected by an image sensor and the plurality of reference voltages include at least a first reference voltage and a second reference voltage.

* * * * *